(12) United States Patent
Chang et al.

(10) Patent No.: US 8,698,166 B2
(45) Date of Patent: *Apr. 15, 2014

(54) LIGHT EMITTING CHIP PACKAGE MODULE AND LIGHT EMITTING CHIP PACKAGE STRUCTURE AND MANUFACTURING METHOD THEREOF

(75) Inventors: Hsueh-Chih Chang, Changhua County (TW); Rong Xuan, Taipei County (TW); Chao-Wei Li, Taipei (TW); Chih-Hao Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 658 days.

This patent is subject to a terminal disclaimer.

(21) Appl. No.: 12/837,513

(22) Filed: Jul. 16, 2010

(65) Prior Publication Data
US 2012/0012868 A1 Jan. 19, 2012

(51) Int. Cl.
*H01L 33/00* (2010.01)
(52) U.S. Cl.
USPC ............... 257/79; 257/98; 257/100; 257/712; 257/E33.056
(58) Field of Classification Search
USPC ........ 257/79, 91, 98, 100, 706, 712, E33.056, 257/E33.059
See application file for complete search history.

(56) References Cited

U.S. PATENT DOCUMENTS

| 4,806,885 A | 2/1989 | Morimoto | |
|---|---|---|---|
| 7,759,671 B2* | 7/2010 | Hsu et al. | 257/13 |
| 7,989,818 B2* | 8/2011 | Xuan et al. | 257/79 |
| 8,106,416 B2* | 1/2012 | Hsu et al. | 257/98 |
| 2006/0091409 A1 | 5/2006 | Epler et al. | |
| 2006/0124953 A1* | 6/2006 | Negley et al. | 257/99 |
| 2009/0170247 A1* | 7/2009 | Shekhawat et al. | 438/127 |
| 2009/0179214 A1* | 7/2009 | Xuan et al. | 257/98 |
| 2009/0179218 A1* | 7/2009 | Hsu et al. | 257/99 |
| 2010/0159692 A1* | 6/2010 | Swaminathan | 438/613 |
| 2011/0281375 A1* | 11/2011 | Swaminathan et al. | 438/3 |
| 2012/0225509 A1* | 9/2012 | Wang | 438/27 |

FOREIGN PATENT DOCUMENTS

TW I239670 9/2005

OTHER PUBLICATIONS

Authored by Jonker, et al., article titled "Progress toward electrical injection of spin-polarized electrons into semiconductors ," adopted from Proceedings of the IEEE , vol. 91, No. 5 , pp. 727-740 , May 2003.

* cited by examiner

*Primary Examiner* — Tuan N. Quach
(74) *Attorney, Agent, or Firm* — Jianq Chyun IP Office

(57) ABSTRACT

A light emitting chip package module includes a substrate, a light emitting chip package structure, and a magnetic device. The substrate has a surface. The light emitting chip package structure is disposed on the surface of the substrate. The light emitting chip package structure includes a carrier, a light emitting chip, and a sealant. The light emitting chip is disposed on and electrically connected to the carrier. The sealant is disposed on the carrier and covers the light emitting chip. The magnetic device is disposed next to the light emitting chip package structure to apply a magnetic field to the light emitting chip.

73 Claims, 51 Drawing Sheets

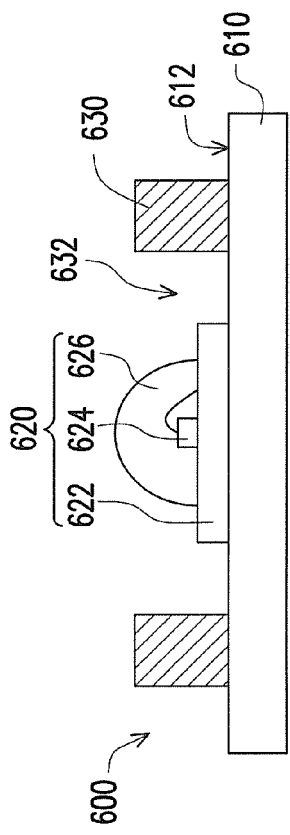
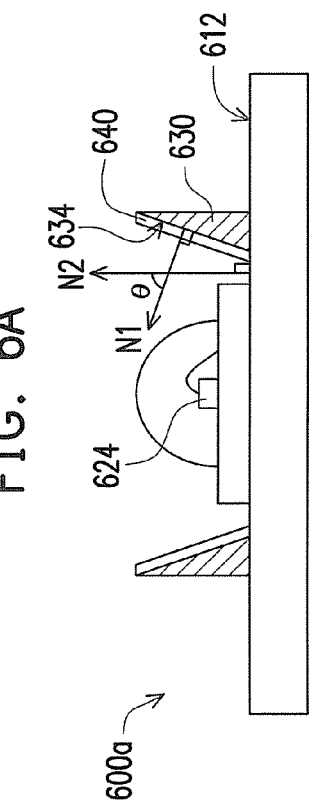
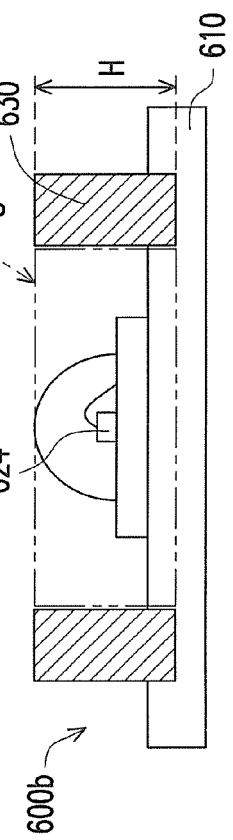
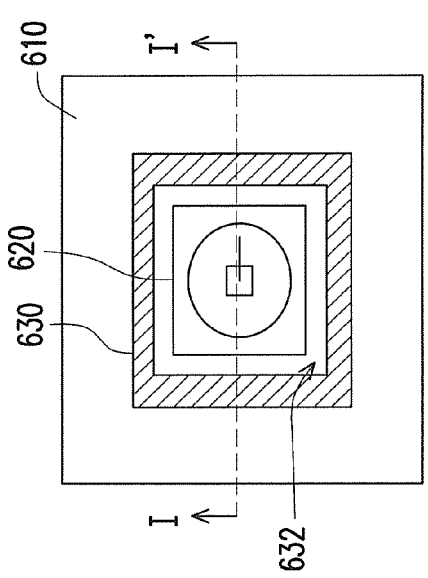
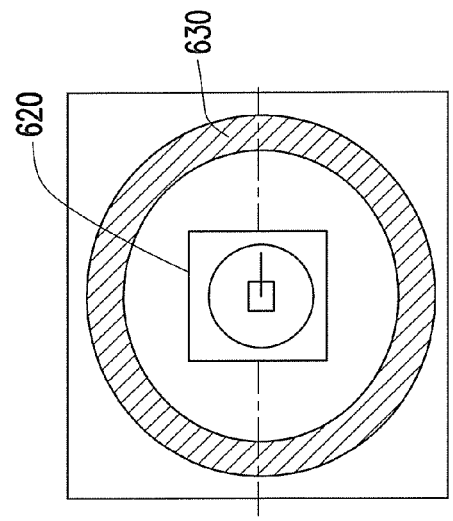

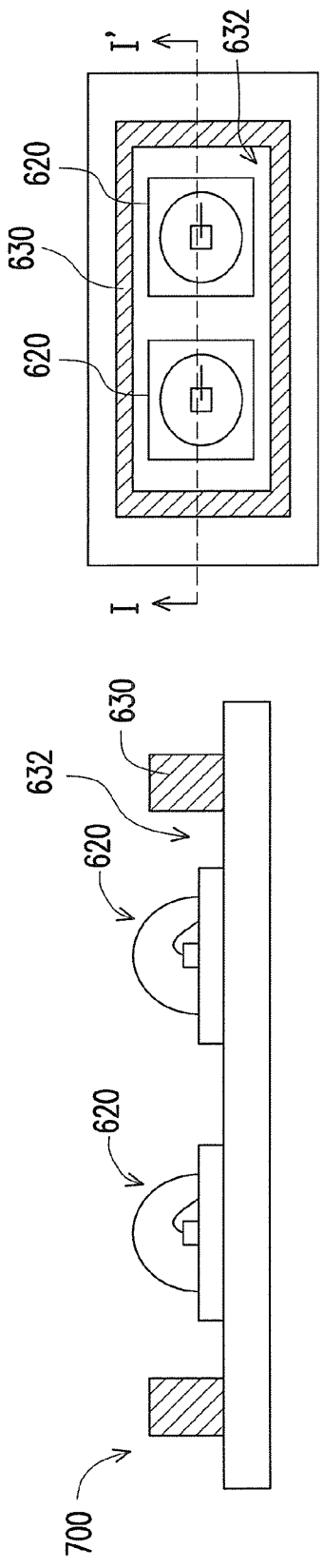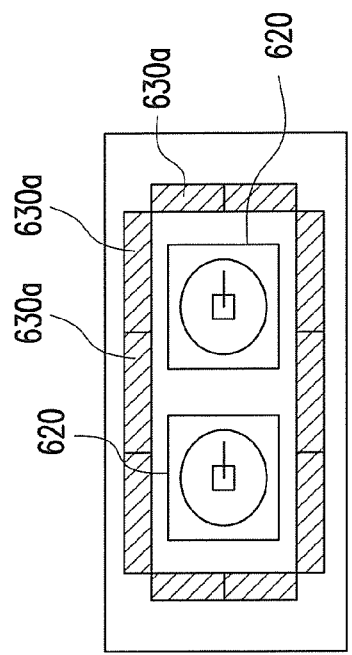

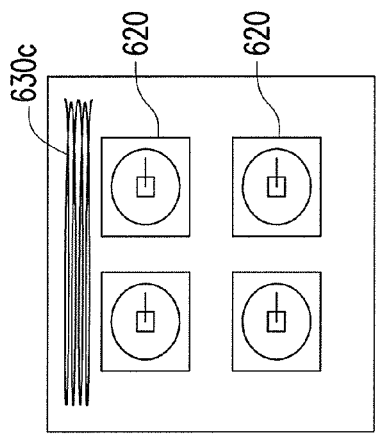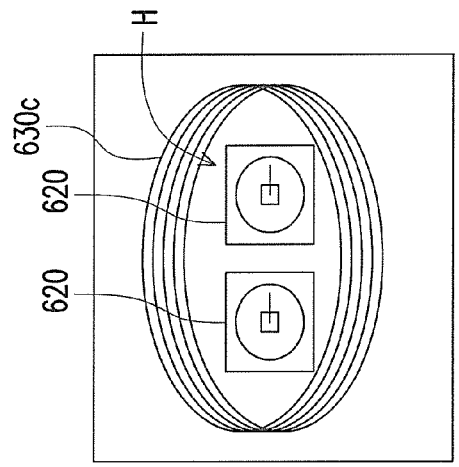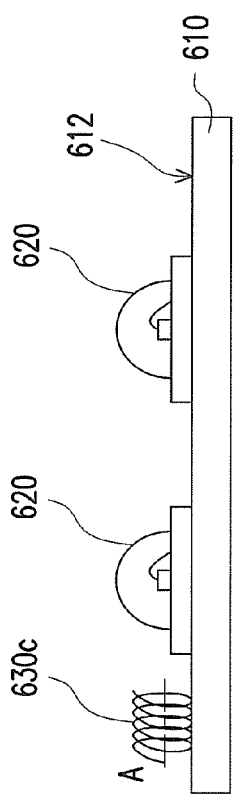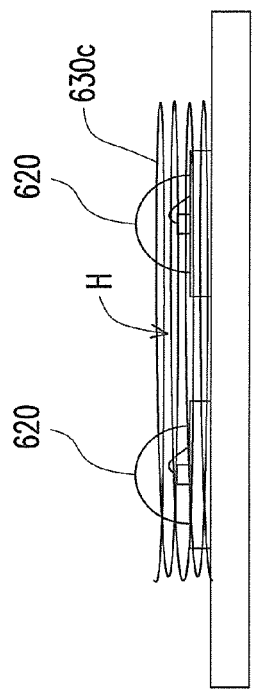

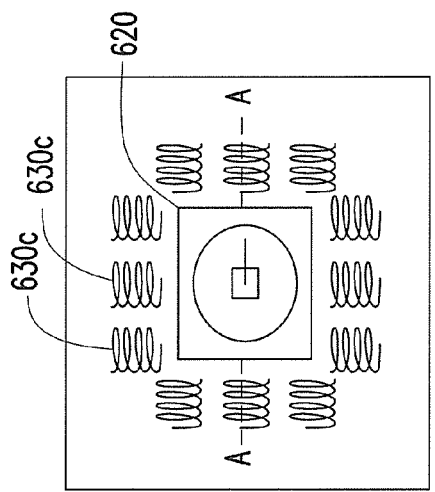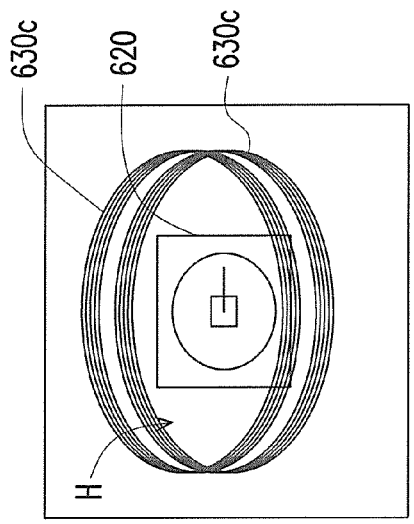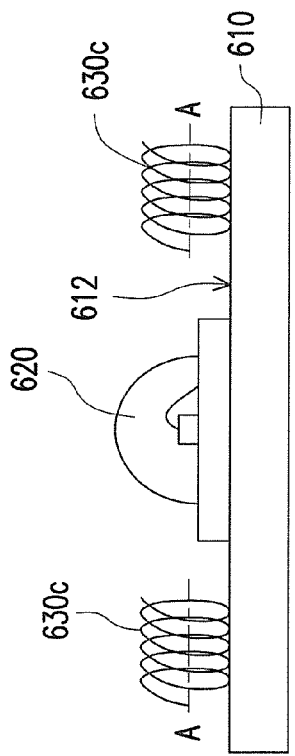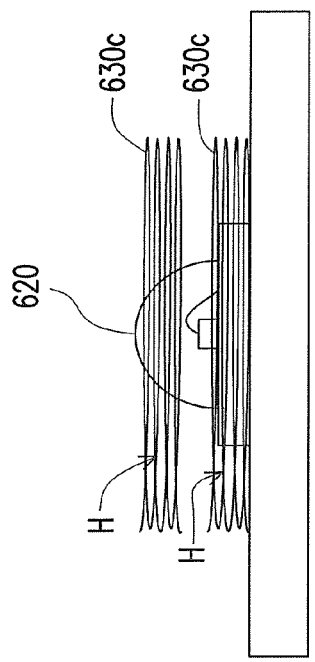

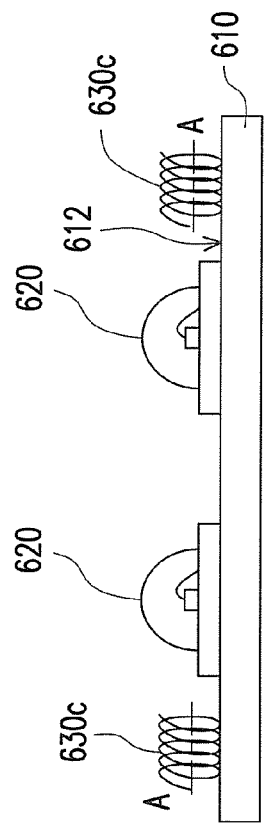
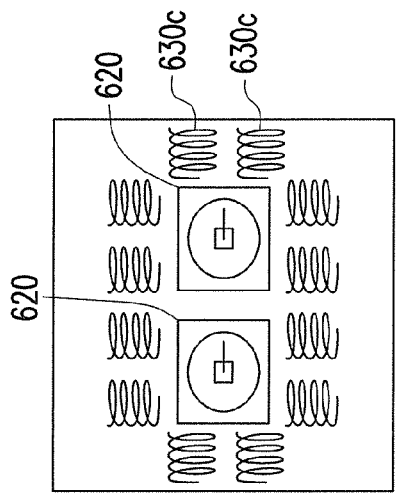
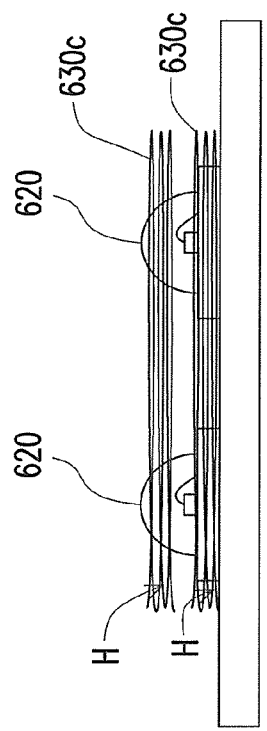
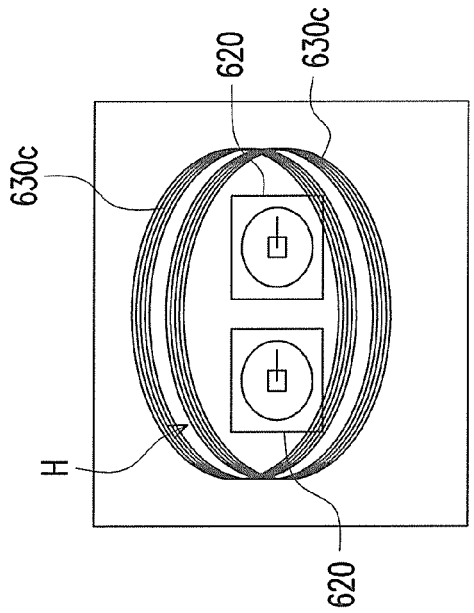

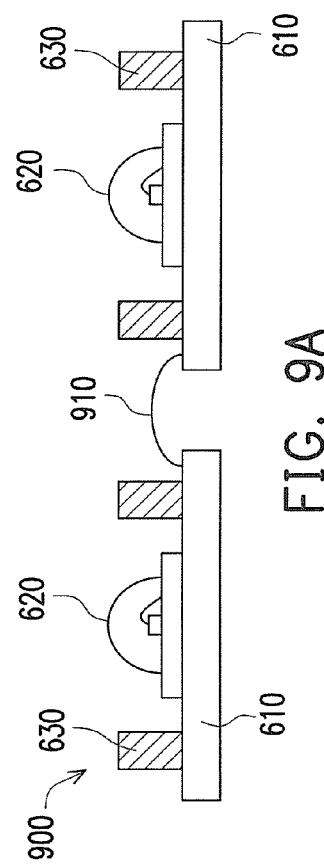
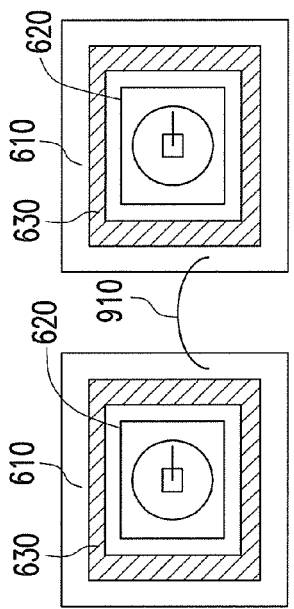
FIG. 9A
FIG. 9B
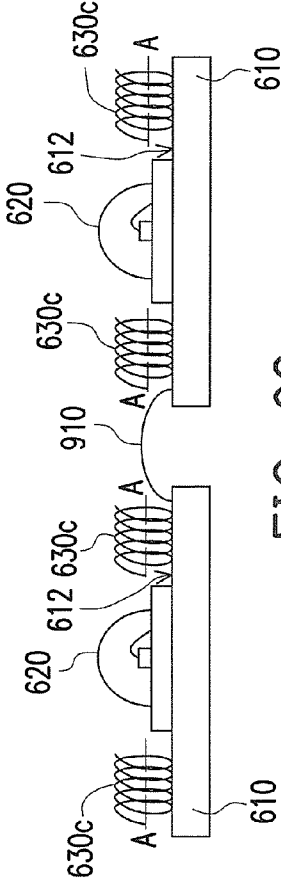
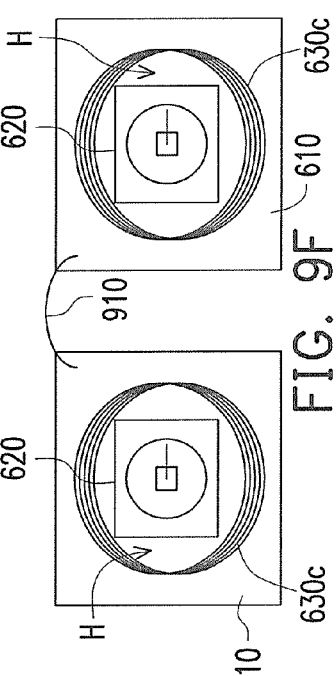
FIG. 9C
FIG. 9D
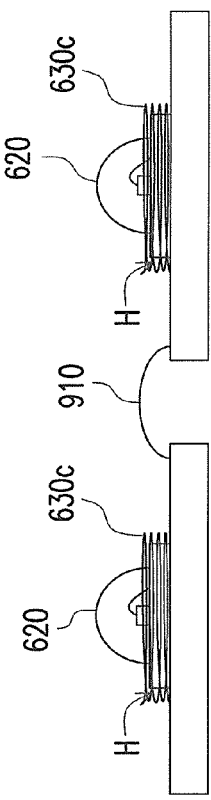
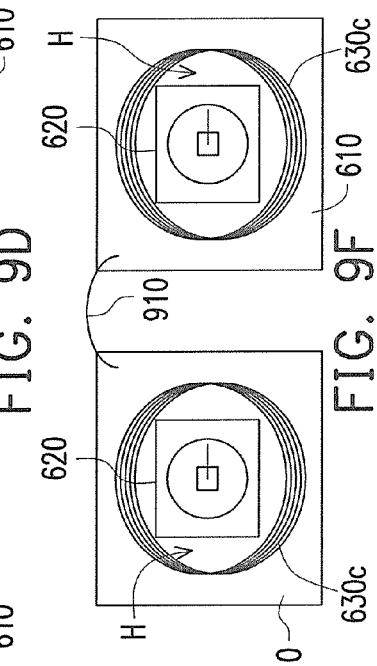
FIG. 9E
FIG. 9F

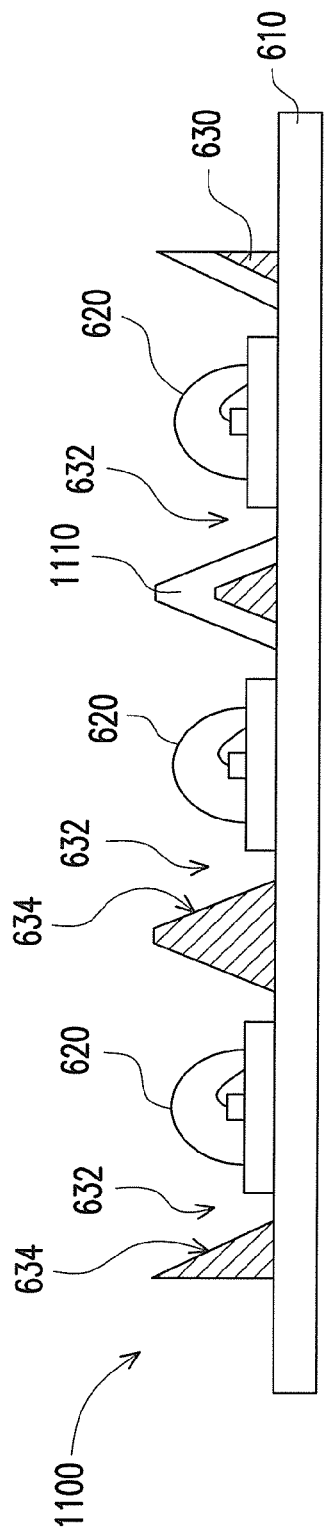
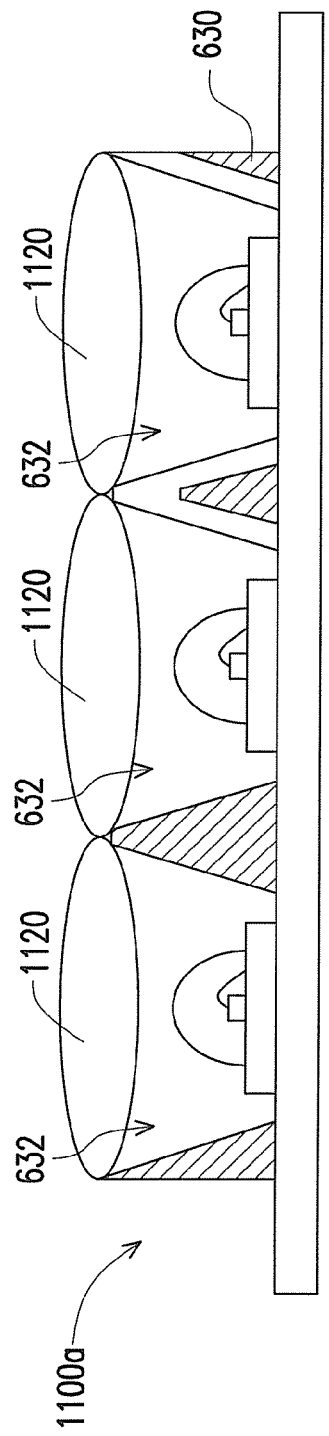

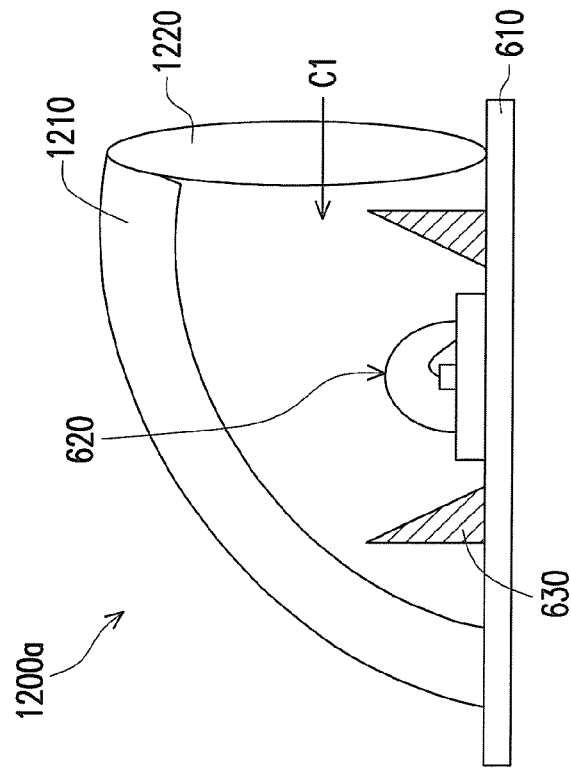
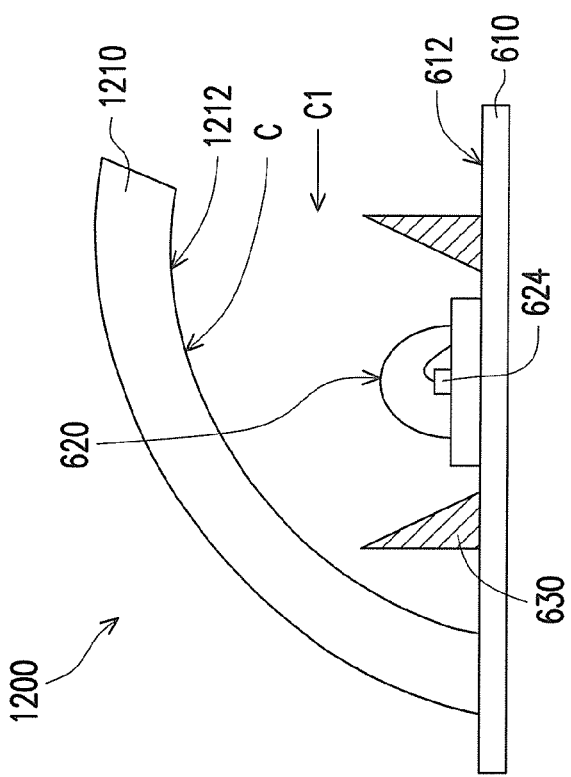
FIG. 12A
FIG. 12B

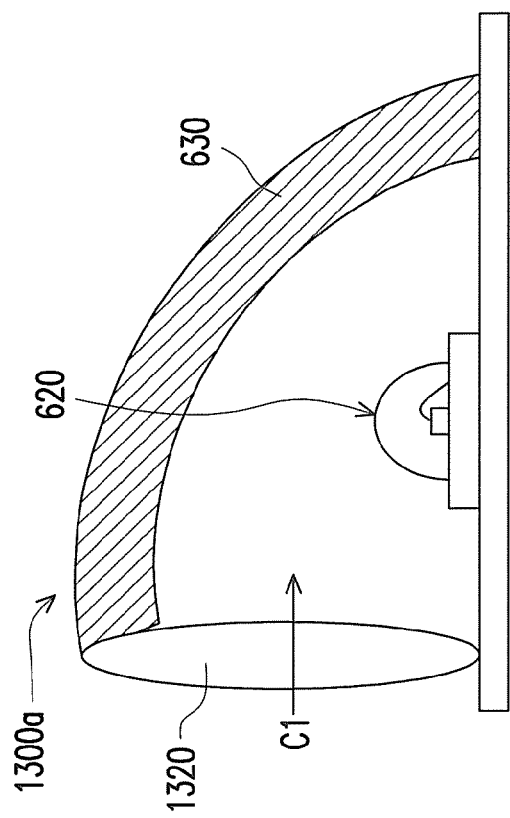
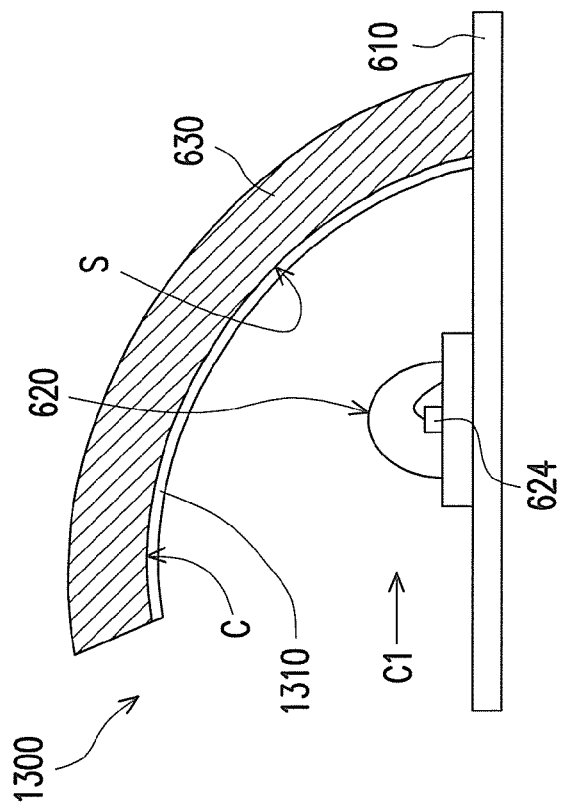

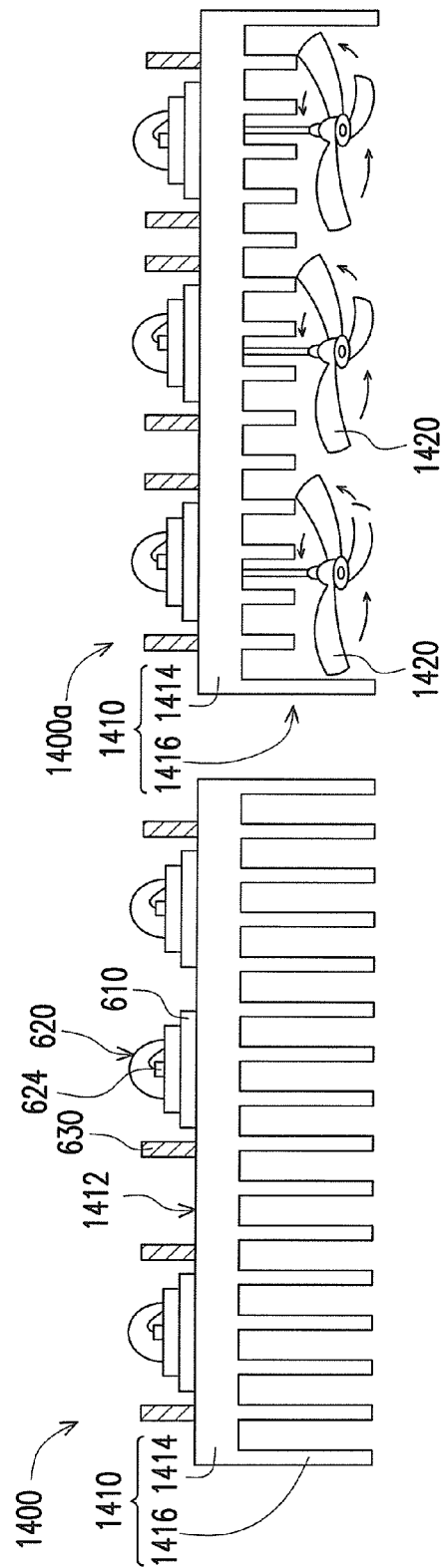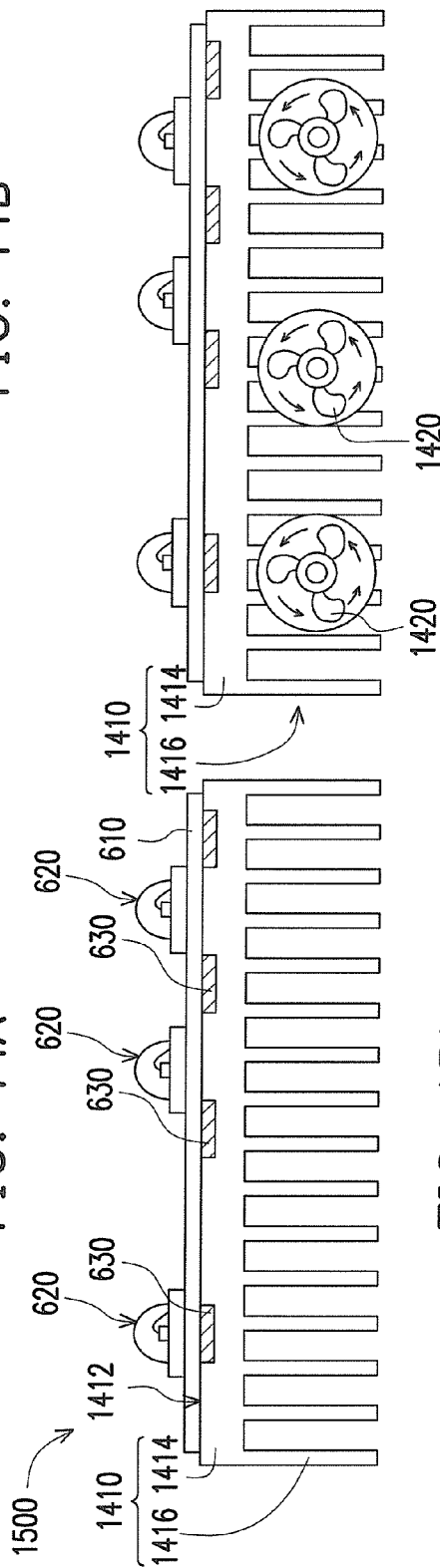

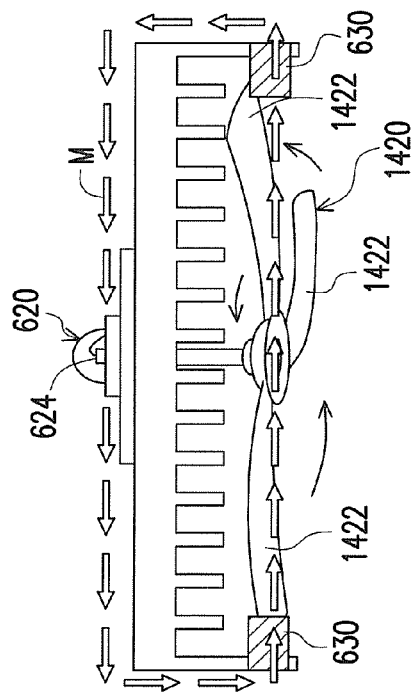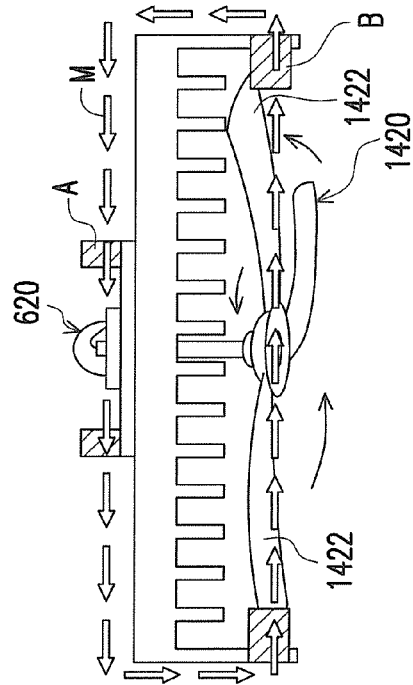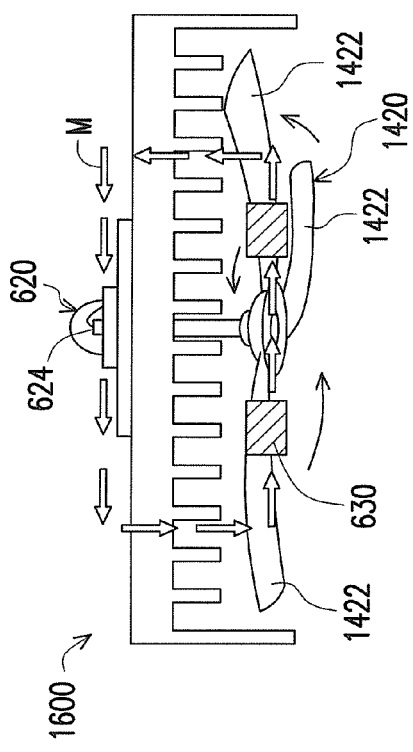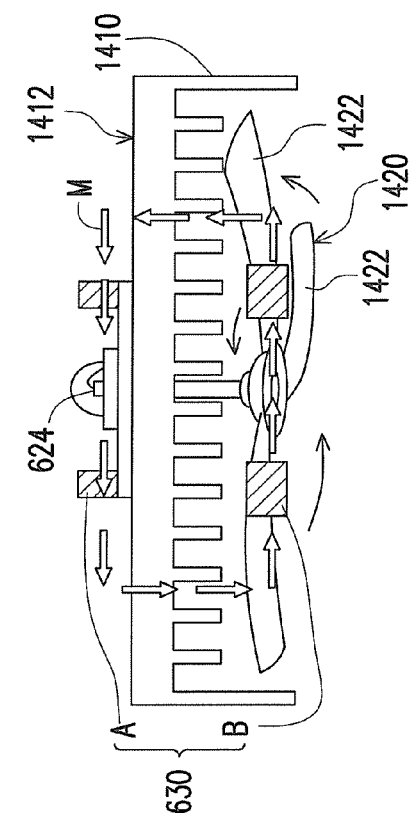

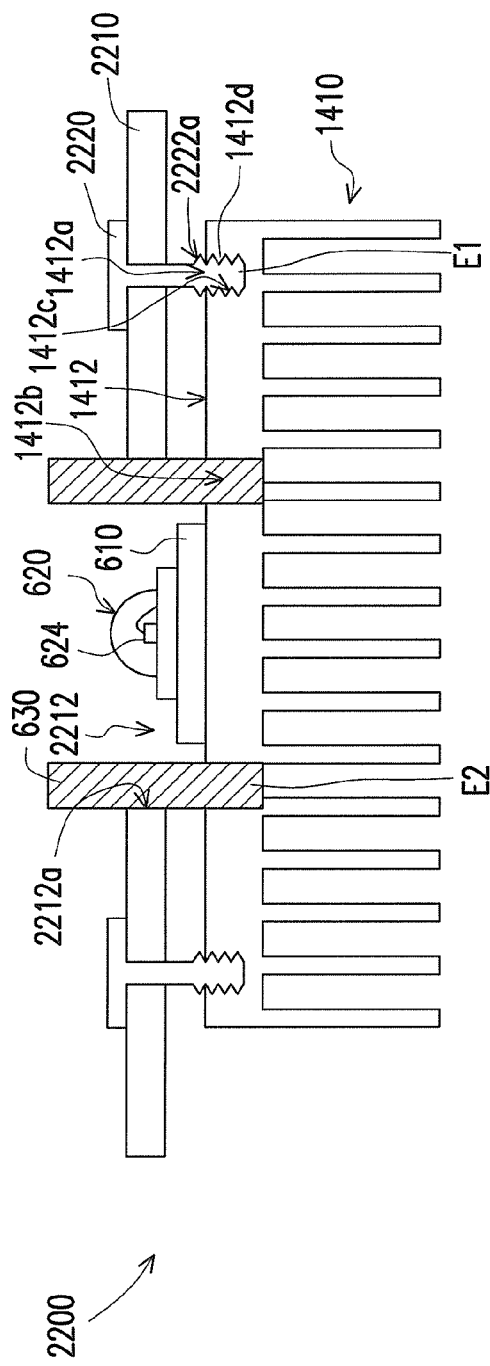
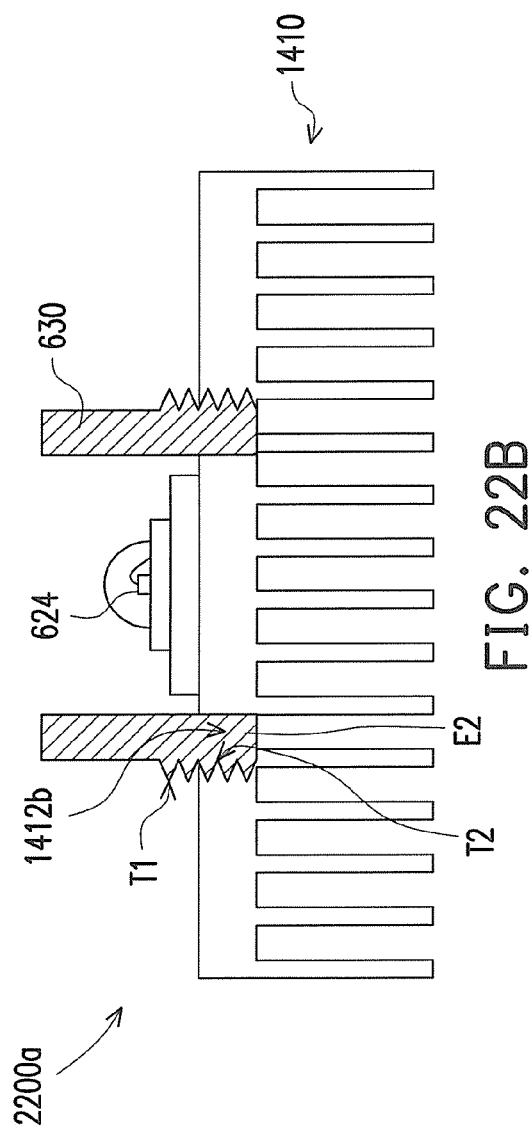
FIG. 22A
FIG. 22B

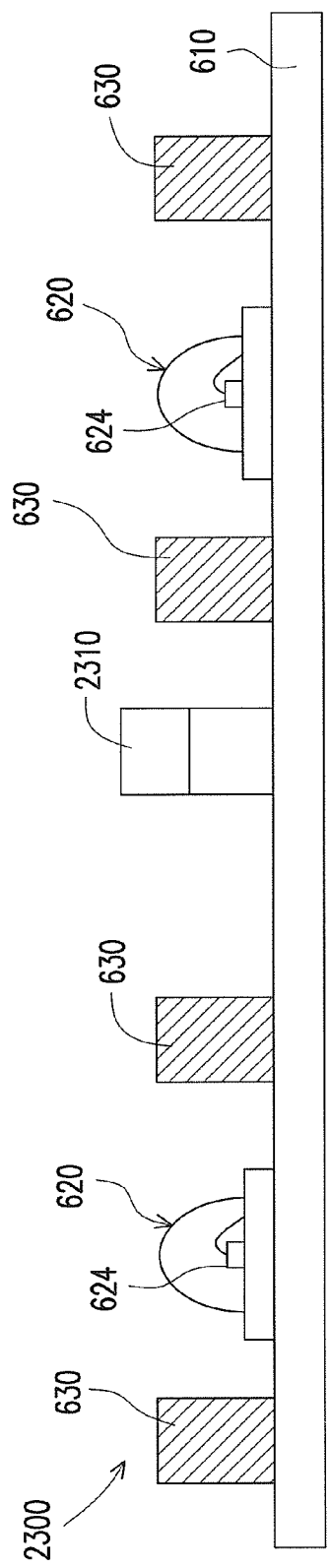
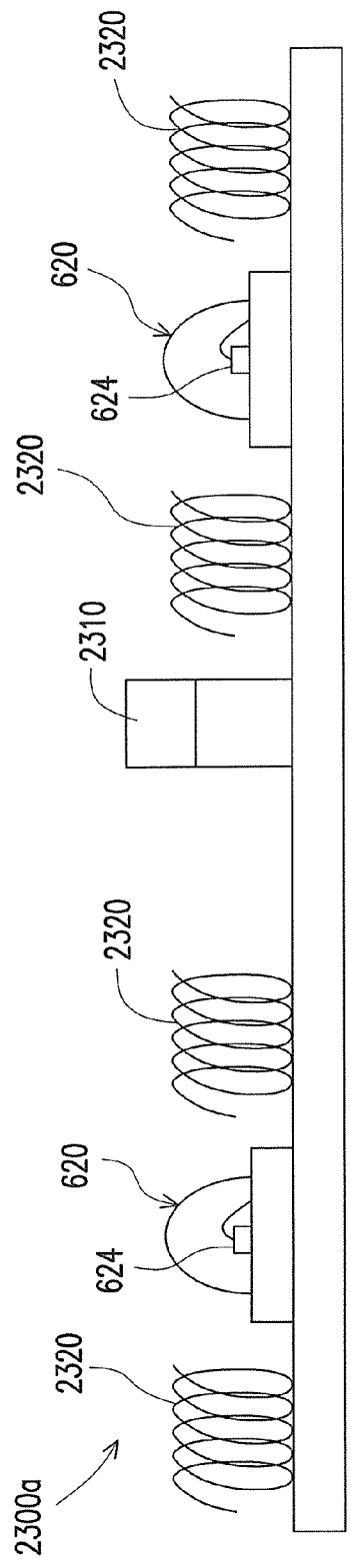

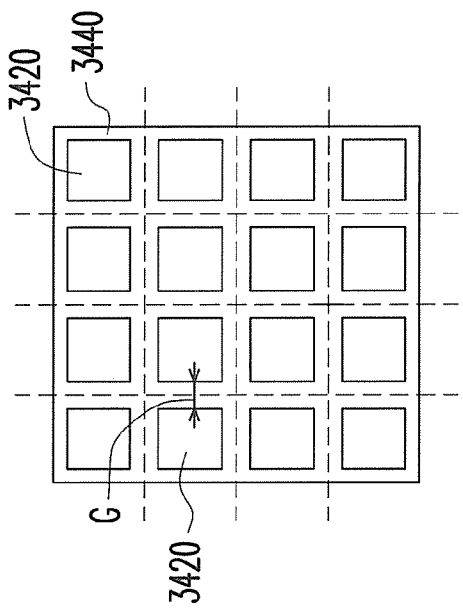
FIG. 34D
FIG. 34E
FIG. 34F
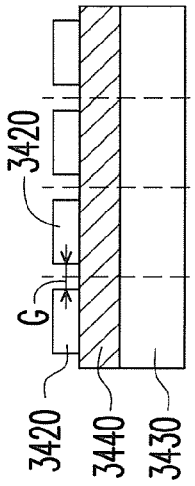
FIG. 34A
FIG. 34B
FIG. 34C

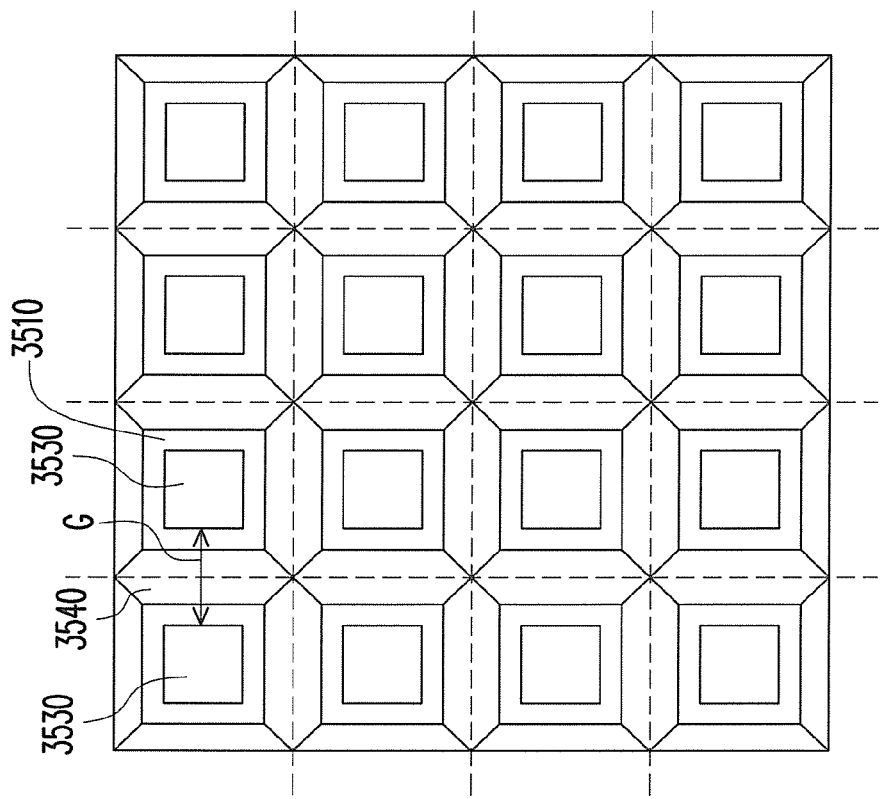
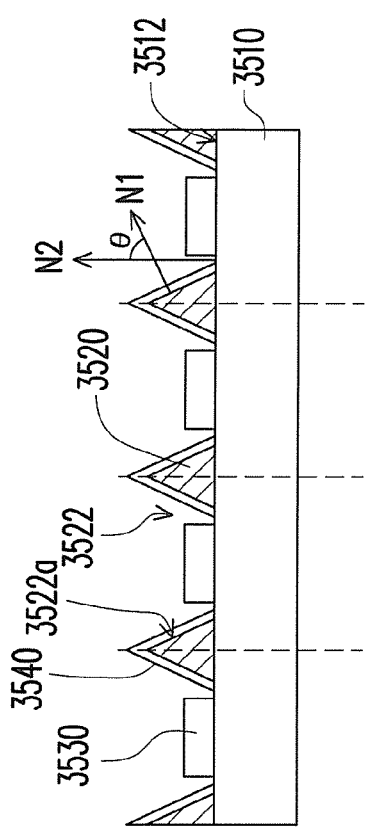
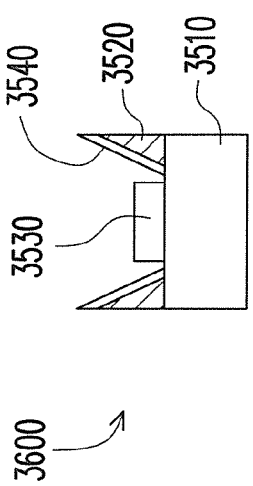
FIG. 36A
FIG. 36B
FIG. 36C

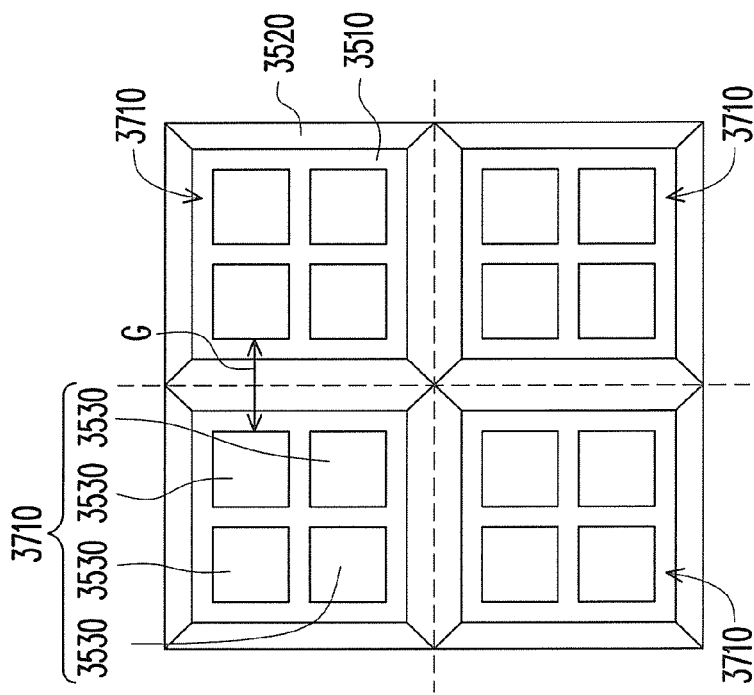
FIG. 37C
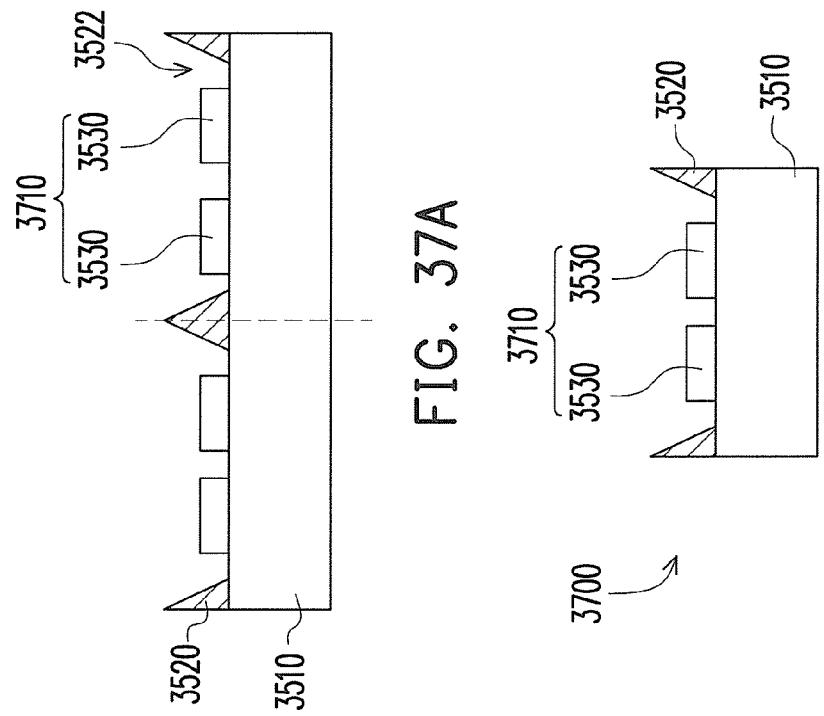
FIG. 37A
FIG. 37B

LIGHT EMITTING CHIP PACKAGE MODULE AND LIGHT EMITTING CHIP PACKAGE STRUCTURE AND MANUFACTURING METHOD THEREOF

BACKGROUND OF THE INVENTION

1. Technical Field

The disclosure relates to a light emitting chip package structure, a light emitting chip package module, and a manufacturing method of a light emitting chip package structure. More particularly, the disclosure relates to a light emitting chip package structure with superior light emitting efficiency, a light emitting chip package module with superior light emitting efficiency, and a manufacturing method of a light emitting chip package structure with superior light emitting efficiency.

2. Description of Related Art

Different from a normal fluorescent lamp or a normal incandescent lamp that generates heat for luminescence, a semiconductor light emitting chip package structure including a light emitting diode (LED) emits light by means of semiconductor characteristics, and the light emitted by such a semiconductor light emitting chip package structure is called "cold luminescence". With advantages of long life span, light weight, and low power consumption, the aforesaid light emitting chip package structure can be applied to various fields, such as an optical display, a traffic light, a data storage device, a communication device, an illumination device, a medical device, and so on. Accordingly, how to improve light emitting efficiency of the light emitting chip package structure is an important research topic in this technical field.

FIG. 1 is a cross-sectional view illustrating a light emitting chip in a conventional light emitting chip package structure. As shown in FIG. 1, a light emitting chip 100 is a vertical-type LED chip including electrodes 110 and 120, a first doped layer 130, a second doped layer 140, a semiconductor light emitting layer 150 located between the first and the second doped layers 130 and 140. The electrode 110 is located on the first doped layer 130, and the electrode 120 is located on the second doped layer 140. Electric current density distribution is decreased with an increase in a distance from the electrodes 110 and 120. In FIG. 1, dense line segments represent high electric current density, and a region with most of the line segments is located between the electrodes 110 and 120. Nonetheless, the region with the greatest light emitting efficiency is located between the electrodes 110 and 120.

FIG. 2 is a top view illustrating a light emitting chip in a conventional light emitting chip package structure. As indicated in FIG. 2, a light emitting chip 200 is a plane-type LED chip including electrodes 210 and 220. Electric current is transmitted through a path with the lowest resistance, and a central path between the electrodes 210 and 220 has the densest electric current distribution.

SUMMARY

In the disclosure, a light emitting chip package module including at least a substrate, at least a light emitting chip package structure, and at least a first magnetic device is provided. The substrate has a first surface. The light emitting chip package structure is disposed on the first surface of the substrate. Besides, the light emitting chip package structure includes a carrier, at least a light emitting chip, and a sealant. The light emitting chip is disposed on and electrically connected to the carrier. The sealant is disposed on the carrier and covers the light emitting chip. The first magnetic device is disposed next to the light emitting chip package structure to apply a magnetic field to the light emitting chip.

In the disclosure, a light emitting chip package structure including a carrier, at least a light emitting chip, and a first magnetic device is provided. The light emitting chip is disposed on the carrier. The first magnetic device is disposed next to the light emitting chip, and a space surrounded by the first magnetic device has a height. The light emitting chip is substantially located at half of the height of the space.

In the disclosure, a light emitting chip package structure including a carrier, at least a light emitting chip, and a first magnetic material is provided. The light emitting chip is disposed on the carrier. The first magnetic material is disposed between the light emitting chip and the carrier.

In the disclosure, a manufacturing method of a light emitting chip package structure is provided. The manufacturing method is described below. A carrier is provided. A magnetic material layer is disposed on the carrier. A plurality of light emitting chips are disposed on the magnetic material layer, and the light emitting chips are separated from one another. The magnetic material layer and the carrier are cut along a gap between any two adjacent light emitting chips.

In the disclosure, a manufacturing method of a light emitting chip package structure is provided. The manufacturing method is described below. A carrier is provided. A patterned magnetic layer is disposed on the carrier. The patterned magnetic layer has a plurality of openings. A plurality of light emitting chips are disposed in the openings, respectively. The patterned magnetic layer and the carrier are cut along a gap between any two adjacent light emitting chips.

It is to be understood that both the foregoing general descriptions and the following detailed embodiments are exemplary and are, together with the accompanying drawings, intended to provide further explanation of technical features and advantages of the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6A is a cross-sectional view illustrating a light emitting chip package module according to an embodiment of the disclosure and taken along a line segment I-I' in FIG. 6B. FIG. 6B is a top view of FIG. 6A. FIG. 6C to FIG. 6I illustrate variations of the light emitting chip package module depicted in FIG. 6A.

FIG. 7A is a cross-sectional view illustrating a light emitting chip package module according to an embodiment of the disclosure and taken along a line segment I-I' in FIG. 7B. FIG.

7B is a top view of FIG. 7A. FIG. 7C-FIG. 7K illustrate variations of the light emitting chip package module depicted in FIG. 7A wherein FIG. 7I is a three-dimensional view of FIG. 7H and FIG. 7K is a three-dimensional view of FIG. 7J.

FIG. 8C, FIG. 8E, FIG. 8G, FIG. 8I, FIG. 8K, FIG. 8M, and FIG. 8O illustrate variations of the light emitting chip package module depicted in FIG. 8A. FIG. 8F is a top view of FIG. 8E. FIG. 8H is a top view of FIG. 8G. FIG. 8J is a top view of FIG. 8I. FIG. 8L is a top view of FIG. 8K. FIG. 8N is a top view of FIG. 8M. FIG. 8P is a top view of FIG. 8O.

FIG. 9A is a cross-sectional view illustrating a light emitting chip package module according to an embodiment of the disclosure. FIG. 9B is a top view of FIG. 9A. FIG. 9C and FIG. 9E illustrate variations of the light emitting chip package module depicted in FIG. 9A. FIG. 9D is a top view of FIG. 9C. FIG. 9F is a top view of FIG. 9E.

FIG. 11A is a cross-sectional view illustrating a light emitting chip package module according to an embodiment of the disclosure. FIG. 11B illustrates a variation of the light emitting chip package module depicted in FIG. 11A.

FIG. 12A is a cross-sectional view illustrating a light emitting chip package module according to an embodiment of the disclosure. FIG. 12B illustrates a variation of the light emitting chip package module depicted in FIG. 12A.

FIG. 13A is a cross-sectional view illustrating a light emitting chip package module according to an embodiment of the disclosure. FIG. 13B illustrates a variation of the light emitting chip package module depicted in FIG. 13A.

FIG. 14A is a cross-sectional view illustrating a light emitting chip package module according to an embodiment of the disclosure. FIG. 14B illustrates a variation of the light emitting chip package module depicted in FIG. 14A.

FIG. 15A is a cross-sectional view illustrating a light emitting chip package module according to an embodiment of the disclosure. FIG. 15B illustrates a variation of the light emitting chip package module depicted in FIG. 15A.

FIG. 16A is a cross-sectional view illustrating a light emitting chip package module according to an embodiment of the disclosure. FIG. 16B to FIG. 16D illustrate variations of the light emitting chip package module depicted in FIG. 16A.

FIG. 22A is a cross-sectional view illustrating a light emitting chip package module according to an embodiment of the disclosure. FIG. 22B illustrates a variation of the light emitting chip package module depicted in FIG. 22A.

FIG. 23A is a cross-sectional view illustrating a light emitting chip package module according to an embodiment of the disclosure. FIG. 23B illustrates a variation of the light emitting chip package module depicted in FIG. 23A.

FIG. 34A to FIG. 34E are cross-sectional views illustrating a manufacturing process of a light emitting device according to an embodiment of the disclosure. FIG. 34F is a top view illustrating the structure depicted in FIG. 34D.

FIG. 36A to FIG. 36B are cross-sectional views illustrating a manufacturing process of a light emitting device according to an embodiment of the disclosure. FIG. 36C is a top view illustrating the structure depicted in FIG. 36A.

FIG. 37A to FIG. 37B are cross-sectional views illustrating a manufacturing process of a light emitting device according to an embodiment of the disclosure. FIG. 37C is a top view illustrating the structure depicted in FIG. 37A.

DETAILED DESCRIPTION

Hall Effect is a physical phenomenon in which an external magnetic field is applied to an electric current when the electric current flows through a conductive wire. Lorenz's force (F=q*v*B) is generated by a vector of the external magnetic field which is perpendicular to the direction of the electric current. The resultant Lorenz's force is exerted on the electric current and gives rise to a transverse drift of the path of the electric current. This disclosure applies the Hall Effect to change the path of the electric current in a light emitting chip (e.g. an LED chip or a laser diode chip), so as to increase uniformity of electric current distribution in the light emitting chip and further improve light emitting uniformity and total light emitting efficiency of a light emitting chip package structure.

Specifically, a magnetic device is formed in the light emitting chip package structure to apply a magnetic field to the light emitting chip in the light emitting chip package structure, and an impact of the magnetic field on the path of the electric current in the light emitting chip is exemplarily described in following embodiments.

Figure 1:
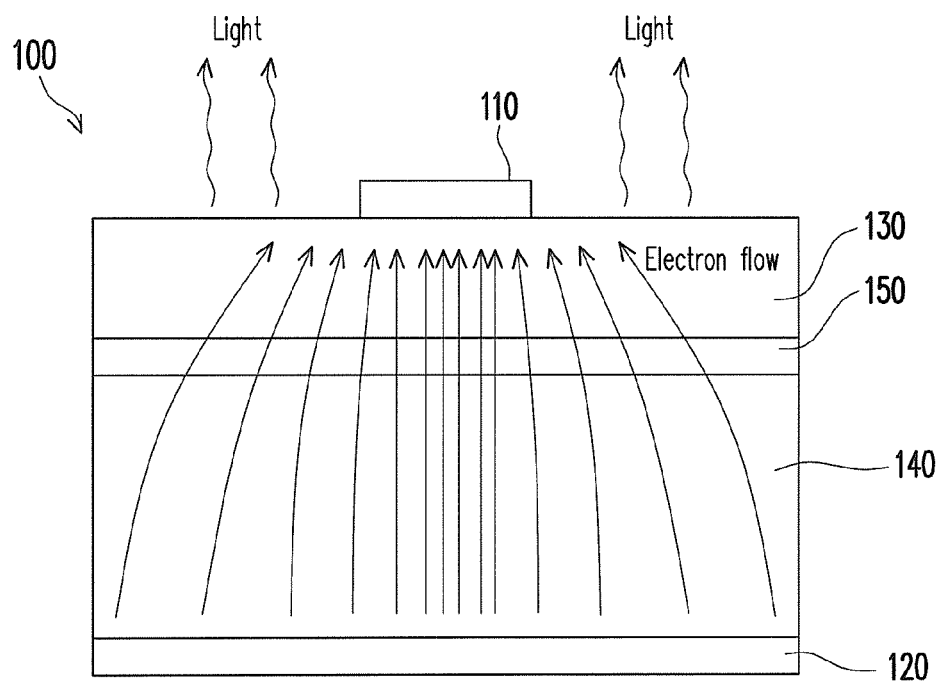
FIG. 1 is a cross-sectional view illustrating a light emitting chip in a conventional light emitting chip package structure.
Figure 2:
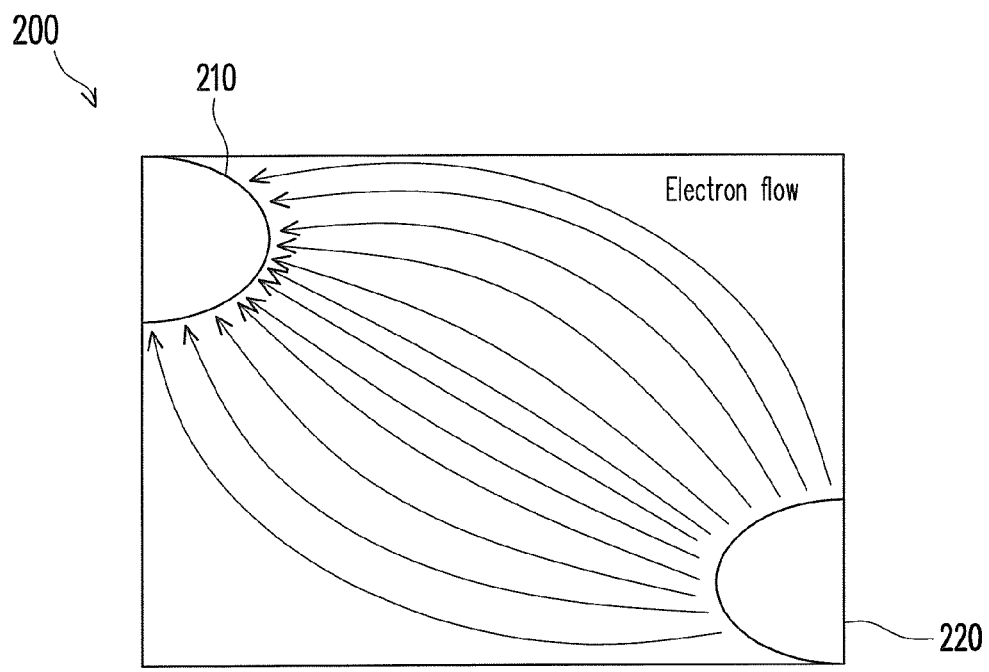
FIG. 2 is a top view illustrating a light emitting chip in a conventional light emitting chip package structure.
Figure 3:
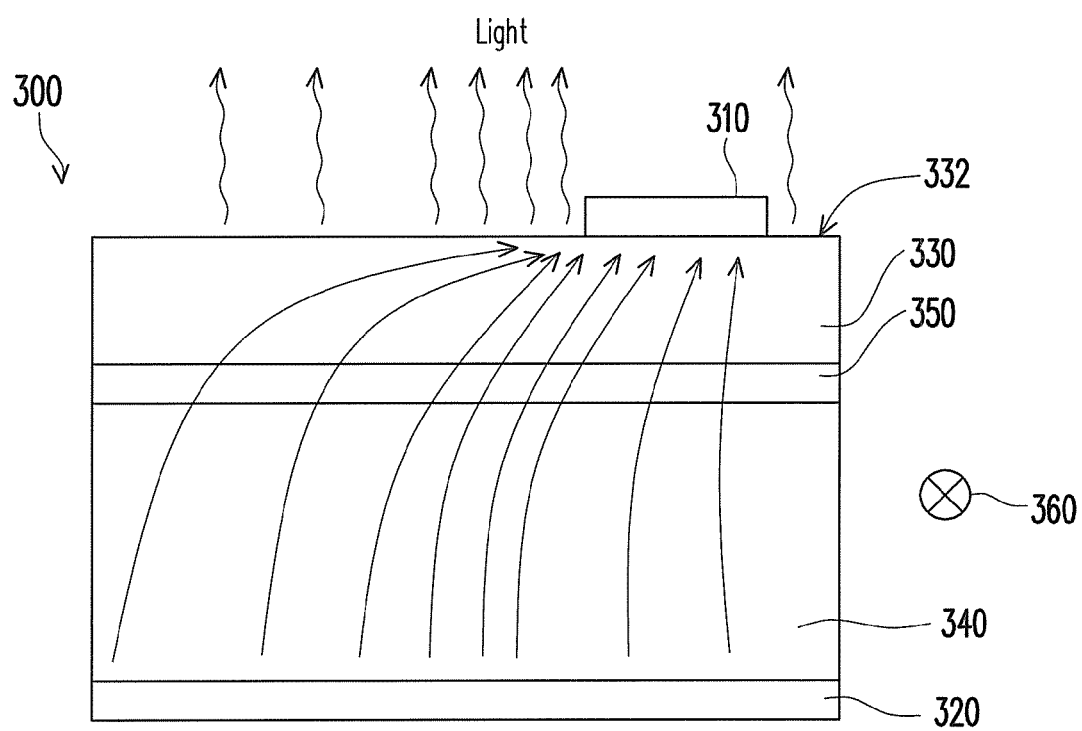
FIG. 3 is a cross-sectional view illustrating a light emitting chip in a light emitting chip package structure according to an embodiment of the disclosure.

FIG. 3 is a cross-sectional view illustrating a light emitting chip in a light emitting chip package structure according to an embodiment of the disclosure. As shown in FIG. 3, a light emitting chip 300 is, for example, a vertical-type LED chip including electrodes 310 and 320, a first doped layer 330, a second doped layer 340, a light emitting layer 350 located between the first and the second doped layers 330 and 340. The electrode 310 is located on the first doped layer 330, and the electrode 320 is located on the second doped layer 340. The first dope layer 330 and the second doped layer 340 can be a p-type doped layer and an n-type doped layer.

The light emitting chip 300 is in a magnetic filed 360 generated by a magnetic device (not shown) in the light emitting chip package structure of this embodiment, and the magnetic field 360 points into the paper. The Lorenz's force induced by the magnetic field 360 pushes electrons, and thereby the electric current is drifted leftward. The main electric current density distribution (represented by electron flow lines) in a region between the electrodes 310 and 320 is changed to be in a region below a light-out plane 332, which means the magnetic field 360 can effectively improve uniformity of the electric current density and substantially increase the total light emitting efficiency of the light emitting chip 300. The light-out plane 332 herein is defined as a surface of the first doped layer 330 which is not covered by the electrode 310. It should be stressed that so long as there is a vector of the magnetic field which is perpendicular to a direction of internal electric current flow in the light emitting chip 300, the Lorenz's force that can be detected causes the electric current to drift, and the light emitting efficiency can be improved.

Figure 4:
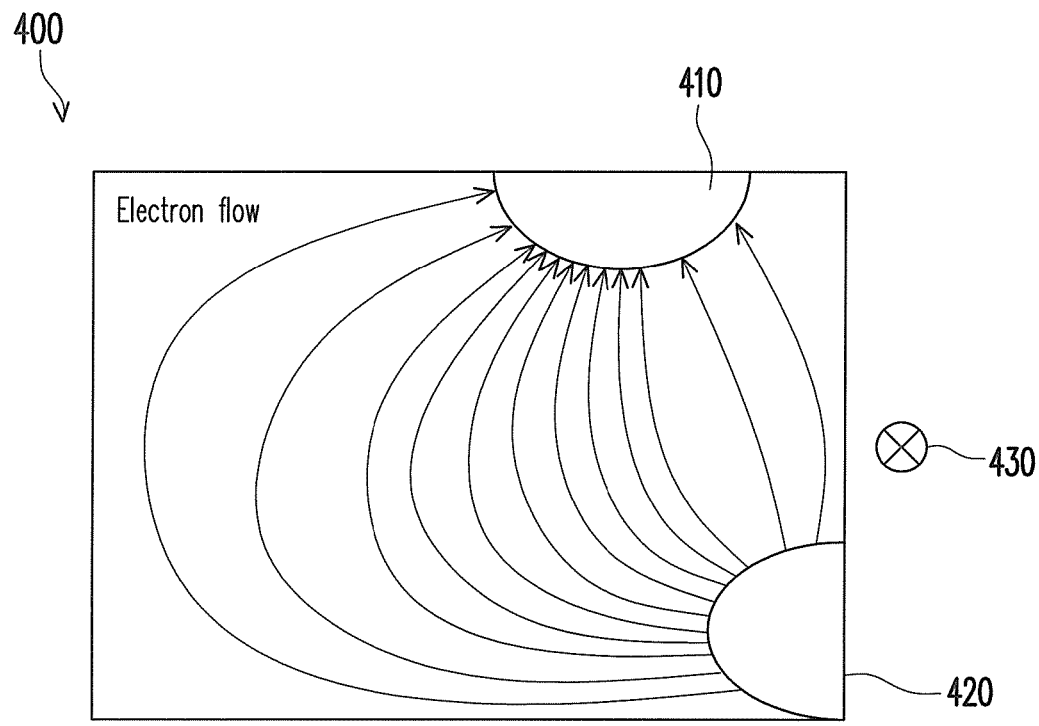
FIG. 4 is a top view illustrating a light emitting chip in a light emitting chip package structure according to an embodiment of the disclosure.

Another embodiment is depicted in FIG. 4, which is a top view illustrating a light emitting chip in a light emitting chip package structure. In FIG. 4, a light emitting chip 400 is a plane-type LED chip, for example. Similar to the previous embodiment, this embodiment indicates that the Lorenz's force induced by a magnetic field 430 pushes electrons, such that an electric current between electrodes 410 and 420 of the light emitting chip 400 is drifted leftward. The path of the electric current can be expanded to a better extent (to the left region), thus resulting in uniform electric current distribution.

Figure 5:
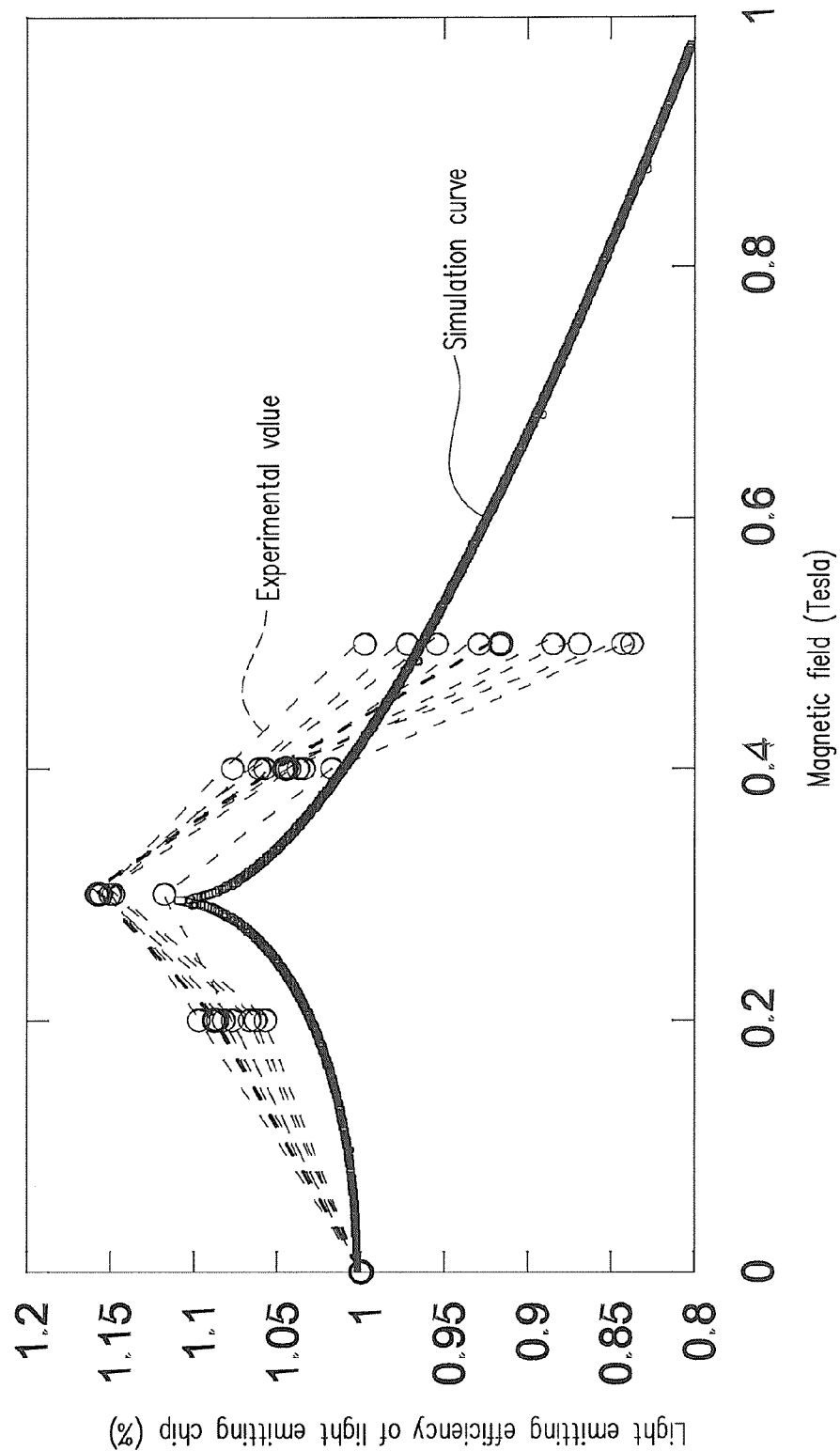
FIG. 5 is a curve illustrating relationship between light emitting efficiency of a light emitting chip and intensity of a magnetic field applied to the light emitting chip according to an experimental example of the disclosure.

FIG. 5 is a curve illustrating relationship between light emitting efficiency of a light emitting chip and intensity of a magnetic field applied to the light emitting chip according to an experimental example of the disclosure. In FIG. 5, experimental results of light emitting efficiency of nine light emitting chips in the magnetic field are represented by dotted lines, and a simulation curve in FIG. 5 is drawn in form of a solid line.

It can be learned from FIG. 5 that the light emitting efficiency of the light emitting chip can be assuredly improved by applying the magnetic field to the light emitting chip. When the magnetic field reaches a certain level, the light emitting chip can have the maximum light emitting efficiency.

The theoretical background with respect to distribution capacity of the drifting electric current is explained in the following descriptions, and thereby how the external magnetic field affects the density of electric current is elucidated.

In physics, the Lorenz's force is defined as a force exerted on a charged particle in an electromagnetic field. The force generated by an electric field qE and a magnetic field $q \cdot \vec{v} \times \vec{B}$ is exerted on the particle. A force F induced by the magnetic field B can be obtained by the following Lorenz's force equation:

$$\vec{F} = -q\left(\vec{E} + \frac{1}{c}\vec{v} \times \vec{B}\right),$$

$$\vec{B} = B_x + B_y + B_z,$$

$$\vec{v} = v_x + v_y + v_z,$$

$$\vec{E} = E_x + E_y + E_z.$$

Here, F stands for the Lorenz's force, E for the electric field, B for the magnetic field, q for the charged particle, v for instantaneous velocity of an electron, and x for an outer product. The electron accelerates in the same linear orientation as the E electric field but bends perpendicularly to both the instantaneous velocity vector v and the magnetic field B according to the right-hand rule.

In the electrostatic field, the time derivative is zero, and therefore the drift velocity is:

$$v_x = -\frac{e\tau}{m}\left(E_x + \frac{B_z}{c}V_y - \frac{B_y}{c}V_z\right),$$

$$v_y = -\frac{e\tau}{m}\left(E_y + \frac{B_z}{c}V_x - \frac{B_y}{c}V_z\right),$$

$$v_z = -\frac{e\tau}{m}\left(E_z + \frac{B_y}{c}V_x - \frac{B_x}{c}V_y\right),$$

wherein m stands for effective mass of the electron.

Based on the aforementioned equation, it can be deduced that the electron follows an axis of the electrostatic field B and drifts in a spiral path at an angular speed $w_c eB/mc$. For instance, in order to redirect the drifting electric current to a direction of the negative x axis, the vector of the magnetic field on the z ($B_z$) axis must be increased, and the vector of the magnetic field on the y ($B_y$) axis must be decreased. Furthermore, when the velocity of the external electric current increases on the y axis, the velocity of the electric current on the x axis also increases. This makes the electric current even more distributed. It should be stressed that so long as there is a vector of the magnetic field which is perpendicular to a direction of internal electric current flow in the an LED, an electromagnetic force that can be detected causes the electric current to drift, and the light emitting efficiency can be improved.

When the external magnetic field is applied to the light emitting chip, the path of the electric current is changed, and distribution of the carrier density in the semiconductor is also changed. Therefore, even when the inflow electric current magnitude remains unchanged, the light emitting chip can still have high photoelectric conversion efficiency.

The intensity of the external magnetic field applied on the light emitting chip of the disclosure is greater than 0.01 tesla and can be treated as a constant value, a time-varying value, or a gradient-varying value, while the intensity is not limited to the conditions stated above. Additionally, an angle foamed by the direction of the magnetic field and that of the light emitting direction ranges from 0 to 360 degrees. The magnetic field can be supplied by a magnet, a magnetic membrane, an electromagnet, or any other magnetic material in other types, and there can be more than one magnetic source.

Based on the above conclusion, the light emitting chip in practice can be combined to the magnetic material in different ways, for example, by means of epoxy resin, metal bonding, wafer bonding, epitaxial embedding, and coating. In addition, the magnetic material can be coupled to the light emitting chip and can be used to form a substrate, a submount, an electromagnet, a slug, a retainer, or a magnetic heat sink. Alternatively, a magnetic membrane, a magnetic block, or a magnetic ring can be made of the magnetic material to provide the magnetic field applied to the light emitting chip. The light emitting chip can be a vertical-type LED, a vertical-type laser diode chip, a plane-type LED, or a plane-type laser diode chip.

Various light emitting chip package structures of the disclosure are described in the following embodiments which are merely exemplary and are not intended to limit the disclosure. The technical features mentioned in the following embodiments can be combined at will.

Figure 6H:
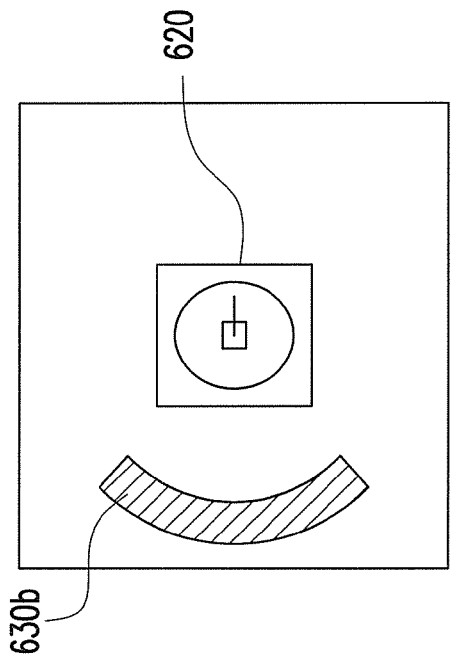

FIG. 6A is a cross-sectional view illustrating a light emitting chip package module according to an embodiment of the disclosure and taken along a line segment I-I' in FIG. 6B. FIG. 6B is a top view of FIG. 6A. FIG. 6C to FIG. 6I illustrate variations of the light emitting chip package module depicted in FIG. 6A.

As shown in FIG. 6A and FIG. 6B, a light emitting chip package module 600 includes a substrate 610, a light emitting chip package structure 620, and a magnetic device 630.

The substrate 610 has a surface 612, and a material of the substrate 610 includes ceramics, silicon, aluminum, copper, diamond, or graphite. The light emitting chip package structure 620 is disposed on the surface 612 of the substrate 610. The light emitting chip package structure 620 includes a carrier 622, a light emitting chip 624, and a sealant 626.

The carrier 622 is, for example, a ceramic substrate, a silicon substrate, an aluminum substrate, a copper substrate, a high thermal conductive substrate, or a circuit board. The light emitting chip 624 is disposed on and electrically connected to the carrier 622.

In FIG. 6A, the light emitting chip 624 and the carrier 622 are connected by wire bonding. In other embodiments, the light emitting chip 624 and the carrier 622 can be electrically connected by flip chip bonding or other types of bonding. The sealant 626 is disposed on the carrier 622 and covers the light emitting chip 624. The sealant 626, for example, is a molding compound or a glass sealing.

The magnetic device 630 is disposed next to the light emitting chip package structure 620 to apply a magnetic field to the light emitting chip 624. Note that the magnetic device 630 can apply a magnetic field to the light emitting chip 624, and therefore the uniformity of electric current distribution in the light emitting chip 624 can be improved during operation of the light emitting chip package structure 620. As such, the magnetic device 630 is conducive to improvement of the total light emitting efficiency and light emitting uniformity of the light emitting chip package module 600 in this embodiment.

The magnetic device 630 of this embodiment is located on the surface 612, and the magnetic device 630 can be adhered to or welded to the substrate 610. Besides, the magnetic device 630 has a ring-shaped structure. The magnetic device 630 has an opening 632 in which the light emitting chip package structure 620 is located. According to this embodiment, the magnetic device 630 is, for example, a magnet.

The magnetic device 630 of this embodiment can have an inclined plane 634 (indicated in FIG. 6C) facing the top of the light emitting chip 624 for more efficient light reflection and redirection. The included angle θ between a normal vector N1 of the inclined plane 634 and a normal vector N2 of the surface 612 is less than 90 degrees. An optical film layer 640 can be disposed on the inclined plane 634. Here, the optical film layer 640 can be a reflective layer or a light absorbing layer. The reflective layer can change a direction of light emitted by the light emitting chip 624, and the light absorbing layer can collimate the light emitted by the light emitting chip 624.

In FIG. 6D, a portion of the magnetic device 630 can be inlaid into the substrate 610 to adjust a relative position of the light emitting chip 624 and the magnetic device 630. Thereby, the light emitting chip 624 can be located at a place where the magnetic field supplied by the magnetic device 630 reaches the maximum value (in most cases, the light emitting chip 624 is located at one to three quarters of a height H of a space S surrounded by the magnetic device 630, e.g. located at half of the height H of the space S).

Figure 6I:
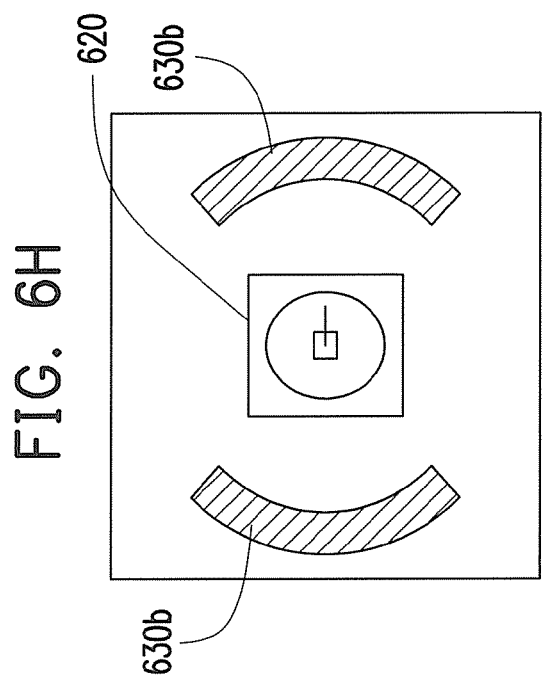
Figure 6F:
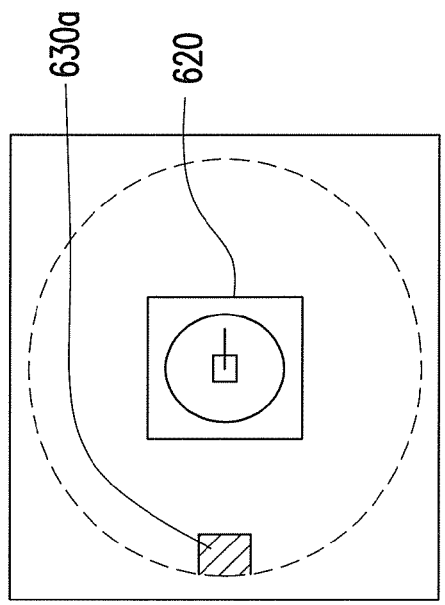
Figure 6G:
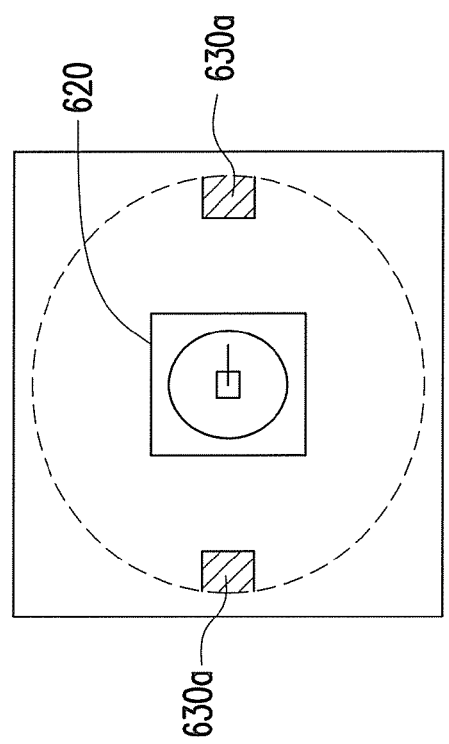

According to this embodiment, the magnetic device 630 can have a shape of a rectangular ring. In other embodiments, the magnetic device 630 can selectively have a shape of a circular ring (shown in FIG. 6E), a shape of a polygonal ring (not shown), or a shape of an irregular ring. Moreover, according to other embodiments, the magnetic device can have one or more block-shaped structures 630a (shown in FIG. 6F and FIG. 6G) or one or more strip-shaped structures 630b (shown in FIG. 6H and FIG. 6I). When the magnetic device has the block-shaped structures 630a or the strip-shaped structures 630b, the light emitting chip package structure 620 can be selectively surrounded by the block-shaped structures 630a or the strip-shaped structures 630b, as shown in FIG. 6G and FIG. 6I. The distribution of the magnetic field is possible to be altered according to the structure of the LED chip in accompany with the magnetic device in different shapes. In addition, the magnetic device may need to fit or engage with other external elements or modular. The variety of shapes in magnetic device provides the flexibility in designing the light emitting chip package module and its engagement means.

Figure 7D:
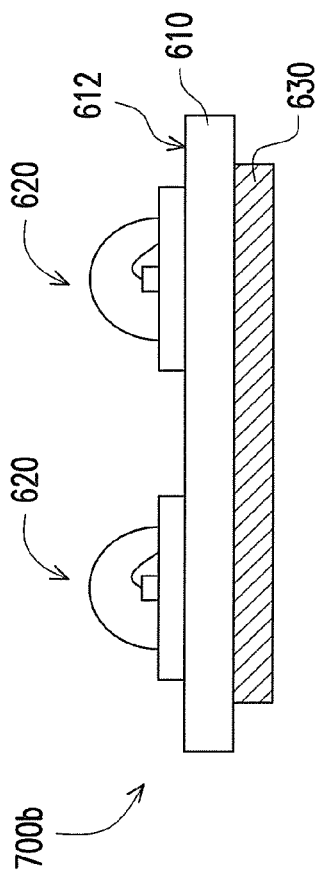
Figure 7F:
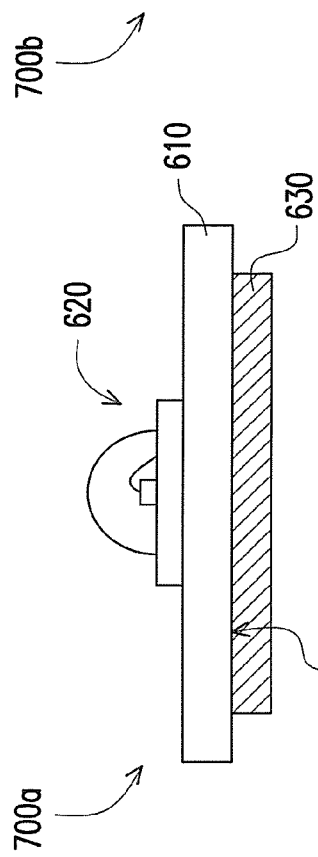
Figure 7E:
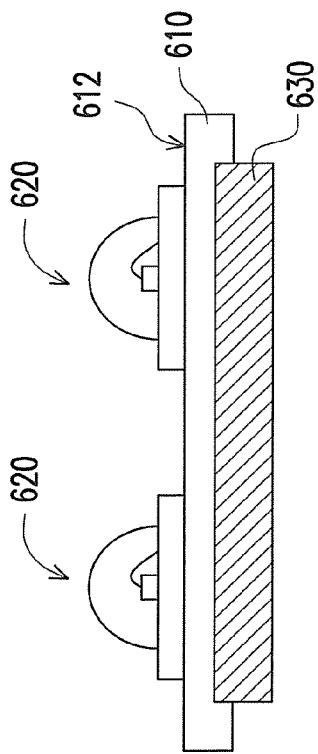
Figure 7G:
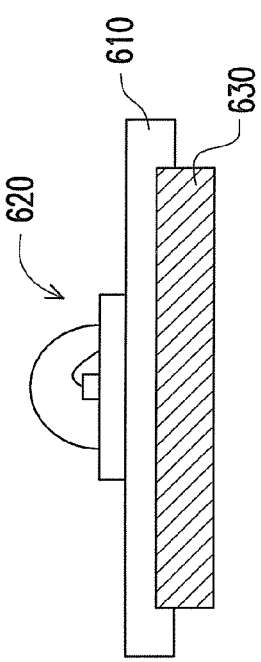
Figure 7I:
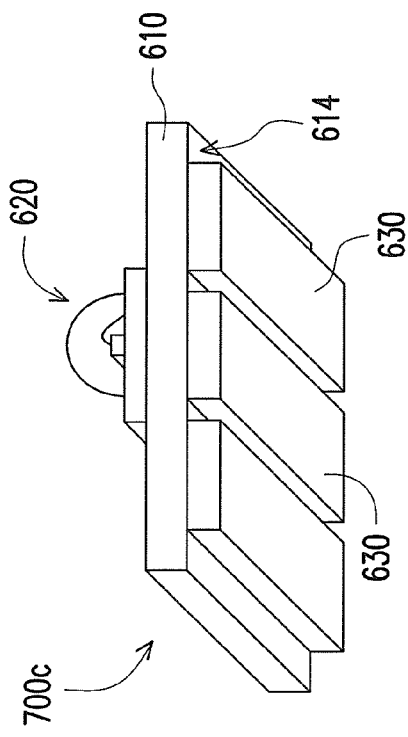
Figure 7K:
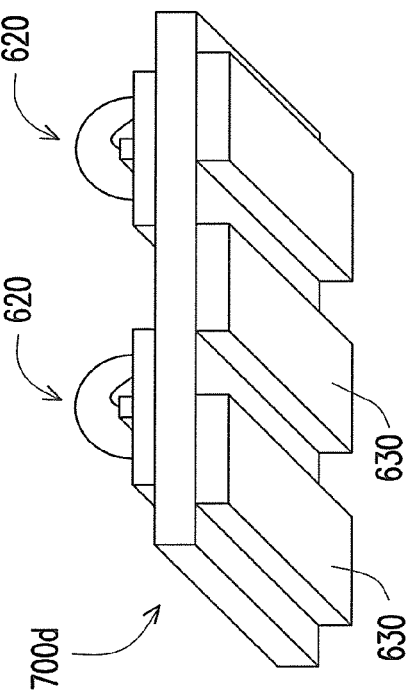
Figure 7H:
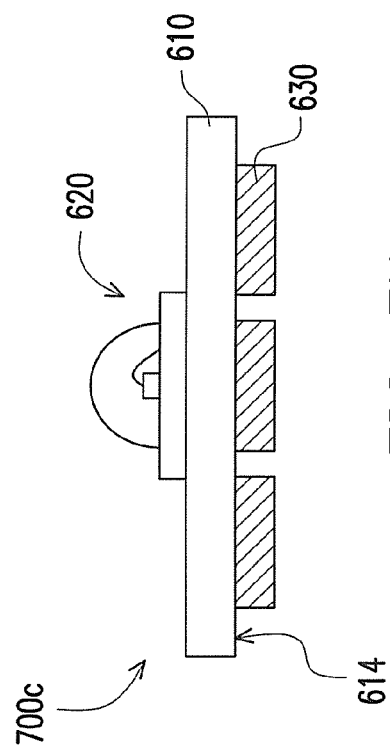
Figure 7J:
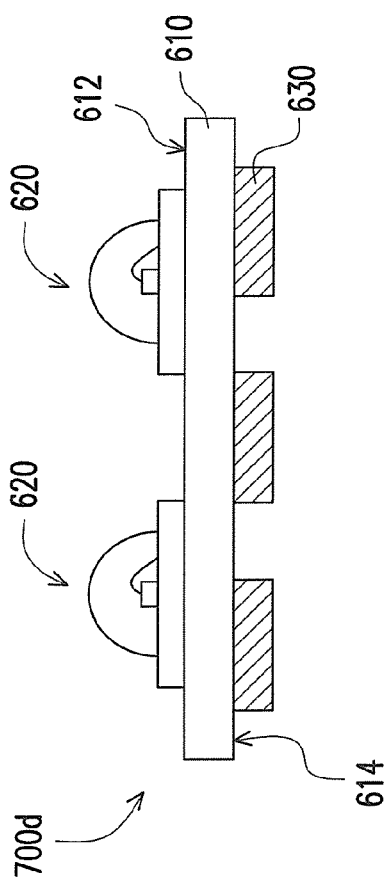

FIG. 7A is a cross-sectional view illustrating a light emitting chip package module according to an embodiment of the disclosure and taken along a line segment I-I' in FIG. 7B. FIG. 7B is a top view of FIG. 7A. FIG. 7C-FIG. 7K illustrate variations of the light emitting chip package module depicted in FIG. 7A wherein FIG. 7I is a three-dimensional view of FIG. 7H and FIG. 7K is a three-dimensional view of FIG. 7J.

As indicated in FIG. 7A and FIG. 7B, a light emitting chip package module 700 of this embodiment is similar to the light emitting chip package module 600 depicted in FIG. 6A, while the difference therebetween lies in that the light emitting chip package module 700 has a plurality of light emitting chip package structures 620 located in the opening 632 of the magnetic device 630. In addition, the magnetic device 630 of this embodiment can have the block-shaped structures 630a surrounding the light emitting chip package structures 620, as shown in FIG. 7C.

As indicated in FIG. 7D, a light emitting chip package module 700a of this embodiment is similar to the light emitting chip package module 700 depicted in FIG. 7A, while the difference therebetween lies in that the magnetic device 630 of the light emitting chip package module 700a is disposed on a surface 614 of the substrate 610 facing away from the light emitting chip package structures 620. A portion of the magnetic device 630 is, for example, embedded in the substrate 610 (shown in FIG. 7E). In another embodiment, the light emitting chip package module 700b has a plurality of light emitting chip package structures 620 disposed on the surface 612 of the substrate 610 (shown in FIG. 7F or FIG. 7G). In the other embodiment, the light emitting chip package module 700c has a plurality of magnetic devices 630 disposed on the surface 614 (shown in FIG. 7H and FIG. 7I). In the still another embodiment, the light emitting chip package module 700d has a plurality of magnetic devices 630 disposed on the surface 614 and a plurality of light emitting chip package structures 620 disposed on the surface 612 (shown in FIG. 7J and FIG. 7K).

Figure 8B:
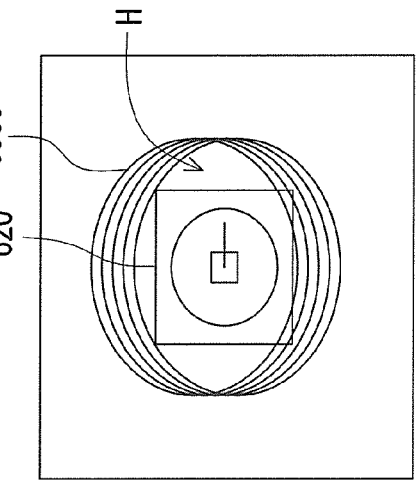
FIG. 8B is a top view of FIG. 8A.
Figure 8D:
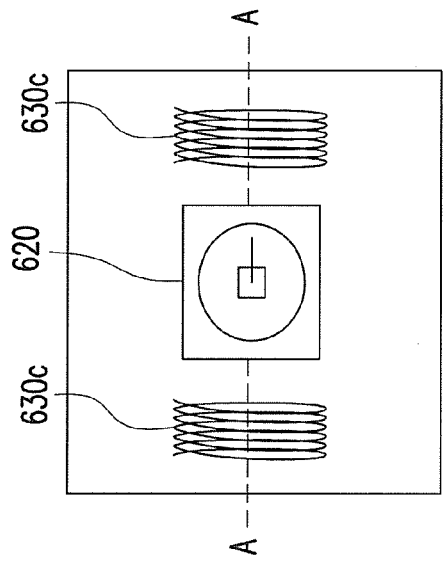
FIG. 8D is a top view of FIG. 8C.
Figure 8A:
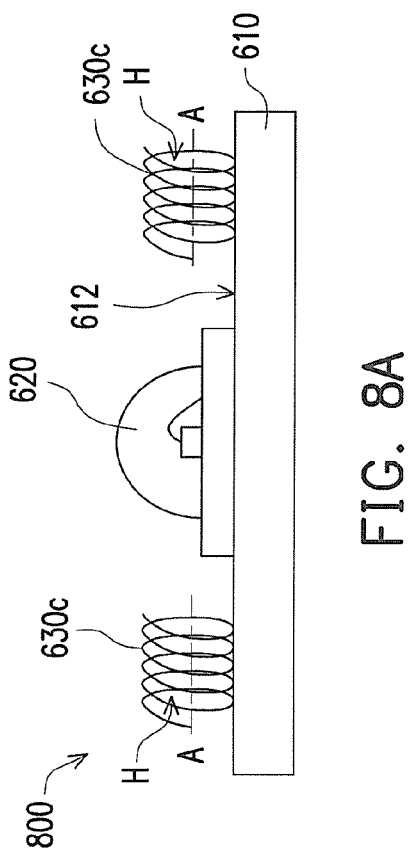
FIG. 8A is a side view illustrating a light emitting chip package module according to an embodiment of the disclosure and taken along a line segment I-I' in FIG. 8B.

FIG. 8A is a side view illustrating a light emitting chip package module according to an embodiment of the disclosure. FIG. 8B is a top view of FIG. 8A. FIG. 8C, FIG. 8E, FIG. 8G, FIG. 8I, FIG. 8K, FIG. 8M, and FIG. 8O illustrate variations of the light emitting chip package module depicted in FIG. 8A. FIG. 8D is a top view of FIG. 8C. FIG. 8F is a top view of FIG. 8E. FIG. 8H is a top view of FIG. 8G. FIG. 8J is a top view of FIG. 8I. FIG. 8L is a top view of FIG. 8K. FIG. 8N is a top view of FIG. 8M. FIG. 8P is a top view of FIG. 8O.

As indicated in FIG. 8A and FIG. 8B, a light emitting chip package module 800 of this embodiment is similar to the light emitting chip package module 600 depicted in FIG. 6A, while the difference therebetween lies in that the magnetic device of the light emitting chip package module 800 is one or more coils 630c. Each coil 630c wound a wire around a center axis A has a coil hole H, and each coil hole H has a center axis A. The one or more coils 630c are suitable for being fed with an electric current, and the magnetic field is generated by the one or more coils 630c when the electric current is applied. In this embodiment, the magnetic field can be changed by adjusting the magnitude of the electric current flowing into the one or more coils 630c, and the light emitting efficiency of the light emitting chip in the light emitting chip package structure 620 can be further regulated.

In FIGS. 8A and 8B, the magnetic device of the light emitting chip package module 800 refers to plural coils 630c, for example, two coils 630c. The light emitting chip package structure 620 can be surrounded by these coils 630c and located substantially in an extending direction of the center axis A of these coils 630c shown in FIG. 8A and FIG. 8B. The center axis A is substantially parallel to the surface 612 of the substrate 610.

Figure 8C:
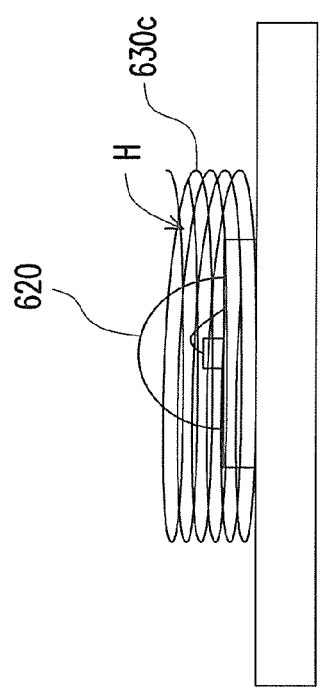

In one embodiment of the disclosure, the magnetic device of the light emitting chip package module 800 refers to single coils 630c as shown as FIG. 8C and FIG. 8D. In FIG. 8C and FIG. 8D, the light emitting chip package structure 620 can be located in the coil holes H of the coils 630c, as indicated in FIG. 8C and FIG. 8D.

In another embodiment of the disclosure, there can be a plurality of the light emitting chip package structures 620, and at least one coil 630c can be located at the sides of the light emitting chip package structures 620, as indicated in FIG. 8E and FIG. 8F. In detail, The light emitting chip package structures 620 can be located in proximity to the coils 630c, preferably located substantially in the extending direction of the center axis A of the coil 630c. The center axis A is substantially parallel to the surface 612 of the substrate 610. (shown in FIG. 8E and FIG. 8F). Besides, the light emitting chip package structure 620 can be also located in the coil hole H of one coil 630c, likely shown in FIG. 8G and FIG. 8H.

In FIG. 8I and FIG. 8J, there is only one light emitting chip package structure 620 and a plurality of the coils 630c, for example 12 coils 630c, these coils 630c can be located around the light emitting chip package structure 620, and the light emitting chip package structure 620 can be located in proximity to the coils 630c, preferably located substantially in the extending direction of the center axis A of these coils 630c. Likely, the center axis A is substantially parallel to the surface 612 of the substrate 610. (shown in FIG. 8I and FIG. 8J). In another embodiment of the disclosure, at least two coils 630c can be stacked to one another, and the coil holes H of the coils 630c are connected together, as indicated in FIG. 8K and FIG. 8L. Here, the light emitting chip package structure 620 is located in the coil holes H (shown in FIG. 8K and FIG. 8L).

In case that there are a plurality of the light emitting chip package structures 620 and the coils 630c, the coils 630c can be arranged around the light emitting chip package structures 620, and the light emitting chip package structures 620 are located in proximity to the coils 630c, preferably located substantially in the extending direction of the center axis A of the corresponding coils 630c. (shown in FIG. 8M and FIG. 8N) Likely, the center axis A is substantially parallel to the surface 612 of the substrate 610. Similarly, at least two coils 630c could be stacked to one another, and the coil holes H of these coils 630c are connected together. Here, at least two light emitting chip package structures 620 can be located in the coil holes H (shown in FIG. 8O and FIG. 8P).

FIG. 9A is a cross-sectional view illustrating a light emitting chip package module according to an embodiment of the disclosure. FIG. 9B is a top view of FIG. 9A. FIG. 9C and FIG. 9E illustrate variations of the light emitting chip package module depicted in FIG. 9A. FIG. 9D is a top view of FIG. 9C. FIG. 9F is a top view of FIG. 9E.

As indicated in FIG. 9A and FIG. 9B, a light emitting chip package module 900 of this embodiment is similar to the light emitting chip package module 600 depicted in FIG. 6A, while the difference therebetween lies in that the light emitting chip package module 900 has at least a conductive wire 910, the substrates 610, the light emitting chip package structures 620, and the magnetic devices 630.

Each of the light emitting chip package structures 620 and each of the magnetic devices 630 are located on the corresponding one of the substrates 610, and the relative position of the light emitting chip package structures 620, the magnetic devices 630, and the substrates 610 is the same as the relative position of those in FIG. 6A~FIG. 6I and FIG. 7A~FIG. 7G. Therefore, no further description is given herein. The substrates 610 of this embodiment are electrically connected in series or in parallel through the at least a conductive wire 910.

The magnetic devices 630 can refer to a plurality of the coils 630c, and each of the coils 630c can be located around the corresponding one of the light emitting chip package structures 620 (shown in FIG. 8A, FIG. 8E, FIG. 8I, FIG. 8M, FIG. 9C and FIG. 9D). The center axis A of the coils 630c is substantially parallel to the surface 612 of the substrate 610. In an alternative, each of the light emitting chip package structures 620 can be located in the coil hole H of the corresponding one of the coils 630c (shown in FIG. 8C, FIG. 8G, FIG. 8K, FIG. 8O, FIG. 9E and FIG. 9F).

Figure 10C:
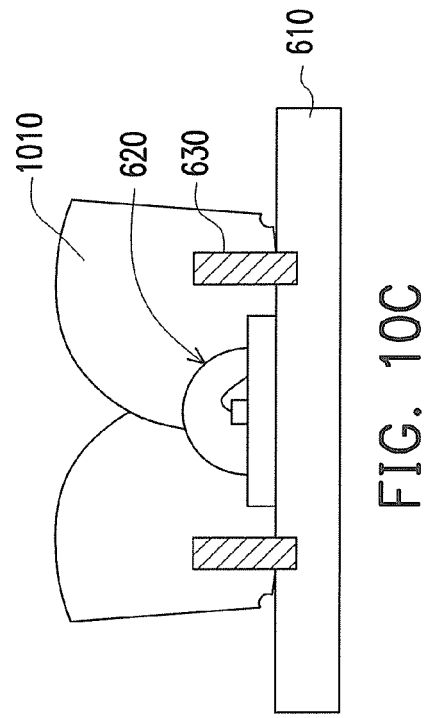
FIG. 10C illustrates a variation of the light emitting chip package module depicted in FIG. 10A.
Figure 10A:
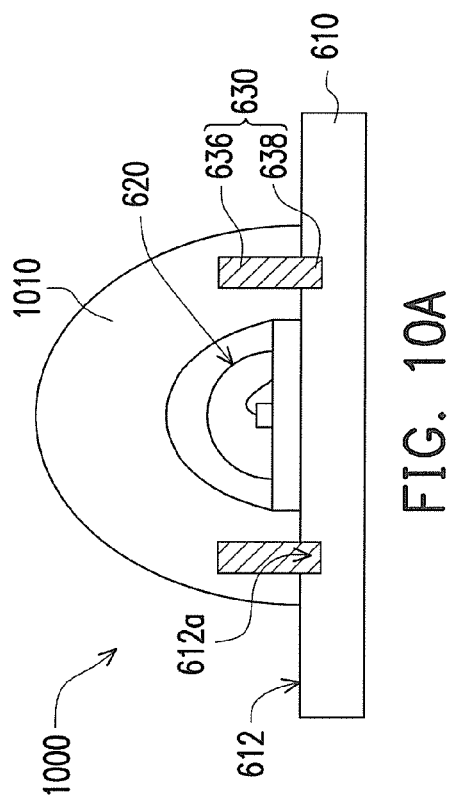
FIG. 10A is a cross-sectional view illustrating a light emitting chip package module according to an embodiment of the disclosure.
Figure 10B:
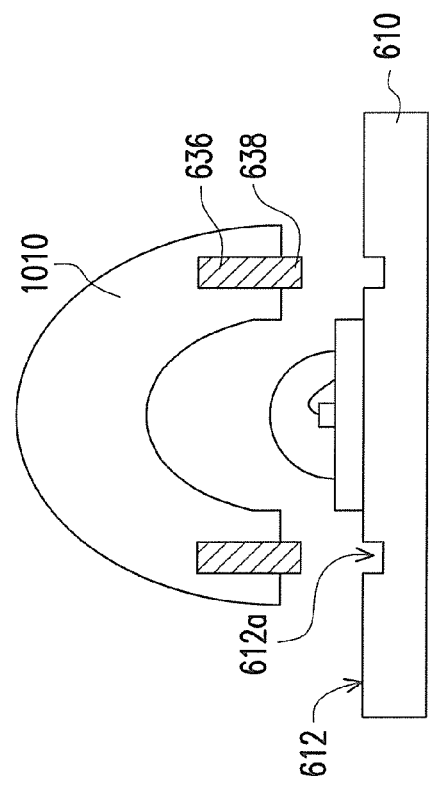
FIG. 10B is an exploded view illustrating the light emitting chip package module depicted in FIG. 10A.

FIG. 10A is a cross-sectional view illustrating a light emitting chip package module according to an embodiment of the disclosure. FIG. 10B is an exploded view illustrating the light emitting chip package module depicted in FIG. 10A. FIG. 10C illustrates a variation of the light emitting chip package module depicted in FIG. 10A.

As indicated in FIG. 10A and FIG. 10B, a light emitting chip package module 1000 of this embodiment is similar to a light emitting chip package module 600b depicted in FIG. 6D, while the difference therebetween lies in that the light emitting chip package module 1000 further includes a lens device 1010. The lens device 1010 is disposed on the substrate 610 and covers the light emitting chip package structure 620, and the magnetic device 630 having a first portion 636 and a second portion 638. The first portion 636 is inlaid into the lens device 1010, and the second portion 638 is inlaid into the substrate 610.

Specifically, in this embodiment, the first portion 636 is connected to the lens device 1010 and inserted into a groove 612a of the surface 612 of the substrate 610, so as to place the lens device 1010 onto the surface 612 of the substrate 610. The lens device 1010 can adjust the type of the light output from the light emitting chip package module 1000, such that the light output by the light emitting chip package module 1000 is collimated, dispersed, or focused at a certain region. According to this embodiment, the lens device 1010 can be a convex lens (shown in FIG. 10A), a concave lens (shown in FIG. 10C), or any other lens suitable for adjusting the type of the light output by the light emitting chip package module 1000.

FIG. 11A is a cross-sectional view illustrating a light emitting chip package module according to an embodiment of the disclosure. FIG. 11B illustrates a variation of the light emitting chip package module depicted in FIG. 11A.

As indicated in FIG. 11A, a light emitting chip package module 1100 of this embodiment is similar to a light emitting chip package module 600a depicted in FIG. 6C, while the difference therebetween lies in that the light emitting chip package module 1100 has a plurality of light emitting chip package structures 620, and the magnetic device 630 has a plurality of openings 632 exposing a portion of the substrate 610. The light emitting chip package structures are respectively disposed in the openings 632 of the magnetic device 630.

An inner wall of each of the openings 632 is an inclined plane 634, and each of the inclined planes 634 faces toward the top of the corresponding one of the light emitting chip package structures 620. In addition, an optical film layer 1110 can be selectively formed on some or all of the inclined planes 634. The optical film layer 1110 can be a reflective layer or a light absorbing layer. A material of the reflective layer includes metal with great reflectivity, such as silver or the like.

According to this embodiment, the magnetic device 630 has the inclined planes 634, while the magnetic device 630 in other embodiments can have cambered surfaces or surfaces in other shapes, such that the light output by the light emitting chip package module 1100 is collimated, dispersed, or focused at a certain region.

Moreover, a plurality of lens devices 1120 can be selectively disposed on the magnetic device 630, and the lens devices 1120 respectively cover the openings 632 (shown in FIG. 11B), such that the light output by the light emitting chip package module 1100a is collimated, dispersed, or focused at a certain region.

FIG. 12A is a cross-sectional view illustrating a light emitting chip package module according to an embodiment of the disclosure. FIG. 12B illustrates a variation of the light emitting chip package module depicted in FIG. 12A.

As indicated in FIG. 12A, a light emitting chip package module 1200 of this embodiment is similar to the light emitting chip package module 600a depicted in FIG. 6C, while the difference therebetween lies in that the light emitting chip package module 1200 further includes a reflective device 1210 which is a component having a surface on which a reflective layer is coated, for example. A material of the reflective layer is, for example, metal, and a material of the component is, for example, plastic.

The reflective device 1210 is disposed on the surface 612 and has a substantially cambered shape. A cavity C is formed between the reflective device 1210 and the substrate 610, and the cavity C has an opening C1. The light emitting chip package structure 620 is located in the cavity C. The reflective device 1210 has a cambered surface 1212 facing the light emitting chip package structure 620 to reflect light emitted by the light emitting chip 624 and irradiate the light toward the opening C1.

Besides, a lens device 1220 can be disposed on the opening C1 (shown in FIG. 12B), such that the light output by the light emitting chip package module 1200a is collimated, dispersed, or focused at a certain region.

FIG. 13A is a cross-sectional view illustrating a light emitting chip package module according to an embodiment of the disclosure. FIG. 13B illustrates a variation of the light emitting chip package module depicted in FIG. 13A.

As shown in FIG. 13A, a light emitting chip package module 1300 of this embodiment is similar to the light emitting chip package module 600 depicted in FIG. 6A, while the difference therebetween lies in that the magnetic device 630 of the light emitting chip package module 1300 has a substantially cambered shape, and a cavity C having an opening C1 is formed between the magnetic device 630 and the substrate 610. The light emitting chip package structure 620 is located in the cavity C. The magnetic device 630 has a cambered surface S facing the light emitting chip package structure 620 to reflect light emitted by the light emitting chip 624 and emit the light toward the opening C1. In this embodiment, an optical film layer 1310 can be disposed on the cambered surface S, and the optical film layer 1310 is a reflective layer or a light absorbing layer.

Besides, a lens device 1320 can be selectively disposed on the opening C1, such that the light output by the light emitting chip package module 1300a is collimated, dispersed, or focused at a certain region (shown in FIG. 13B).

FIG. 14A is a cross-sectional view illustrating a light emitting chip package module according to an embodiment of the disclosure. FIG. 14B illustrates a variation of the light emitting chip package module depicted in FIG. 14A.

As indicated in FIG. 14A, a light emitting chip package module 1400 of this embodiment is similar to the light emitting chip package module 600 depicted in FIG. 6A, while the difference therebetween lies in that the light emitting chip package module 1400 further has a heat conductive and dissipating device 1410, the substrates 610, the light emitting chip package structures 620, and the magnetic devices 630. The magnetic devices 630 are disposed on a surface 1412 of the heat conductive and dissipating device 1410. Besides, the magnetic devices 630 surround the substrates 610 and the light emitting chip package structures 620 disposed on the substrates 610.

The heat conductive and dissipating device 1410 includes a heat conductive portion 1414 and a heat dissipating portion 1416. The heat conductive portion 1414 can conduct heat generated by the light emitting chips 624 to the heat dissipating portion 1416, and the heat dissipating portion 1416 can conduct the heat to external surroundings. A material of the heat conductive portion 1414 can be the same as or different from a material of the heat dissipating portion 1416. The material of the heat conductive portion 1414 is characterized by superior thermal conductivity, such as aluminum, copper, graphite, diamond, ceramics, or a composite material. Alternatively, the heat conductive portion 1414 can also be an electro-thermal crystal apparatus with the property of active heat dissipation. The heat dissipating portion 1416 is, for example, a metal fin with (in FIG. 14B) or without (in FIG. 14A) one or more fans 1420.

FIG. 15A is a cross-sectional view illustrating a light emitting chip package module according to an embodiment of the disclosure. FIG. 15B illustrates a variation of the light emitting chip package module depicted in FIG. 15A.

As indicated in FIG. 15A, a light emitting chip package module 1500 of this embodiment is similar to the light emitting chip package module 1400 depicted in FIG. 14A, while the difference therebetween lies in that the magnetic devices 630 of the light emitting chip package module 1500 are inlaid into the heat conductive and dissipating device 1410, and a surface 1412 exposes a portion of the magnetic devices 630. The light emitting chip package module 1500 has a substrate 610 disposed on the surface 1412 and covering the magnetic devices 630. The light emitting chip package structures 620 are disposed on the substrate 610. The magnetic devices 630 can be located around or right below the light emitting chip package structures 620.

The heat conductive and dissipating device 1410 of the light emitting chip package module 1500 is the same as that of the light emitting chip package module 1400, and the heat dissipating portion 1416 is, for example, a metal fin with (in FIG. 15B) or without (in FIG. 15A) one or more fans 1420.

FIG. 16A is a cross-sectional view illustrating a light emitting chip package module according to an embodiment of the disclosure. FIG. 16B illustrates variations of the light emitting chip package module depicted in FIG. 16A.

As indicated in FIG. 16A, a light emitting chip package module 1600 of this embodiment is similar to the light emitting chip package module 1400a depicted in FIG. 14B, while the difference therebetween lies in that the magnetic devices 630 of the light emitting chip package module 1600 are in close proximity to a central region of radially-arranged fan blades 1422 of a fan 1420. In particular, the magnetic devices 630 of this embodiment are stators of a motor of the fan 1420, and the magnetic devices 630 can apply a magnetic field to the light emitting chips 624 of the light emitting chip package structures 620, so as to improve the light emitting efficiency and the light emitting uniformity of the light emitting chips 624. Besides, the magnetic devices 630 can also be disposed in a peripheral region of the radially-arranged fan blades 1422 of the fan 1420 (shown in FIG. 16B).

Additionally, as shown in FIG. 16C, each of the magnetic devices 630 can have a first portion A and a second portion B. The first portion A is disposed on the surface 1412 of the heat conductive and dissipating device 1410, and the second portion B serving as the stator of the motor of the fan 1420 is in close proximity to the central region of the radially-arranged fan blades 1422 of the fan 1420. Namely, in this embodiment, the magnetic field applied to the light emitting chips 624 is increased because both the magnetic field generated by the second portion B and the magnetic field generated by the first portion A are applied. Thereby, the light emitting efficiency and the light emitting uniformity of the light emitting chips 624 can be improved. Besides, the second portion B can also be disposed in a peripheral region of the radially-arranged fan blades 1422 of the fan 1420 (shown in FIG. 16D).

Figure 17:
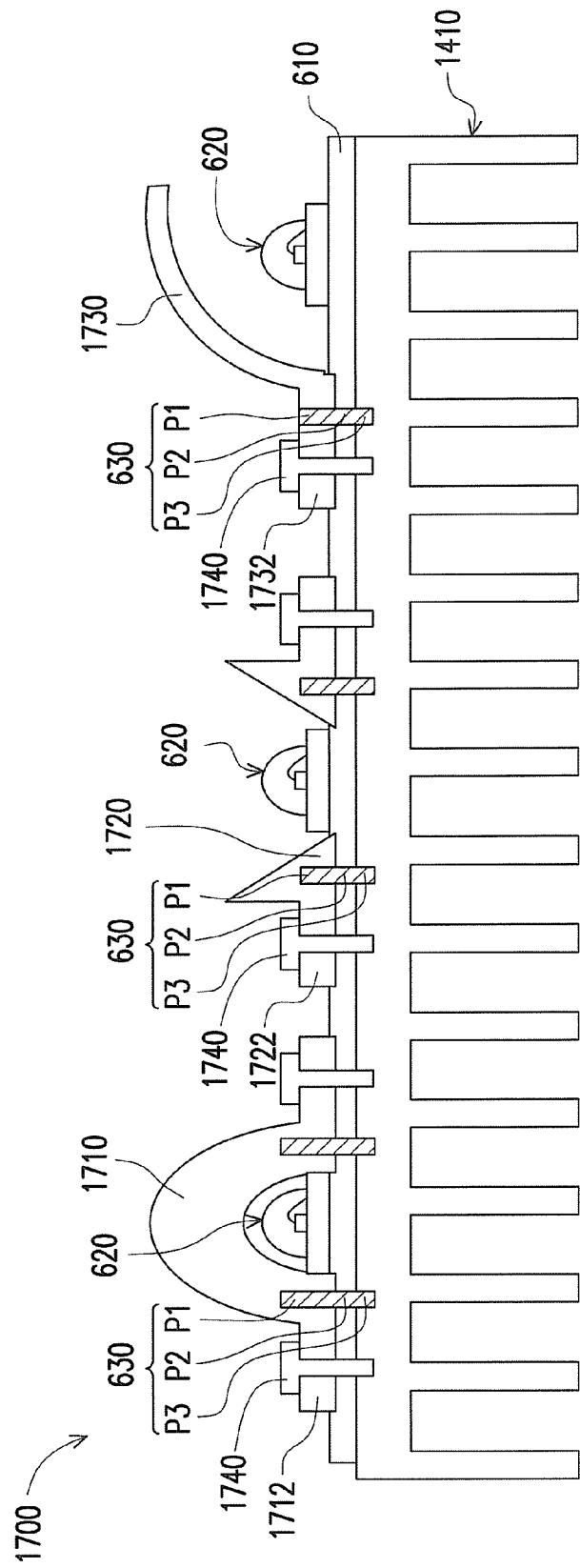
FIG. 17 is a cross-sectional view illustrating a light emitting chip package module according to an embodiment of the disclosure.

FIG. 17 is a cross-sectional view illustrating a light emitting chip package module according to an embodiment of the disclosure.

As indicated in FIG. 17, a light emitting chip package module 1700 of this embodiment is similar to the light emitting chip package module 1500 depicted in FIG. 15A, while the difference therebetween lies in that the light emitting chip package module 1700 further includes a plurality of fixing members 1740 and a plurality of optical devices 1710, 1720, and 1730.

The optical devices 1710, 1720, and 1730 are respectively disposed on a path of light emitted by the light emitting chip package structures 620, so as to change said path of light. The optical devices 1710, 1720, and 1730 individually have a plurality of extending portions 1712, 1722, and 1732 respectively extending away from a direction of one of the corresponding light emitting chip package structures.

Each of the magnetic devices 630 has a first portion P1, a second portion P2, and a third portion P3 that are connected in sequence. The first portion P1 is inlaid into the corresponding optical device 1710, 1720, or 1730. The second portion P2 penetrates the substrate 610. The third portion P3 is inlaid into the heat conductive and dissipating device 1410. The fixing members 1740 respectively penetrate the substrate 610 and the extending portions 1712, 1722, and 1732. Besides, the fixing members 1740 are inserted into the heat conductive and dissipating device 1410.

Particularly, the optical device 1710 of this embodiment has a hat shape (similar to the shape of the lens device 1010 depicted in FIG. 10A), the optical device 1720 has a cup shape (similar to the shape of the magnetic device 630 depicted in FIG. 6C), and the optical device 1730 has a substantially cambered shape (similar to the shape of the reflective device 1210 depicted in FIG. 12A).

Figure 18:
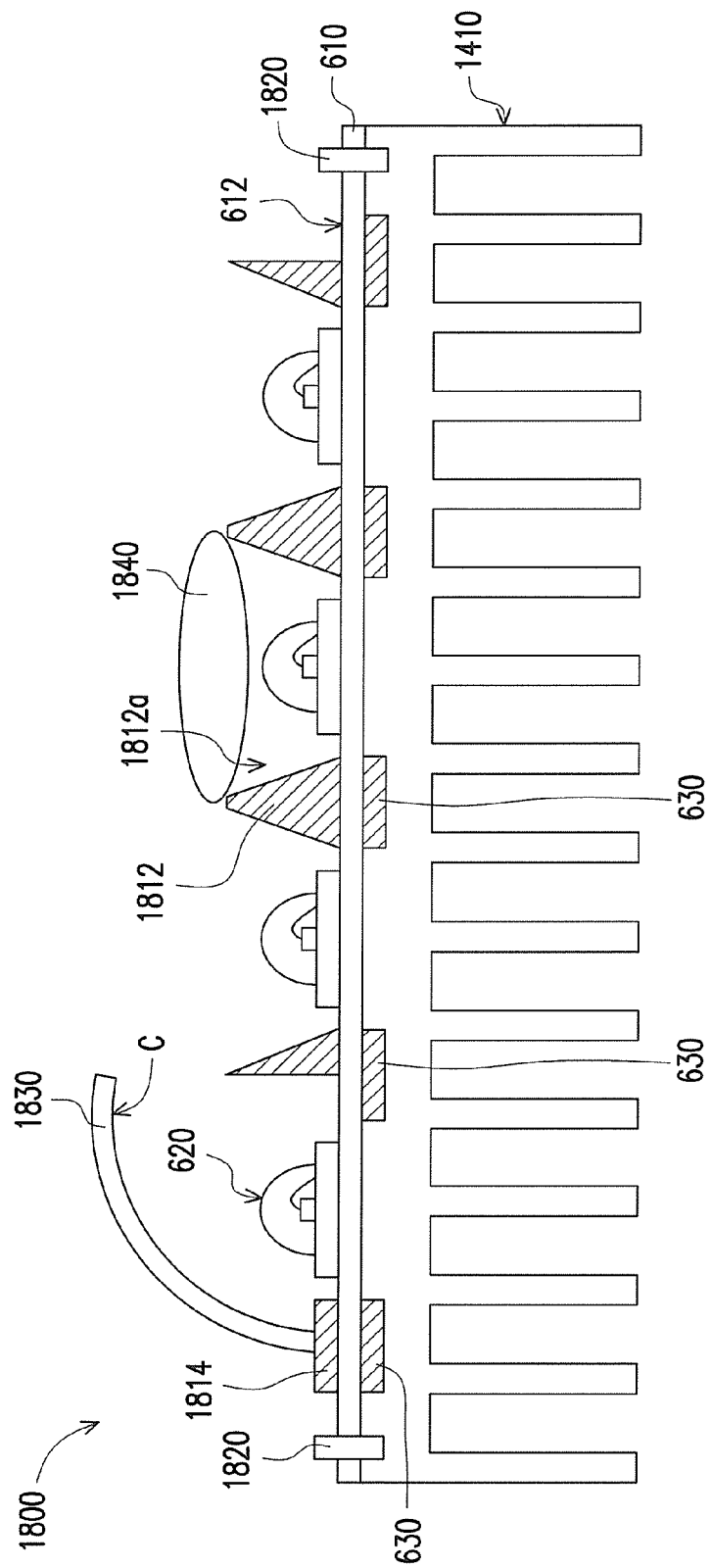
FIG. 18 is a cross-sectional view illustrating a light emitting chip package module according to an embodiment of the disclosure.

FIG. 18 is a cross-sectional view illustrating a light emitting chip package module according to an embodiment of the disclosure.

As indicated in FIG. 18, a light emitting chip package module 1800 of this embodiment is similar to the light emitting chip package module 1500 depicted in FIG. 15A, while the difference therebetween lies in that the light emitting chip package module 1800 further includes a plurality of alignment members 1820 and a plurality of magnetic devices 1812 and 1814.

The alignment members 1820 penetrate the substrate 610 and are inserted into the heat conductive and dissipating device 1410, such that the substrate 610 can be precisely assembled to the heat conductive and dissipating device 1410. The magnetic devices 1812 and 1814 are disposed on the surface 612 of the substrate 610. Besides, the magnetic devices 1812 and 1814 and the magnetic devices 630 inlaid into the heat conductive and dissipating device 1410 are magnetically attracted. The magnetic devices 1812 and 1814 are located above the magnetic devices 630. Through the magnetic attraction between the magnetic devices 1812 and 1814 and the magnetic devices 630, the substrate 610 can be fixed onto the heat conductive and dissipating device 1410.

A shape of the magnetic devices 1812 and arrangement of the magnetic devices 1812 relative to the light emitting chip package structures 620 in this embodiment are similar to the shape of the magnetic devices 630 and the arrangement of the magnetic devices 630 relative to the light emitting chip package structures 620 depicted in FIG. 11A, and therefore no further description is provided herein. The magnetic devices 1814 of this embodiment have a block shape.

Moreover, one or more optical devices 1830 and 1840 can be selectively disposed on the magnetic devices 1812 and 1814. The optical device 1830 is the same as the reflective device 1210 depicted in FIG. 12A, and one of the light emitting chip package structures 620 can be located in a cavity C that is formed between the optical device 1830 and the substrate 610. The optical device 1840 is the same as the lens device 1120 depicted in FIG. 11B. Besides, the optical device 1840 can be disposed on the magnetic devices 1812 and a covers opening 1812a of the magnetic devices 1812.

Figure 19A:
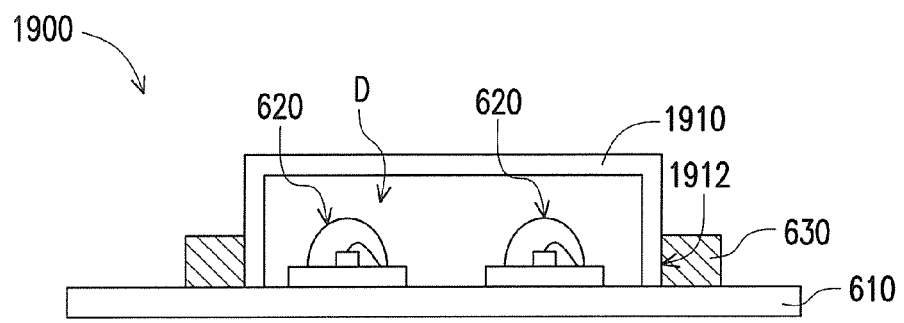
FIG. 19A is a cross-sectional view illustrating a light emitting chip package module according to an embodiment of the disclosure.
Figure 19B:
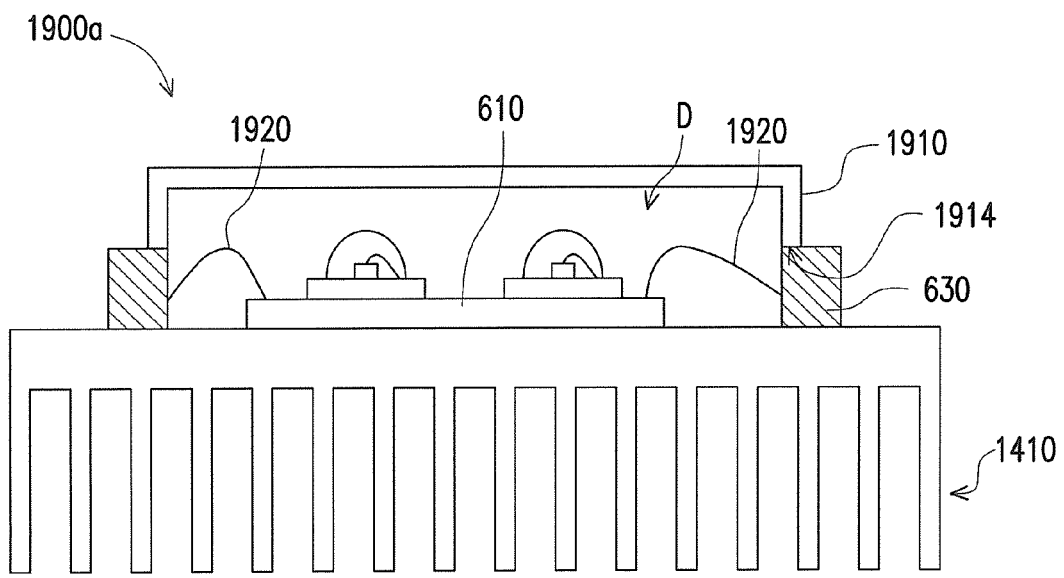
FIG. 19B illustrates variations of the light emitting chip package module depicted in FIG. 19A.

FIG. 19A is a cross-sectional view illustrating a light emitting chip package module according to an embodiment of the disclosure. FIG. 19B illustrates variations of the light emitting chip package module depicted in FIG. 19A.

As indicated in FIG. 19A, a light emitting chip package module 1900 of this embodiment is similar to the light emitting chip package module 700 depicted in FIG. 7A, while the difference therebetween lies in that the light emitting chip package module 1900 further includes a transparent cover 1910. The transparent cover 1910 is disposed on the substrate 610, and an accommodation space D is formed between the transparent cover 1910 and the substrate 610. The light emitting chip package structures 620 are located in the accommodation space D. The magnetic devices 630 are located at an outer edge 1912 of the transparent cover 1910. Besides, the magnetic devices 630 is connected between the transparent cover 1910 and the substrate 610 to seal the accommodation space D and further seal gas and liquid. In this embodiment, the magnetic devices 630 can be connected to the substrate 610 through electric welding.

As indicated in FIG. 19B, a light emitting chip package module 1900a of this embodiment is similar to the light emitting chip package module 1900 depicted in FIG. 19A, while the difference therebetween lies in that the light emitting chip package module 1900a further includes a heat conductive and dissipating device 1410, and the magnetic devices 630 of the light emitting chip package module 1900a are located between a lower edge 1914 of the transparent cover 1910 and the heat conductive and dissipating device 1410. The substrate 610 is located in the accommodation space D.

Besides, the magnetic devices 630 can be conductive devices suitable for being electrically connected to other external electronic devices (not shown). A plurality of conductive wires 1920 can be electrically connected between the magnetic devices 630 and the substrate 610. As such, the substrate 610 can be electrically connected to other external electronic devices through the conductive wires 1920 and the magnetic devices 630. An insulation layer or film (not shown) may be disposed between the magnetic devices 630 and the heat conductive and dissipating device 1410 for preventing short circuit. Alternatively, the heat conductive and dissipating device 1410 could be made of electrically-insulated material such as ceramic.

Figure 20A:
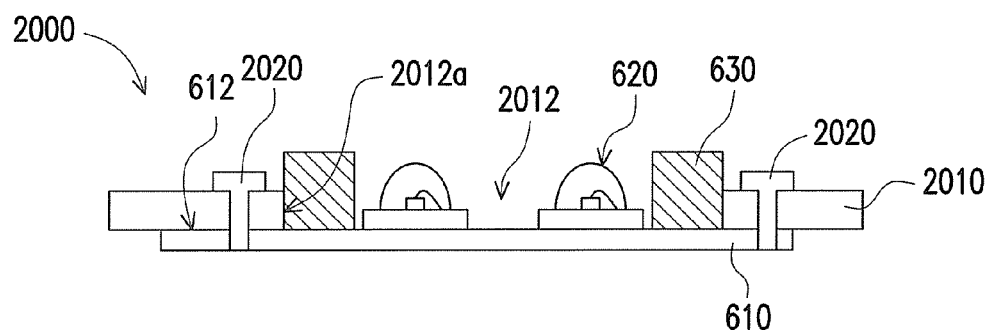
FIG. 20A is a cross-sectional view illustrating a light emitting chip package module according to an embodiment of the disclosure.
Figure 20B:
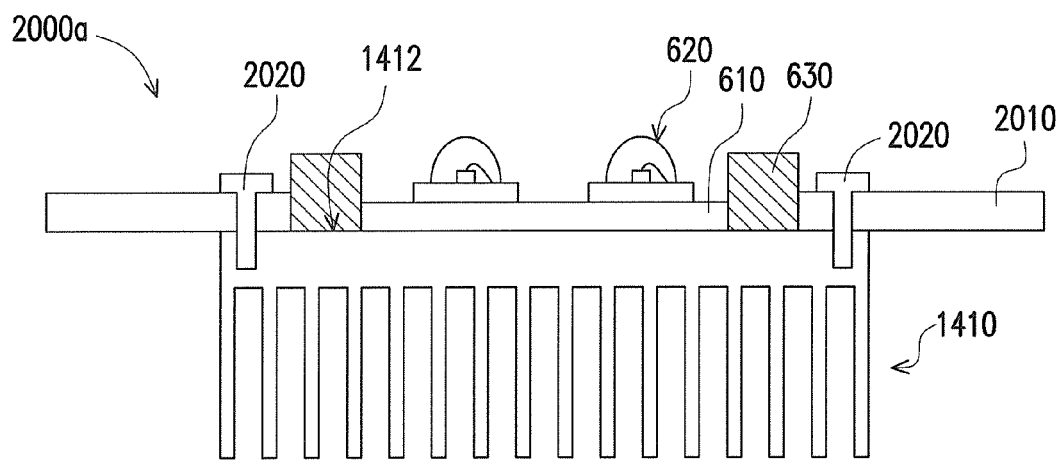
FIG. 20B illustrates variations of the light emitting chip package module depicted in FIG. 20A.

FIG. 20A is a cross-sectional view illustrating a light emitting chip package module according to an embodiment of the disclosure. FIG. 20B illustrates variations of the light emitting chip package module depicted in FIG. 20A.

As indicated in FIG. 20A, a light emitting chip package module 2000 of this embodiment is similar to the light emitting chip package module 700 depicted in FIG. 7A, while the difference therebetween lies in that the light emitting chip package module 2000 further includes an external component 2010 and a plurality of fixing members 2020. According to this embodiment, the magnetic devices 630 are connected to the substrate 610.

The external component 2010 has an opening 2012 and is disposed on the surface 612 of the substrate 610. The opening 2012 exposes the light emitting chip package structures 620, a portion of the substrate 610, and the magnetic devices 630. The magnetic devices 630 come into contact with an inner wall 2012a of the opening 2012. The fixing members 2020 penetrate the external component 2010 and are inserted into the substrate 610.

Note that when the external component 2010 is assembled to the substrate 610, the magnetic devices 630 can be disposed against the inner walls of the opening 2012 for alignment. The fixing members 2020 can fix the external component 2010 onto the substrate 610.

As indicated in FIG. 20B, a light emitting chip package module 2000a of this embodiment is similar to the light emitting chip package module 2000 depicted in FIG. 20A, while the difference therebetween lies in that the light emitting chip package module 2000a further includes a heat conductive and dissipating device 1410. The magnetic devices 630, the substrate 610, and the external component 2010 are all disposed on a surface 1412 of the heat conductive and dissipating device 1410. The fixing members 2020 penetrate the external component 2010 and are inserted into the heat conductive and dissipating device 1410.

Figure 21A:
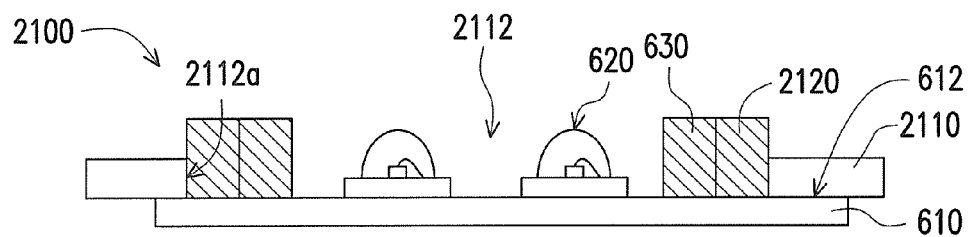
FIG. 21A is a cross-sectional view illustrating a light emitting chip package module according to an embodiment of the disclosure.
Figure 21B:
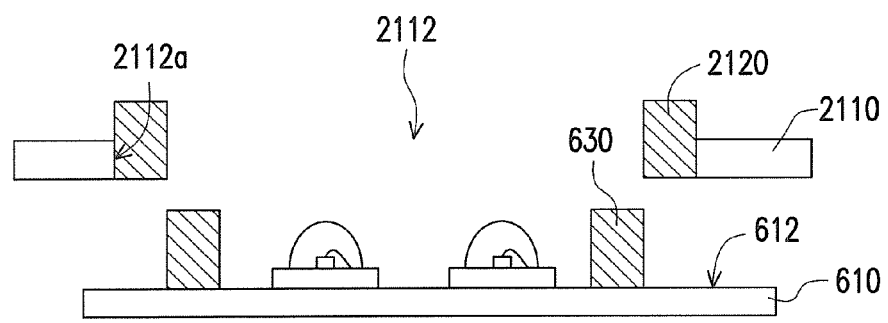
FIG. 21B is an exploded view illustrating the light emitting chip package module depicted in FIG. 21A.
Figure 21C:
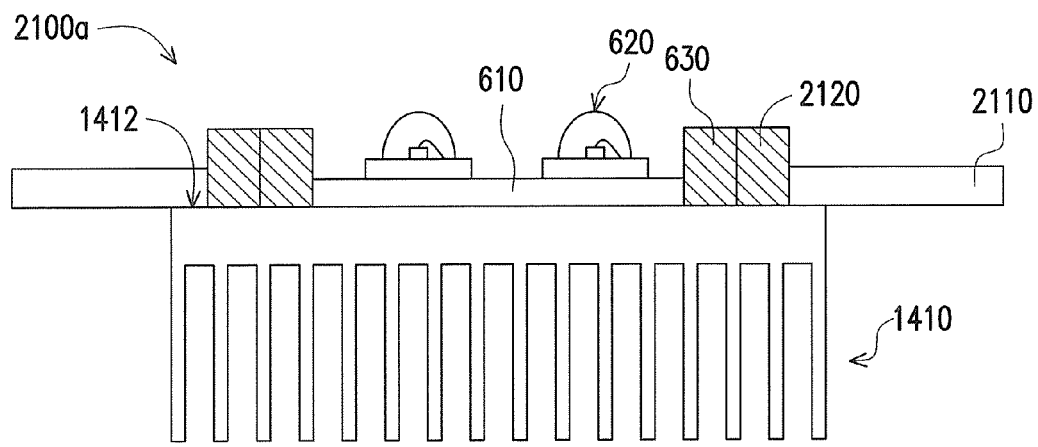
FIG. 21C illustrates a variation of the light emitting chip package module depicted in FIG. 21A.

FIG. 21A is a cross-sectional view illustrating a light emitting chip package module according to an embodiment of the disclosure. FIG. 21B is an exploded view illustrating the light emitting chip package module depicted in FIG. 21A. FIG. 21C illustrates a variation of the light emitting chip package module depicted in FIG. 21A.

As indicated in FIG. 21A and FIG. 21B, a light emitting chip package module 2100 of this embodiment is similar to the light emitting chip package module 700 depicted in FIG. 7A, while the difference therebetween lies in that the light emitting chip package module 2100 further includes an external component 2110 and a magnetic device 2120.

The external component 2110 has an opening 2112, and the magnetic devices 2120 are disposed against an inner wall 2112a of the opening 2112. The magnetic devices 2120 are connected to the external component 2110. The magnetic devices 630 are disposed on the surface 612 of the substrate 610 and connected to the substrate 610. The external component 2110 is disposed on the surface 612 of the substrate 610, and the opening 2112 exposes the light emitting chip package structures 620, a portion of the substrate 610, and the magnetic devices 630. The magnetic devices 630 come into contact with the magnetic device 2120, and the magnetic devices 630 and 2120 are magnetically attracted for alignment purpose.

Note that the external component 2110 and the substrate 610 are aligned and connected by the magnetic attraction between the magnetic device 2120 on the external component 2110 and the magnetic devices 630 on the substrate 610. The shape and the polarity matching of the he magnetic devices 630 and 2120 helps to align the external component 2110 and the substrate 610. The magnetic attraction between the magnetic devices 630 and 2120 could facilitate the alignment and assembling process.

As indicated in FIG. 21C, a light emitting chip package module 2100a of this embodiment is similar to the light emitting chip package module 2100 depicted in FIG. 21A, while the difference therebetween lies in that the light emitting chip package module 2100a further includes a heat conductive and dissipating device 1410, and the substrate 610, the magnetic devices 630 and 2120, and the external component 2110 are all disposed on a surface 1412 of the heat conductive and dissipating device 1410.

FIG. 22A is a cross-sectional view illustrating a light emitting chip package module according to an embodiment of the disclosure. FIG. 22B illustrates a variation of the light emitting chip package module depicted in FIG. 22A.

As indicated in FIG. 22A, a light emitting chip package module 2200 of this embodiment is similar to the light emitting chip package module 1400 depicted in FIG. 14A, while the difference therebetween lies in that the light emitting chip package module 2200 further includes an external component 2210 and a location adjusting device 2220.

The external component 2210 has an opening 2212. The magnetic devices 630 are disposed on an inner wall 2212a of the opening 2212 and connected to the external component 2210. The external component 2210 is disposed on the surface 1412 of the heat conductive and dissipating device 1410, and the opening 2212 exposes the light emitting chip package structures 620 and the substrate 610. A plurality of first grooves 1412a and a second groove 1412b are formed on the surface 1412 of the heat conductive and dissipating device 1410. Inner walls 1412c of the first grooves 1412a have inner threads 1412d.

The location adjusting device 2220 penetrates the external component 2210, and a first end E1 of the location adjusting device 2220 is inserted into one of the first grooves 1412a of the heat conductive and dissipating device 1410. A surface of the first end E1 has an outer thread 2222a, and the inner thread 1412d and the outer thread 2222a are connected. A second end E2 of the magnetic device 630 is inserted into the second groove 1412b. The location adjusting device 2220 is suitable for adjusting a relative position of the light emitting chip 624 and the magnetic devices 630 firmly attached to the external component 2210 by adjusting the depth of the first ends E1 inserted into the first grooves 1412a. Thereby, the intensity of the magnetic field applied by the magnetic devices 630 to the light emitting chip 624 can be adjusted, and the light emitting efficiency of the light emitting chip 624 is further improved.

In addition, the light emitting chip package module 2200a in other embodiments can have no external component 2210 and location adjusting device 2220, while the relative position of the light emitting chip 624 and the magnetic devices 630 can still be adjusted. Specifically, a surface of the second end E2 of each of the magnetic devices 630 in the light emitting chip package module 2200a has an outer thread T1. An inner surface of the second groove 1412b has an inner thread T2. The outer thread T1 and the inner thread T2 are connected. As such, a relative position of the light emitting chip 624 and the magnetic devices 630 can be adjusted by changing a depth of the second end E2 inserted into the second groove 1412b.

FIG. 23A is a cross-sectional view illustrating a light emitting chip package module according to an embodiment of the disclosure. FIG. 23B illustrates a variation of the light emitting chip package module depicted in FIG. 23A.

As indicated in FIG. 23A, a light emitting chip package module 2300 of this embodiment is similar to the light emitting chip package module 700 depicted in FIG. 7A, while the difference therebetween lies in that the light emitting chip package module 2300 includes a circuit device 2310 and a plurality of magnetic devices 630 respectively surrounding the light emitting chip package structures 620. The circuit device 2310 is located on the substrate 610. The circuit device 2310 is, for example, a circuit, an active electronic device (e.g. a chip), or a passive electronic device (e.g. a resistor, a capacitor, and so on).

In this embodiment, the circuit device 2310 can be electrically connected to the light emitting chip package structures 620 or the magnetic devices 630. Thereby, the magnitude of the electric current input to the light emitting chips 624 or the magnetic devices 630 can be controlled by the circuit device 2310, and luminous flux of the light emitting chips 624 or magnetic field intensity caused by the magnetic devices 630 can be adjusted.

As indicated in FIG. 23B, a light emitting chip package module 2300a of this embodiment is similar to the light emitting chip package module 2300 depicted in FIG. 23A, while the difference therebetween lies in that the light emitting chip package module 2300a has a plurality of inductor coils 2320 surrounding the light emitting chip package structures 620. The inductor coils 2320 can serve as the magnetic devices. Namely, a magnetic field can be applied to the light emitting chips 624 by the inductor coils 2320 based on the circuit device described in this embodiment, so as to improve the light emitting efficiency of the light emitting chips 624.

Figure 24A:
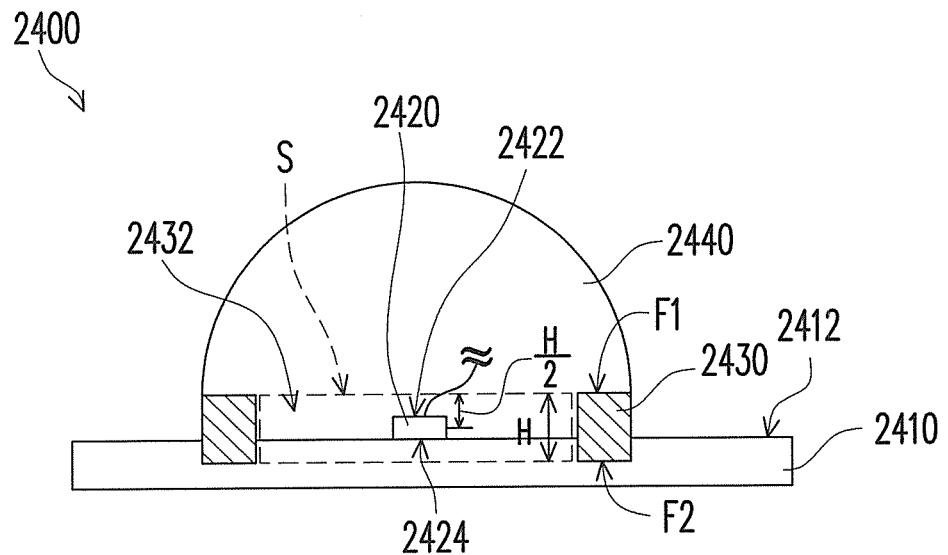
FIG. 24A is a cross-sectional view illustrating a light emitting chip package structure according to an embodiment of the disclosure and taken along a line segment I-I' in FIG. 24B.
Figure 24B:
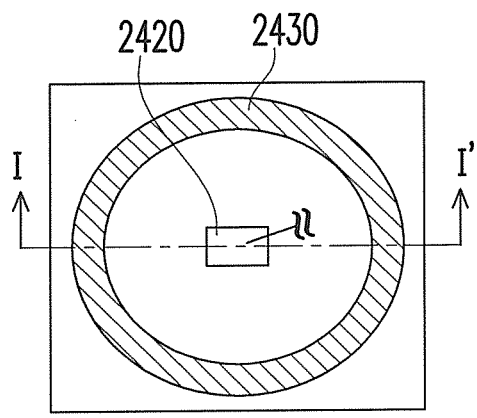
FIG. 24B is a top view of FIG. 24A.
Figure 24C:
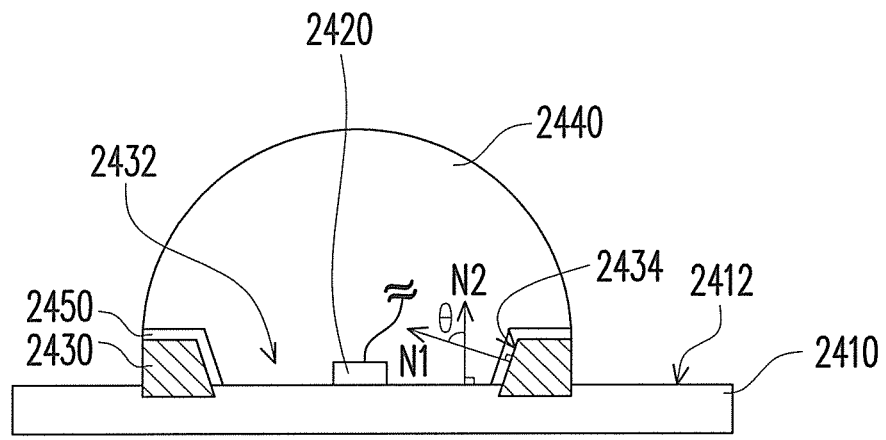
FIG. 24C to FIG. 24M illustrate variations of the light emitting chip package structure depicted in FIG. 24A.
Figure 24D:
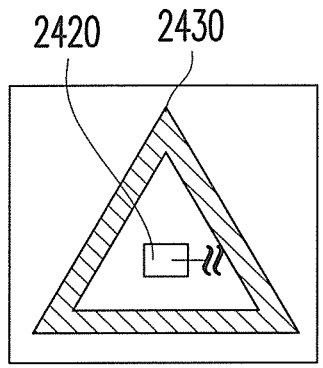
Figure 24E:
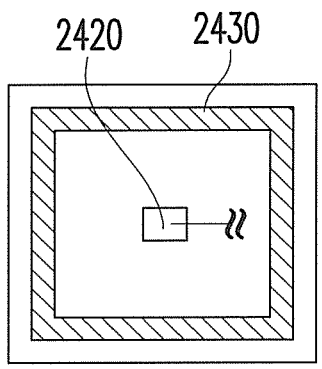
Figure 24F:
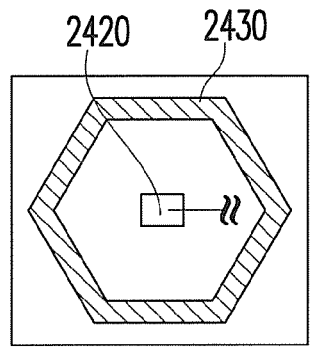
Figure 24G:
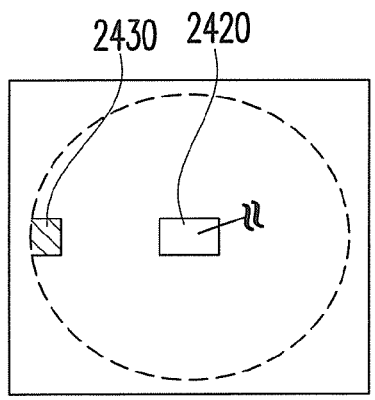
Figure 24H:
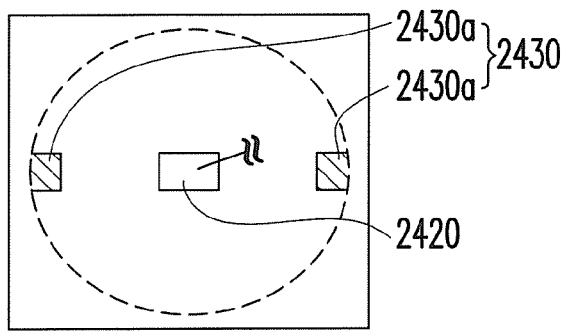

FIG. 24A is a cross-sectional view illustrating a light emitting chip package structure according to an embodiment of the disclosure and taken along a line segment I-I' in FIG. 24B. FIG. 24B is a top view of FIG. 24A. FIG. 24C to FIG. 24M illustrate variations of the light emitting chip package structure depicted in FIG. 24A. Note that the sealant is not depicted in FIG. 24D to FIG. 24M for the purpose of simple illustration.

With reference to FIG. 24A and FIG. 24B, a light emitting chip package structure 2400 of this embodiment includes a carrier 2410, a light emitting chip 2420, a magnetic device 2430, and a sealant 2440. The light emitting chip 2420 is disposed on a surface 2412 of the carrier 2410. The carrier 2410 is, for example, a ceramic substrate, a silicon substrate, an aluminum substrate, a copper substrate, a high thermal conductive substrate, or a circuit board. The magnetic device 2430 is disposed next to the light emitting chip 2420, and a portion of the magnetic device 2430 is inlaid into the carrier 2410.

Note that the magnetic device 2430 of this embodiment is located next to the light emitting chip 2420, and therefore the magnetic device 2430 can apply a magnetic field to the light emitting chip 2420, so as to improve uniformity of electric current distribution in the light emitting chip 2420 during operation of the light emitting chip package structure 2400. As such, the magnetic device 2430 is conducive to improvement of the total light emitting efficiency and light emitting uniformity of the light emitting chip package structure 2400 in this embodiment.

In this embodiment, a space S can be surrounded by the magnetic device 2430. The light emitting chip 2420 is located in the space S and the light emitting chip 2420 is not co-planar with the magnetic device 2430. In specifically, a top surface 2422 of the light emitting chip 2420 is not co-planar with a top surface F1 of the magnetic device 2430. A bottom surface 2424 of the light emitting chip 2420 is not co-planar with a bottom surface F2 of the magnetic device 2430.

The space S has a height H, and a height position of the light emitting chip 2420 in the space S, i.e. a height position of the center of the entire light emitting chip 2420 in the space S, poses an impact on the intensity of the magnetic field applied by the magnetic device 2430 to the light emitting chip 2420. The magnetic field applied by the magnetic device 2430 to the light emitting chip 2420 is changed according to the position of the light emitting chip 2420 in the space S. The light emitting chip 2420 of this embodiment is, for example, substantially located at one to three quarters of the height H of the space S surrounded by the magnetic device 2430. For instance, the light emitting chip 2420 is substantially located at half of the height H of the space S surrounded by the magnetic device 2430. According to this embodiment, the height position of the light emitting chip 2420 in the space S can be adjusted by changing the depth of the magnetic device 2430 inlaid into the carrier 2410.

Particularly, the magnetic device 2430 of this embodiment can have a ring-shaped structure, and the light emitting chip 2420 is located in an opening 2432 of the magnetic device 2430. To allow the magnetic device 2430 to more effectively reflect the light emitted by the light emitting chip 2420, the magnetic device 2430 can have an inclined plane 2434 facing the top of the light emitting chip 2420 (shown in FIG. 24C). An included angle θ between a normal vector N1 of the inclined plane 2434 and a normal vector N2 of the surface 2412 of the carrier 2410 is less than 90 degrees. Besides, a reflective layer 2450 can be additionally disposed on the inclined plane 2434 to reflect the light emitted by the light emitting chip 2420. The sealant 2440 of this embodiment covers the light emitting chip 2420, and the magnetic device 2430 is disposed at an edge of the sealant 2440.

According to this embodiment, the magnetic device 2430 can have a shape of a circular ring. In other embodiments, the magnetic device 2430 can selectively have a shape of a triangular ring (shown in FIG. 24D), a shape of a rectangular ring (shown in FIG. 24E), a shape of a hexagonal ring (shown in FIG. 24F), a shape of a polygonal ring, or a shape of an irregular ring. Moreover, according to other embodiments, the magnetic device 2430 can have a block-shaped structure (shown in FIG. 24G), a plurality of block-shaped structures (shown in FIG. 24H and FIG. 24I), or one or more strip-shaped structures (shown in FIGS. 24J and 24K).

Figure 24I:
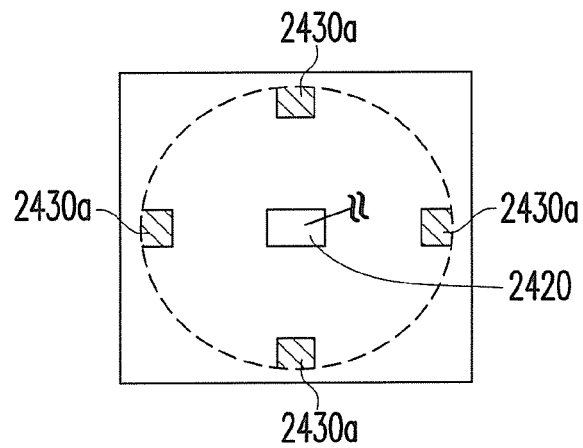
Figure 24J:
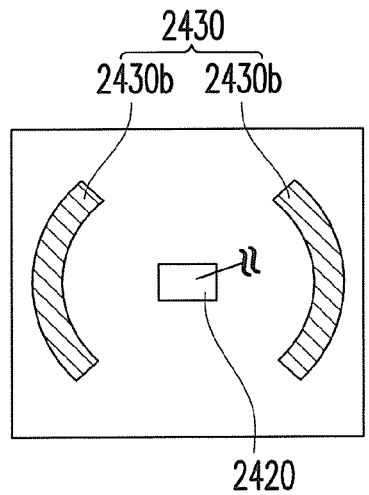
Figure 24K:
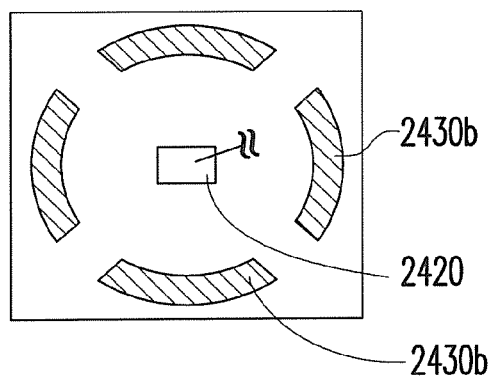

When the magnetic device 2430 has the block-shaped structures 2430a, the block-shaped structures 2430a can be selectively located at respective sides of the light emitting chip 2420 (shown in FIG. 24H) or can selectively surround the light emitting chip 2420 (shown in FIG. 24I). When the magnetic device 2430 has the strip-shaped structures 2430b, the strip-shaped structures 2430b can be selectively located at respective sides of the light emitting chip 2420 (shown in FIG. 24J) or can selectively surround the light emitting chip 2420 (shown in FIG. 24K).

In this embodiment, a material of the magnetic device 2430 includes a magnetic material, e.g. a hard magnetic material. Besides, the magnetic material can also be a ferromagnetic material, such as Rb, Ru, Nd, Fe, Pg, Co, Ni, Mn, Cr, Cu, $Cr_2$, Pt, Sm, Sb, Pt, or an alloy thereof. The magnetic material can also be a ceramic material, such as an oxide of Mn, Fe, Co, Cu, and V, a fluoride of $Cr_2O_3$, CrS, MnS, MnSe, MnTe, Mn, Fe, Co, or Ni, a chloride of V, Cr, Fe, Co, Ni, and Cu, a bromide of Cu, $CrSb$, $MnAs$, $MnBi$, α-Mn, $MnCl_2.4H_2O$, $MnBr_2.4H_2O$, $CuCl_2.2H_2O$, $Co(NH_4)_x(SO_4)_xCl_2.6H_2O$, $FeCo_3$, and $FeCo_3.2MgCO_3$.

Figure 24L:
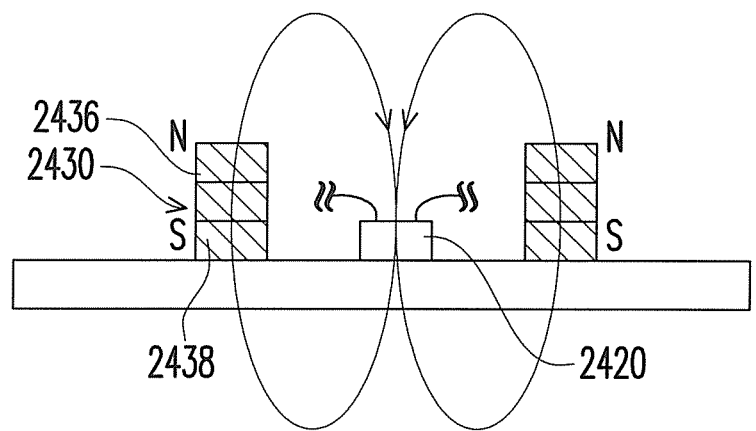
Figure 24M:
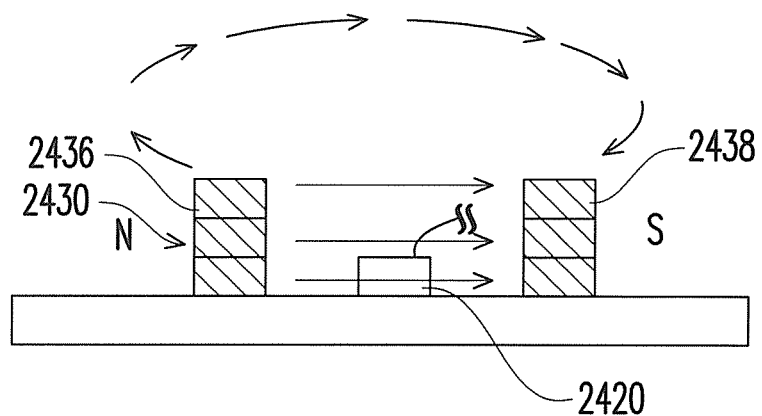

Additionally, in this embodiment, when the N pole 2436 and the S pole 2438 of the magnetic device 2430 are vertically arranged, a near-vertical magnetic field can be applied by the magnetic device 2430 to the light emitting chip 2420 (shown in FIG. 24L). By contrast, when the N pole 2436 and the S pole 2438 of the magnetic device 2430 are horizontally arranged, a near-horizontal magnetic field can be applied by the magnetic device 2430 to the light emitting chip 2420 (shown in FIG. 24M).

Likewise, when the magnetic device is disposed outside the light emitting chip package structure (described in the embodiments shown in FIG. 6A to FIG. 23B), a near-vertical magnetic field or a near-horizontal magnetic field can also be applied by the magnetic device to the light emitting chip of the light emitting chip package structure based on actual demands.

Figure 25A:
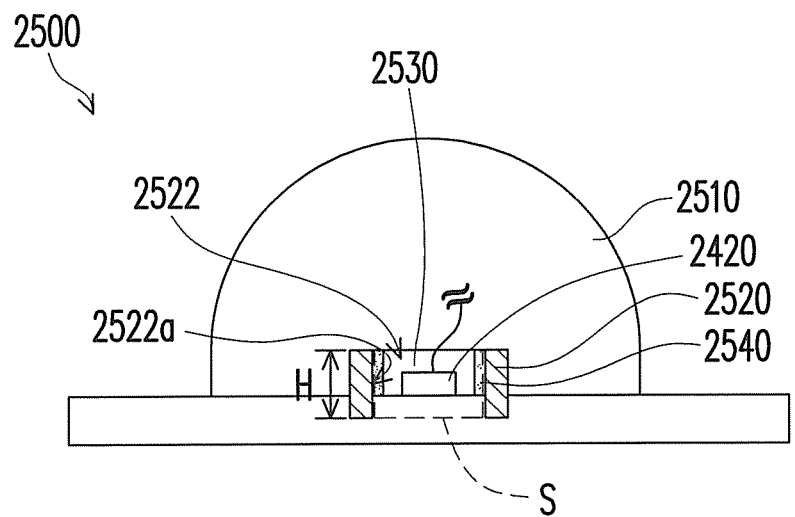
FIG. 25A is a cross-sectional view illustrating a light emitting chip package structure according to an embodiment of the disclosure.
Figure 25B:
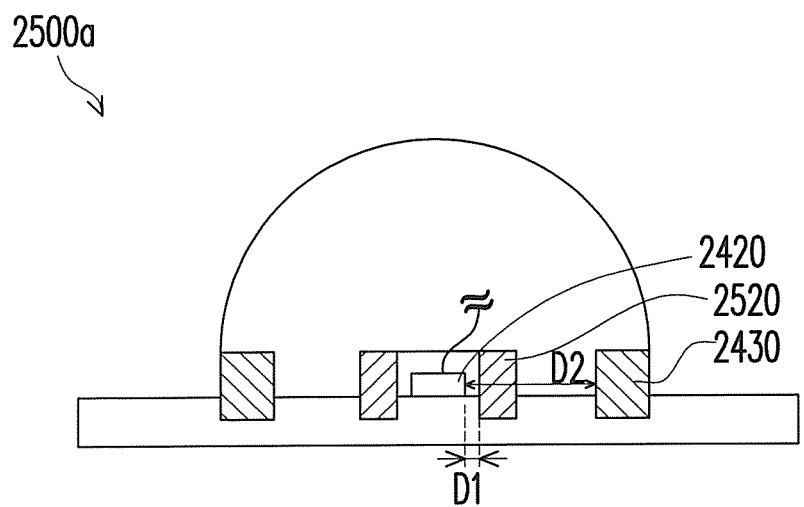
FIG. 25B taken along a line segment II-II' of FIG. 25C illustrates a variation of the light emitting chip package structure depicted in FIG. 25A.
Figure 25C:
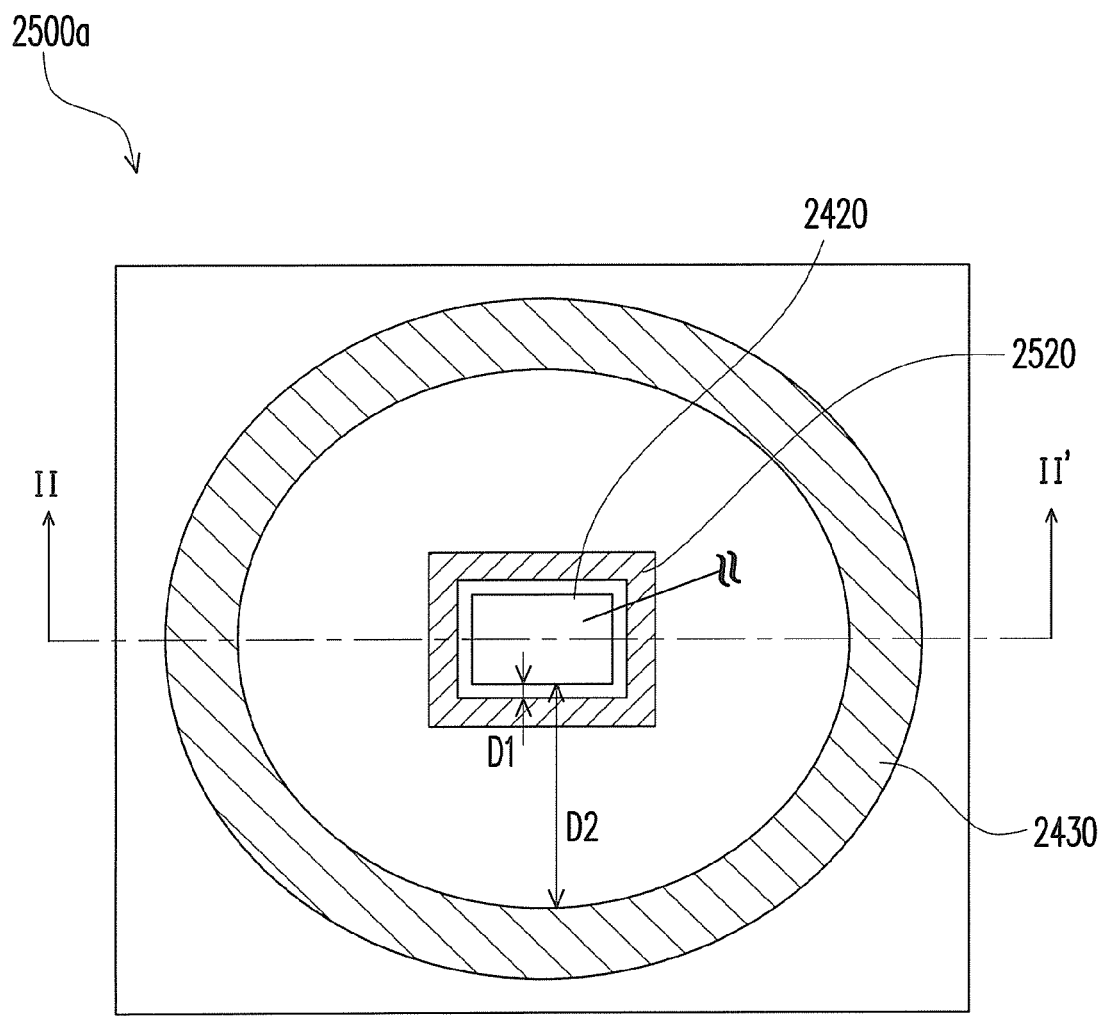
FIG. 25C is a top view illustrating the light emitting chip package structure depicted in FIG. 25B.
Figure 25D:
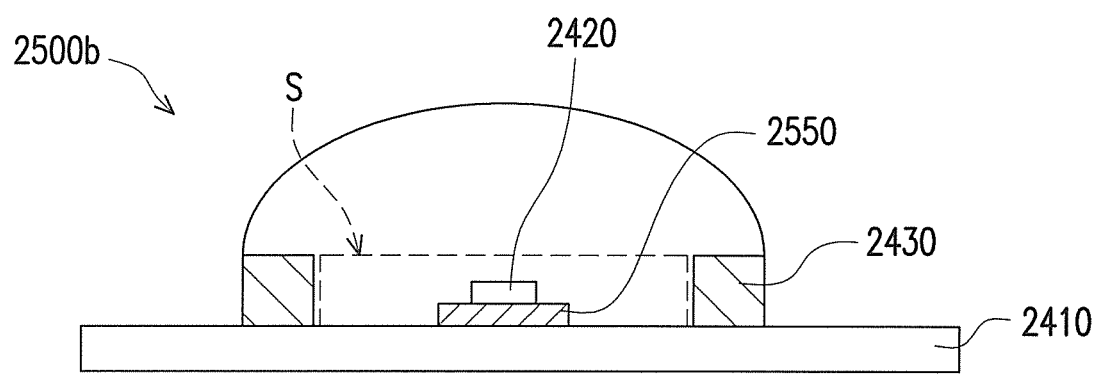
FIG. 25D illustrates another variation of the light emitting chip package structure depicted in FIG. 25A.

FIG. 25A is a cross-sectional view illustrating a light emitting chip package structure according to an embodiment of the disclosure. FIG. 25B taken along a line segment II-II' of FIG. 25C illustrates a variation of the light emitting chip package structure depicted in FIG. 25A. FIG. 25C is a top view illustrating the light emitting chip package structure depicted in FIG. 25B. FIG. 25D illustrates another variation of the light emitting chip package structure depicted in FIG. 25A.

As indicated in FIG. 25A, a light emitting chip package structure 2500 of this embodiment is similar to the light emitting chip package structure 2400 depicted in FIG. 24A, while the difference therebetween lies in that the sealant 2510 of the light emitting chip package structure 2500 entirely covers the magnetic device 2520. In this embodiment, when the magnetic device 2520 has a ring-shaped structure, the light emitting chip 2420 can be disposed in an opening 2522 of the magnetic device 2520, and the opening 2522 can be selectively filled with a fluorescent material 2530 that covers the light emitting chip 2420.

Besides, in this embodiment, an optical film layer 2540 can be additionally formed on an inner wall 2522a of the opening 2522, and the optical film layer 2540 can be a reflective layer or a light absorbing layer. When the optical film layer 2540 is the reflective layer, the reflective layer can reflect the light which is emitted by the light emitting chip 2420 to the inner wall 2522a of the opening 2522, so as to increase a light utilization rate of the light emitting chip 2420. By contrast, when the optical film layer 2540 is the light absorbing layer, the light absorbing layer can absorb the light which is emitted by the light emitting chip 2420 to the inner wall 2522a of the opening 2522, so as to uniformize a light emitting direction of the light emitting chip package structure 2500.

The light emitting chip package structure 2500 can further combine the magnetic device 2430 depicted in FIG. 24A, so as to form a light emitting chip package structure 2500a depicted in FIG. 25B and FIG. 25C. The minimum distance D1 between the magnetic device 2520 and the light emitting chip 2420 in the light emitting chip package structure 2500a can be shorter than the minimum distance D2 between the magnetic device 2430 and the light emitting chip 2420.

In addition, as indicated in FIG. 25D, a light emitting chip package structure 2500b of this embodiment is similar to the light emitting chip package structure 2500 depicted in FIG. 25A, while the difference therebetween lies in that a protrusion 2550 is disposed between the light emitting chip 2420 and the carrier 2410 in this embodiment, so as to adjust the height position of the light emitting chip 2420 in the space S. As such, the magnetic device 2430 can be inlaid or not inlaid into the carrier 2410.

Figure 26A:
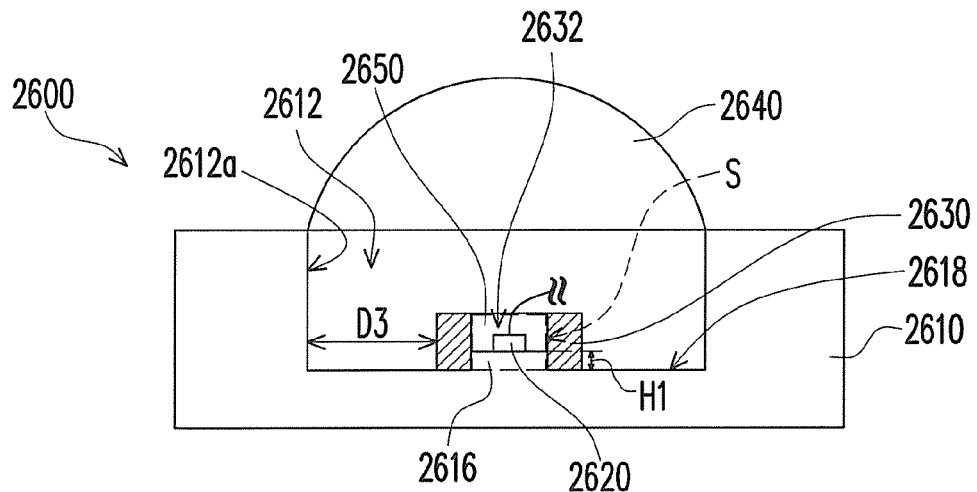
FIG. 26A is a cross-sectional view illustrating a light emitting chip package structure according to an embodiment of the disclosure.
Figure 26B:
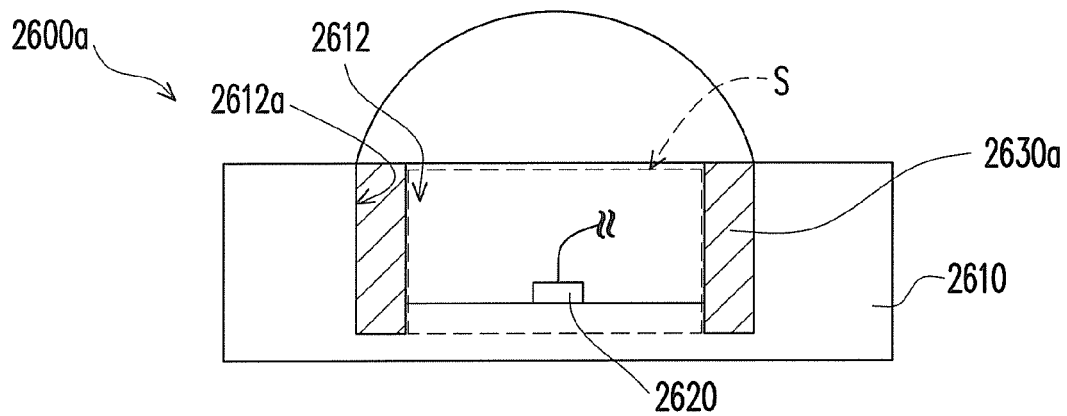
FIG. 26B to FIG. 26D illustrate three variations of the light emitting chip package structure depicted in FIG. 26A.
Figure 26C:
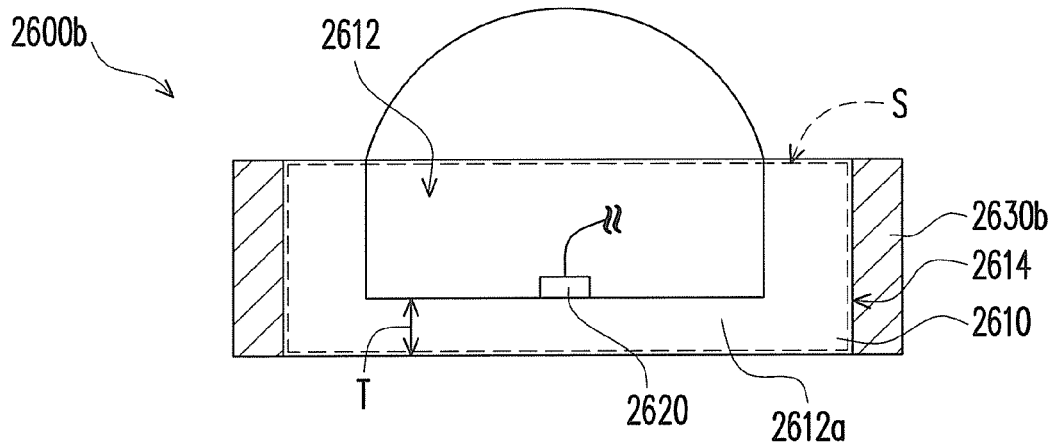
Figure 26D:
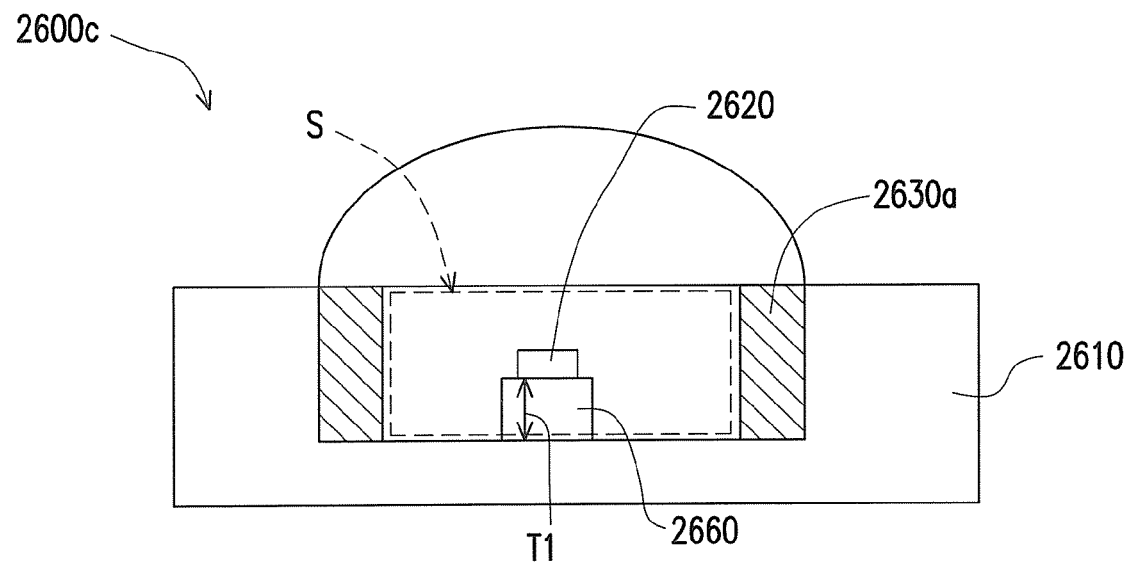

FIG. 26A is a cross-sectional view illustrating a light emitting chip package structure according to an embodiment of the disclosure. FIG. 26B to FIG. 26D illustrate three variations of the light emitting chip package structure depicted in FIG. 26A.

With reference to FIG. 26A, a light emitting chip package structure 2600 of this embodiment includes a carrier 2610, a light emitting chip 2620, a magnetic device 2630, and a sealant 2640. The carrier 2610 has a board-shape structure, for example. The carrier 2610 can have a groove 2612. In this embodiment, the carrier 2610 can have a protrusion 2616 protruding from a bottom surface 2618 of the groove 2612.

The light emitting chip 2620 is disposed on the protrusion 2616 in the groove 2612. The magnetic device 2630 can be selectively disposed on the carrier 2610 and located in the groove 2612. The magnetic device 2630 is located around the light emitting chip 2620 and the protrusion 2616. A distance D3 exists between an inner wall 2612*a* of the groove 2612 and the magnetic device 2630.

Note that the height position of the light emitting chip 2620 in a space S surrounded by the magnetic device 2630 can be adjusted by changing a height H1 of the protrusion 2616.

The magnetic device 2630 of this embodiment has a ring-shaped structure, for example, and the light emitting chip 2620 is located in an opening 2632 of the magnetic device 2630. Besides, to adjust the color of the light emitted by the light emitting chip package structure 2600, the opening 2632 of the magnetic device 2630 can be filled with a fluorescent material 2650 that is disposed at the emission path of the light emitting chip 2620. The sealant 2640 can be formed on the fluorescent material 2650 and can serve as an optical lens.

In other embodiments, an inner wall (not shown) of the groove 2612 can be an inclined plane facing the top of the light emitting chip 2620. Thereby, the light emitted by the light emitting chip 2620 can be reflected by the inclined plane and can move forward at approximately the same direction, so as to improve light directionality and light emitting intensity of the light emitting chip package structure. That is to say, when there is no magnetic device attached to the inner wall of the groove, the inner wall of the groove can be additionally an inclined plane facing the top of the light emitting chip.

As indicated in FIG. 26B, a light emitting chip package structure 2600*a* of this embodiment is similar to the light emitting chip package structure 2600 depicted in FIG. 26A, while the difference therebetween lies in that a magnetic device 2630*a* of the light emitting chip package structure 2600*a* is adhered onto the inner wall 2612*a* of the groove 2612 and partially inlaid into the carrier 2610.

Note that the height position of the light emitting chip 2620 in the space S surrounded by the magnetic device 2630*a* can be adjusted by changing the depth of the magnetic device 2630*a* inlaid into the carrier 2610.

In other embodiments, the magnetic device 2630*a* can have an inclined plane (not shown) facing the top of the light emitting chip 2620. Thereby, the light emitted by the light emitting chip 2620 can be reflected by the inclined plane and can move forward at approximately the same direction, so as to improve light directionality and light emitting intensity of the light emitting chip package structure. Namely, when the light emitting chip and the magnetic device are both disposed in the groove of the carrier, and the magnetic device is adhered to the inner wall of the groove, the magnetic device can have an inclined plane facing the top of the light emitting chip.

As indicated in FIG. 26C, a light emitting chip package structure 2600*b* of this embodiment is similar to the light emitting chip package structure 2600 depicted in FIG. 26A, while the difference therebetween lies in that a magnetic device 2630*b* of the light emitting chip package structure 2600*b* is disposed on a side wall 2614 of the carrier 2610, and there can be no protrusion 2616 in the carrier 2610.

Note that the height position of the light emitting chip 2620 in a space S surrounded by the magnetic device 2360*b* can be adjusted by changing a thickness T of a bottom portion 2612*a* of the groove 2612.

As indicated in FIG. 26D, a light emitting chip package structure 2600*c* of this embodiment is similar to the light emitting chip package structure 2600*a* depicted in FIG. 26B, while the difference therebetween lies in that the light emitting chip package structure 2600*c* further includes a protrusion 2660 located between the light emitting chip 2620 and the carrier 2610. Thereby, the height position of the light emitting chip 2620 in a space S surrounded by the magnetic device 2630*a* can be adjusted by changing a thickness T1 of the protrusion 2660. Besides, the magnetic device 2630*a* can be inlaid or not inlaid into the carrier 2610.

FIG. 27A to FIG. 27D illustrate four variations of the structure depicted in FIG. 26A to FIG. 26C.

Figure 27A:
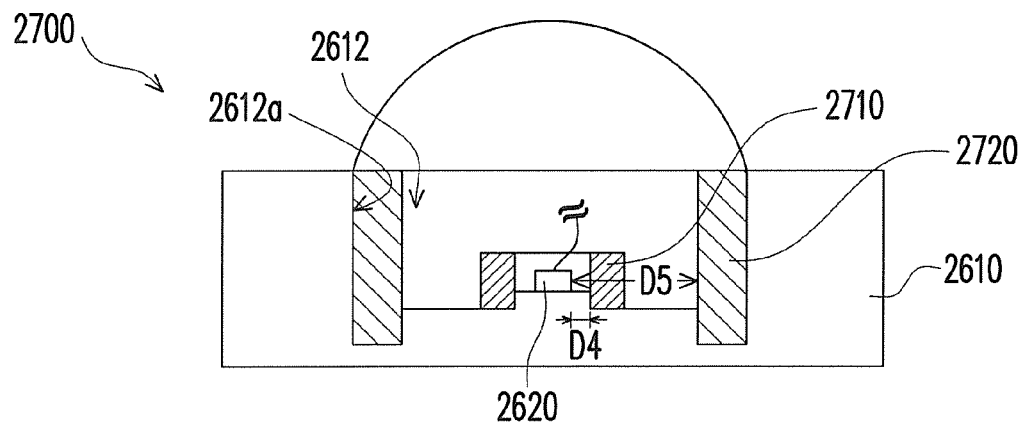
FIG. 27A to FIG. 27D illustrate four variations of the structure depicted in FIG. 26A to FIG. 26C.

As indicated in FIG. 27A, a light emitting chip package structure 2700 of this embodiment is similar to the light emitting chip package structures 2600 and 2600*a* depicted in FIG. 26A and FIG. 26B, while the difference therebetween lies in that the light emitting chip package structure 2700 has two magnetic devices 2710 and 2720. A location of the magnetic device 2710 is the same as the location of the magnetic device 2630 depicted in FIG. 26A, and a location of the magnetic device 2720 is the same as the location of the magnetic device 2630*a* depicted in FIG. 26B. In this embodiment, the minimum distance D4 between the light emitting chip 2620 and the magnetic device 2710 is shorter than the minimum distance D5 between the light emitting chip 2620 and the magnetic device 2720. Specifically, the magnetic device 2710 of this embodiment is located between the light emitting chip 2620 and the magnetic device 2720.

Figure 27B:
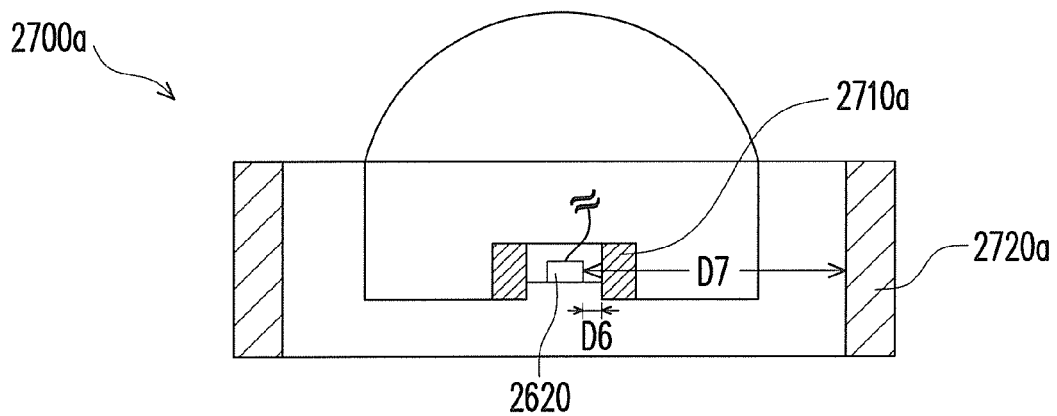

As indicated in FIG. 27B, a light emitting chip package structure 2700*a* of this embodiment is similar to the light emitting chip package structures 2600 and 2600*b* depicted in FIG. 26A and FIG. 26C, while the difference therebetween lies in that the light emitting chip package structure 2700*a* has two magnetic devices 2710*a* and 2720*a*. A location of the magnetic device 2710*a* is the same as the location of the magnetic device 2630 depicted in FIG. 26A, and a location of the magnetic device 2720*a* is the same as the location of the magnetic device 2630*b* depicted in FIG. 26C. In this embodiment, the minimum distance D6 between the light emitting chip 2620 and the magnetic device 2710*a* is shorter than the minimum distance D7 between the light emitting chip 2620 and the magnetic device 2720*a*. Specifically, the magnetic device 2710*a* of this embodiment is located between the light emitting chip 2620 and the magnetic device 2720*a*.

Figure 27C:
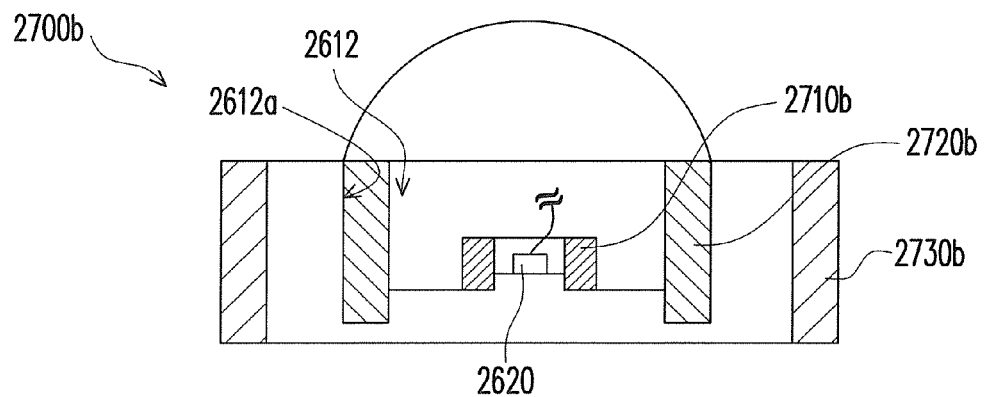

As indicated in FIG. 27C, a light emitting chip package structure 2700*b* of this embodiment is similar to the light emitting chip package structures 2600, 2600*a*, and 2600*b* depicted in FIG. 26A, FIG. 26B, and FIG. 26C, while the difference therebetween lies in that the light emitting chip package structure 2700*b* has three magnetic devices 2710*b*, 2720*b*, and 2730*b*. A location of the magnetic device 2710*b* is the same as the location of the magnetic device 2630 depicted in FIG. 26A, a location of the magnetic device 2720*b* is the same as the location of the magnetic device 2630*a* depicted in FIG. 26B, and a location of the magnetic device 2730*b* is the same as the location of the magnetic device 2630*b* depicted in FIG. 26C. The magnetic device 2720*b* of this embodiment is located between the magnetic device 2710*b* and the magnetic device 2730*b*, and the magnetic device 2710*b* is closer to the light emitting chip 2620 than the magnetic devices 2720*b* and 2730*b*.

Figure 27D:
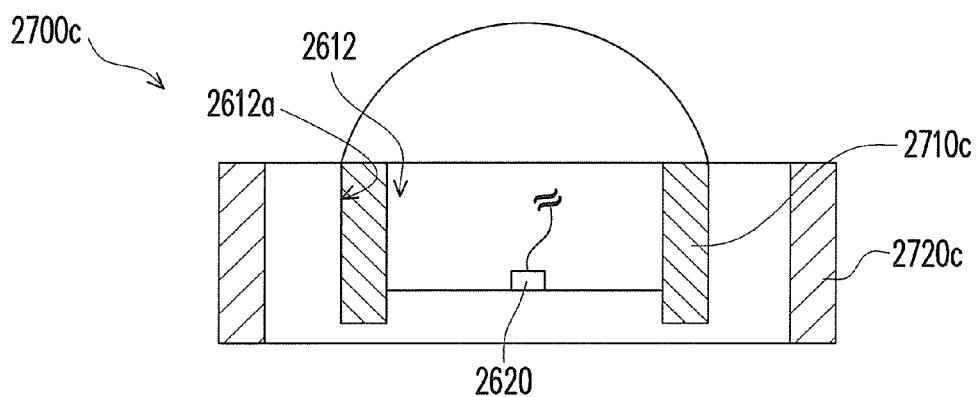

As indicated in FIG. 27D, a light emitting chip package structure 2700*c* of this embodiment is similar to the light emitting chip package structures 2600*a* and 2600*b* depicted in FIG. 26B and FIG. 26C, while the difference therebetween lies in that the light emitting chip package structure 2700*c* has two magnetic devices 2710*c* and 2720*c*. A location of the magnetic device 2710*c* is the same as the location of the magnetic device 2630a depicted in FIG. 26B, and a location of the magnetic device 2720c is the same as the location of the magnetic device 2630b depicted in FIG. 26C.

Figure 28A:
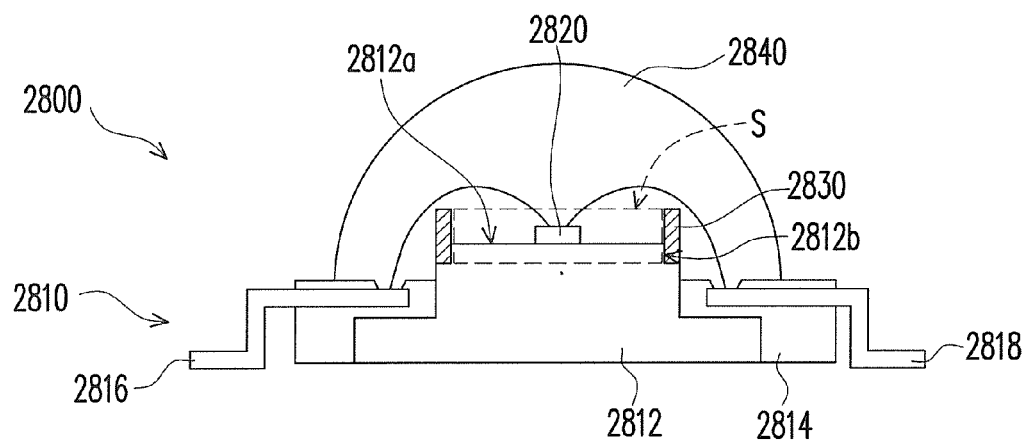
FIG. 28A is a cross-sectional view illustrating a light emitting chip package structure according to an embodiment of the disclosure.
Figure 28B:
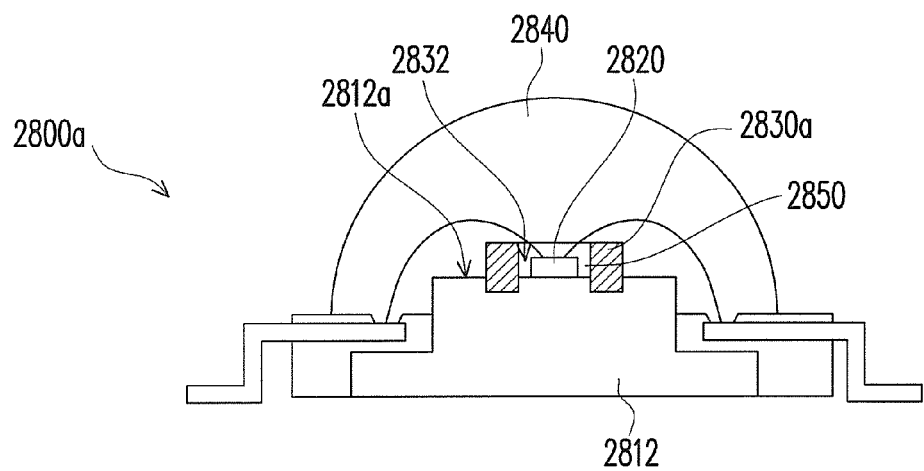
FIG. 28B to FIG. 28C illustrates two variations of the light emitting chip package structure depicted in FIG. 28A.

FIG. 28A is a cross-sectional view illustrating a light emitting chip package structure according to an embodiment of the disclosure. FIG. 28B illustrates a variation of the light emitting chip package structure depicted in FIG. 28A.

With reference to FIG. 28A, a light emitting chip package structure 2800 of this embodiment includes a carrier 2810, a light emitting chip 2820, a magnetic device 2830, and a sealant 2840. The carrier 2810 includes a substrate 2812, a casing 2814, a first lead 2816, and a second lead 2818. A material of the substrate 2812 has a high thermal conductive coefficient (e.g. metal), and the thermal conductive coefficient of the material is at least above 23.

A material of the casing 2814 is an insulation material, and the casing 2814 covers a portion of the substrate 2812, a portion of the first lead 2816, and a portion of the second lead 2818. Besides, the casing 2814 separates the substrate 2812, the first lead 2816, and the second lead 2818 from one another.

According to this embodiment, the other portion of the substrate 2812 which is not covered by the casing 2814 has a top surface 2812a and a side surface 2812b connected together. The light emitting chip 2820 is disposed on the top surface 2812a. The magnetic device 2830 is disposed on the side surface 2812b and located around the light emitting chip 2820 wherein the magnetic device 2830 is inlaid into the substrate 2812 such that the light emitting chip 2820 is located in the space S surrounded by the magnetic device 2830 and the magnetic device 2830 is not co-planar with the light emitting chip 2820. The sealant 2840 can selectively cover the light emitting chip 2820 and the magnetic device 2830.

In this embodiment, the heat generated during the operation of the light emitting chip 2820 can be transmitted to the external surroundings through the substrate 2812 for instant heat dissipation. The magnetic device 2830 can apply a magnetic field (a lateral magnetic force) to the light emitting chip 2820 according to this embodiment, the substrate 2812 is conducive to heat dissipation of the light emitting chip 2820, and the light emitting chip 2820 can be electrically connected to the first lead 2816 and the second lead 2818. Therefore, electrical relation, thermal relation, and magnetic relation respectively exist between the light emitting chip 2820 and the first and the second leads 2816 and 2818, between the light emitting chip 2820 and the substrate 2812, and between the light emitting chip 2820 and the magnetic device 2830. Since the first and the second leads 2816 and 2818, the substrate 2812, and the magnetic device 2830 are individually operated according to this embodiment, the light emitting chip package structure 2800 is characterized by electricity, heat, and magnetic separation.

In other embodiments, the magnetic device 2830 can have an inclined plane (not shown) facing the top of the light emitting chip 2820. Thereby, the light emitted by the light emitting chip 2820 can be reflected by the inclined plane and can move forward at approximately the same direction, so as to improve light directionality and light emitting intensity of the light emitting chip package structure.

As indicated in FIG. 28B, a light emitting chip package structure 2800a of this embodiment is similar to the light emitting chip package structure 2800 depicted in FIG. 28A, while the difference therebetween lies in that a magnetic device 2830a of the light emitting chip package structure 2800a is closer to the light emitting chip 2820 in comparison with the magnetic device 2830 of the light emitting chip package structure 2800, and a portion of the magnetic device 2830a is inlaid into the substrate 2812. Hence, when the magnetic device 2830a has a ring-shaped structure, an opening 2832 of the magnetic device 2830a can define a region of the surface 2812a coated by a fluorescent material. The opening 2832 of this embodiment can be filled with a fluorescent material 2850 that covers the light emitting chip 2820. The sealant 2840 can cover the light emitting chip 2820, the fluorescent material 2850, and the magnetic device 2830a.

Figure 28C:
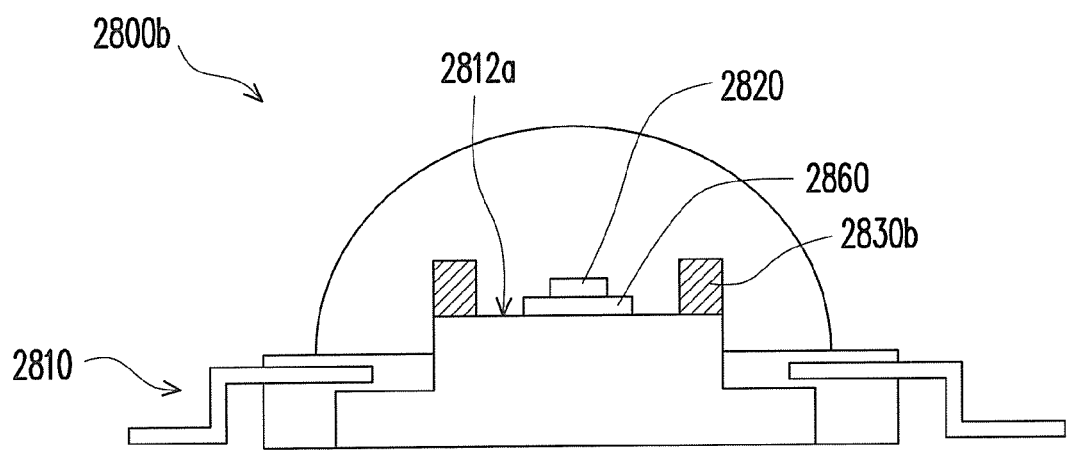

As indicated in FIG. 28C, a light emitting chip package structure 2800b of this embodiment is similar to the light emitting chip package structure 2800 depicted in FIG. 28A, while the difference therebetween lies in that the light emitting chip package structure 2800b further includes a protrusion 2860, and the magnetic device 2830b is disposed on the top surface 2812a. The protrusion 2860 is located between the light emitting chip 2820 and the carrier 2810, and the magnetic device 2830b surrounds the light emitting chip 2820 and the protrusion 2860.

Figure 29A:
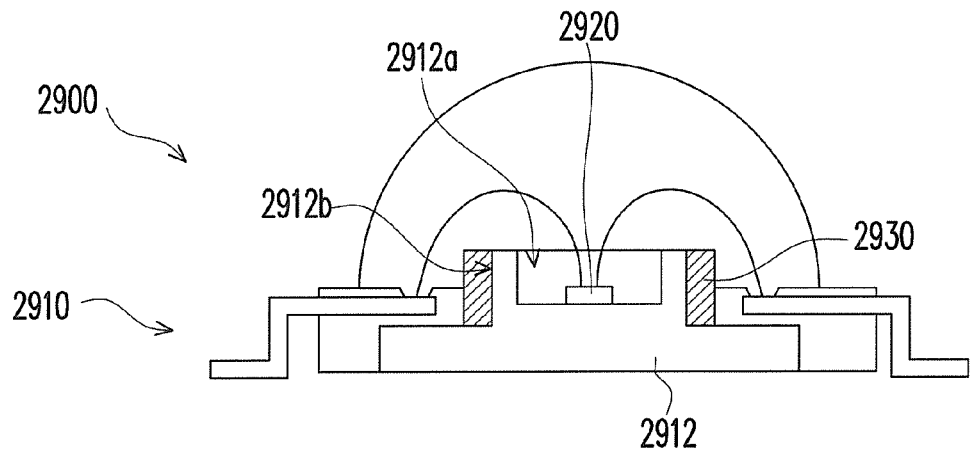
FIG. 29A is a cross-sectional view illustrating a light emitting chip package structure according to an embodiment of the disclosure.
Figure 29B:
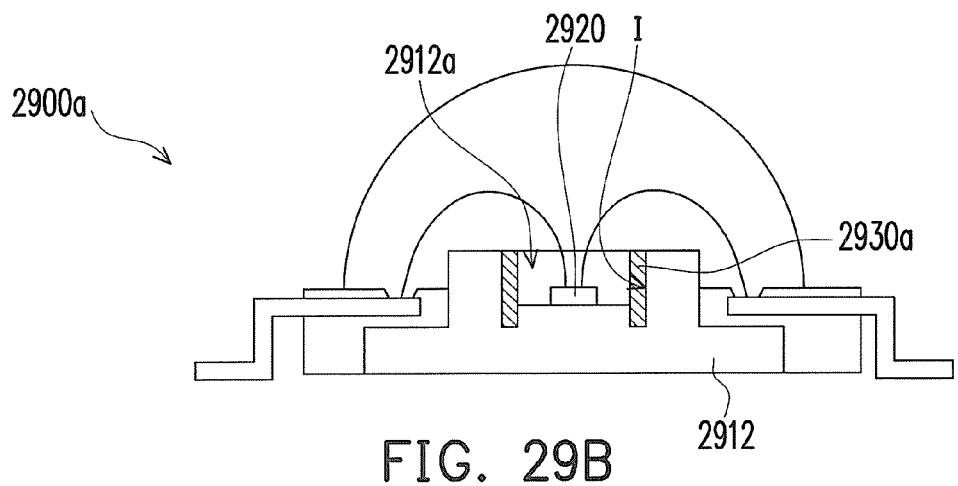
FIG. 29B to FIG. 29C illustrate two variations of the light emitting chip package structure depicted in FIG. 29A.
Figure 29C:
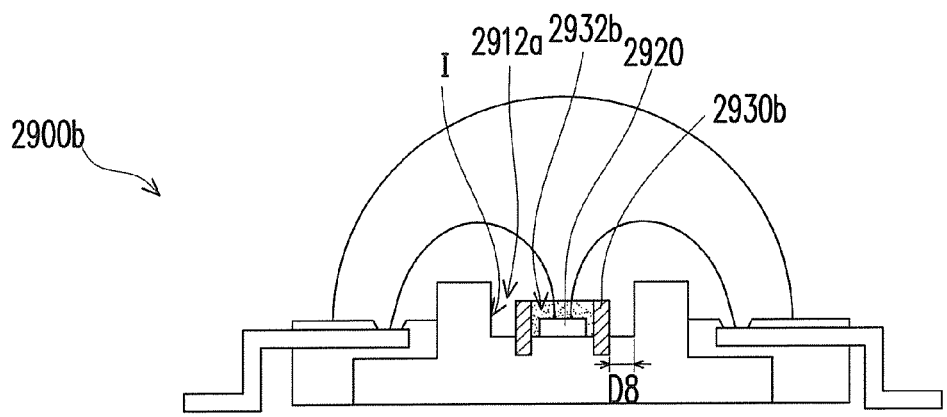

FIG. 29A is a cross-sectional view illustrating a light emitting chip package structure according to an embodiment of the disclosure. FIG. 29B to FIG. 29C illustrate two variations of the light emitting chip package structure depicted in FIG. 29A.

As indicated in FIG. 29A, a light emitting chip package structure 2900 of this embodiment is similar to the light emitting chip package structure 2800 depicted in FIG. 28A, while the difference therebetween lies in that a substrate 2912 of the light emitting chip package structure 2900 has a groove 2912a in which the light emitting chip 2920 is located, and the magnetic device 2930 is adhered onto a side wall 2912b of the substrate 2912 and located around the light emitting chip 2920.

In other embodiments, an inner wall (not shown) of the groove 2912a can be an inclined plane facing the top of the light emitting chip 2920. Thereby, the light emitted by the light emitting chip 2920 can be reflected by the inclined plane and can move forward at approximately the same direction, so as to improve light directionality and light emitting intensity of the light emitting chip package structure. That is to say, when there is no magnetic device attached to the inner wall of the groove, the inner wall of the groove can be an inclined plane facing the top of the light emitting chip.

As indicated in FIG. 29B, a light emitting chip package structure 2900a of this embodiment is similar to the light emitting chip package structure 2900 depicted in FIG. 29A, while the difference therebetween lies in that a magnetic device 2930a of the light emitting chip package structure 2900a is located in the groove 2912a and adhered onto an inner wall I of the groove 2912a, and a portion of the magnetic device 2930a is inlaid into the substrate 2912.

In other embodiments, the magnetic device 2930a can have an inclined plane (not shown) facing the top of the light emitting chip 2920. Thereby, the light emitted by the light emitting chip 2920 can be reflected by the inclined plane and can move forward at approximately the same direction, so as to improve light directionality and light emitting intensity of the light emitting chip package structure. Namely, when the light emitting chip and the magnetic device are both disposed in the groove of the substrate, and the magnetic device is adhered onto the inner wall of the groove, the magnetic device can have an inclined plane facing the top of the light emitting chip.

As indicated in FIG. 29C, a light emitting chip package structure 2900b of this embodiment is similar to the light emitting chip package structure 2900a depicted in FIG. 29B, while the difference therebetween lies in that a distance D8 exists between the magnetic device 2930b of the light emitting chip package structure 2900b and the inner wall I of the groove 2912a. When the magnetic device 2930b has a enclosed shaped structure, an opening 2932b of the magnetic device 2930b can define a region on which a fluorescent material is coated. The enclosed shaped structure is, for example, ring-shaped structure, rectangular-shape structure, triangular-shape structure or the like.

FIG. 30A to FIG. 30D illustrate four variations of the structure depicted in FIG. 29A to FIG. 29C.

Figure 30A:
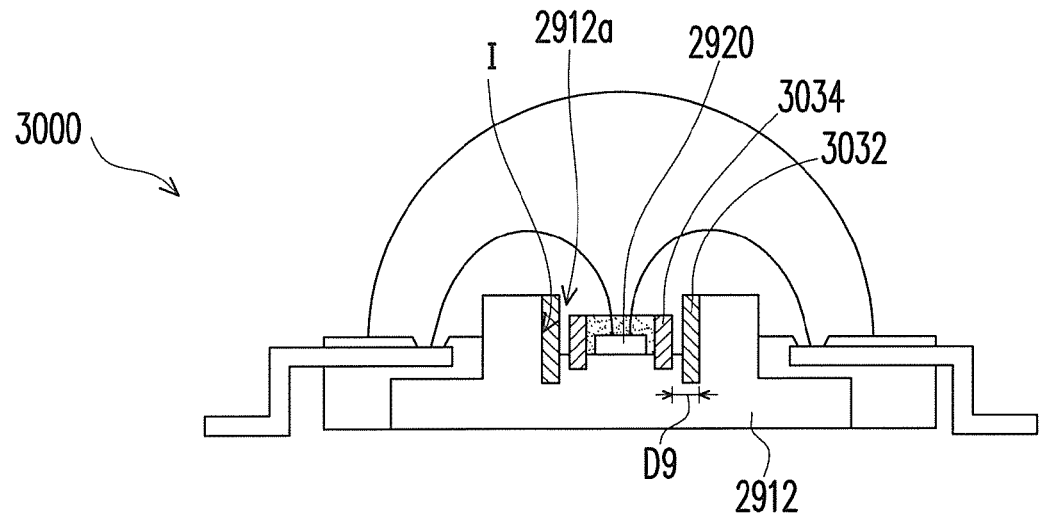
FIG. 30A to FIG. 30D illustrate four variations of the structure depicted in FIG. 29A to FIG. 29C.

As indicated in FIG. 30A, a light emitting chip package structure 3000 of this embodiment is similar to the light emitting chip package structures 2900a and 2900b depicted in FIG. 29B and FIG. 29C, while the difference therebetween lies in that the light emitting chip package structure 3000 has two magnetic devices 3032 and 3034. At least one of the magnetic devices 3032 and 3034 is located in the groove 2912a of the substrate 2912 and is partially inlaid into the substrate 2912. The magnetic device 3032 is adhered onto the inner wall I of the groove 2912a, and a distance D9 exists between the magnetic device 3034 and the inner wall I of the groove 2912a. Here, the magnetic device 3034 is located between the light emitting chip 2920 and the magnetic device 3032.

Figure 30B:
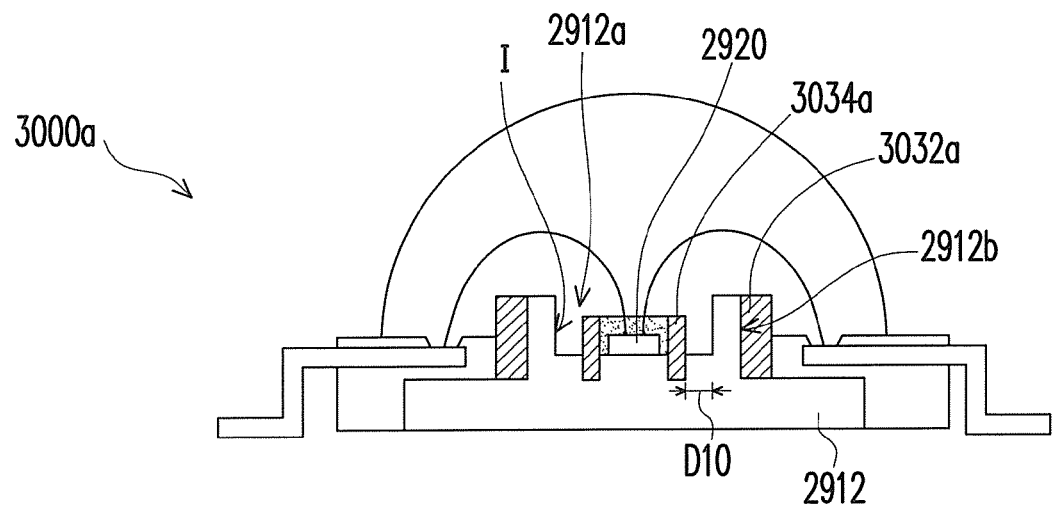

As indicated in FIG. 30B, a light emitting chip package structure 3000a of this embodiment is similar to the light emitting chip package structures 2900 and 2900b depicted in FIG. 29A and FIG. 29C, while the difference therebetween lies in that the light emitting chip package structure 3000a has two magnetic devices 3032a and 3034a. The magnetic device 3032a is located at the side wall 2912b of the substrate 2912 and located at least partially around the light emitting chip 2920. The magnetic device 3034a is located in the groove 2912a and partially inlaid into the substrate 2912. A distance D10 exists between the magnetic device 3034a and the inner wall I of the groove 2912a.

Figure 30C:
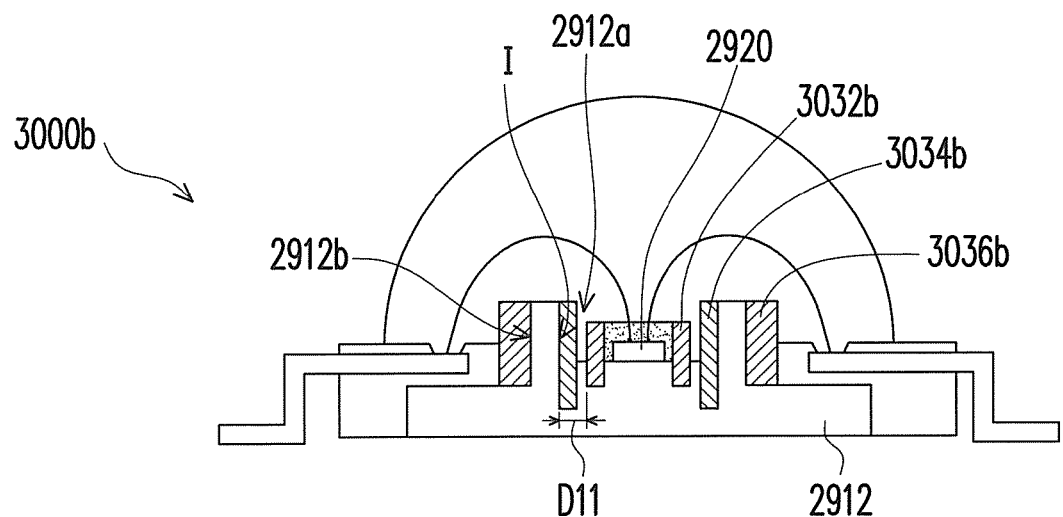

As indicated in FIG. 30C, a light emitting chip package structure 3000b of this embodiment is similar to the light emitting chip package structures 2900, 2900a, and 2900b depicted in FIG. 29A, FIG. 29B, and FIG. 29C, while the difference therebetween lies in that the light emitting chip package structure 3000b has three magnetic devices 3032b, 3034b, and 3036b. The magnetic device 3032b is located in the groove 2912a, and a distance D11 exists between the magnetic device 3032b and the inner wall I of the groove 2912a. The magnetic device 3034b is located in the groove 2912a and adhered onto the inner wall I of the groove 2912a. The magnetic device 3036b is located on the side wall 2912b of the substrate 2912. At least one of the magnetic devices 3032b and 3034b is partially inlaid into the substrate 2912. The magnetic device 3034b is located between the magnetic devices 3032b and 3036b, and the magnetic devices 3032b, 3034b, and 3036b are all located around the light emitting chip 2920.

Figure 30D:
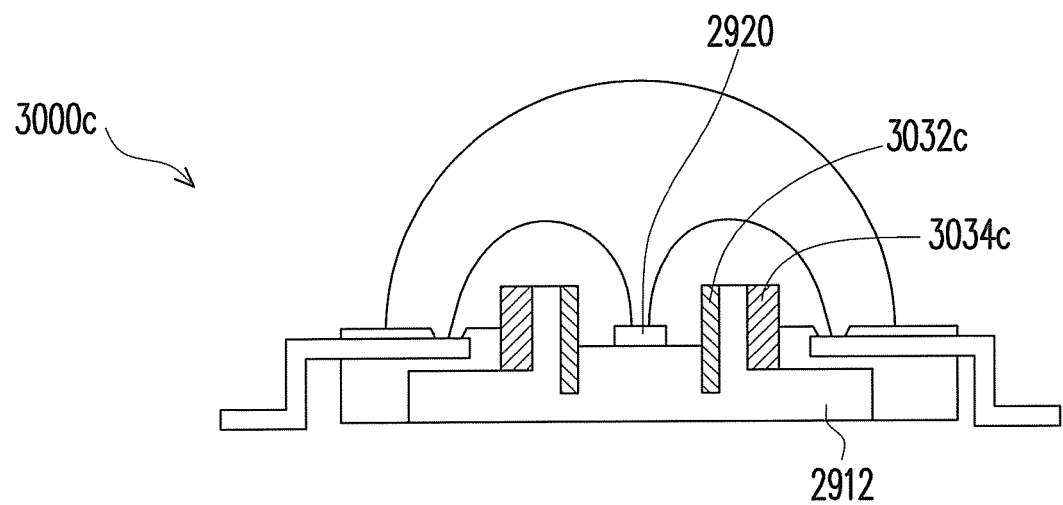

As indicated in FIG. 30D, a light emitting chip package structure 3000c of this embodiment is similar to the light emitting chip package structures 2900 and 2900a depicted in FIG. 29A and FIG. 29B, while the difference therebetween lies in that the light emitting chip package structure 3000c has two magnetic devices 3032c and 3034c. A location of the magnetic device 3032c is the same as the location of the magnetic device 2930a depicted in FIG. 29B, and a location of the magnetic device 3034c is the same as the location of the magnetic device 2930 depicted in FIG. 29A.

Figure 31A:
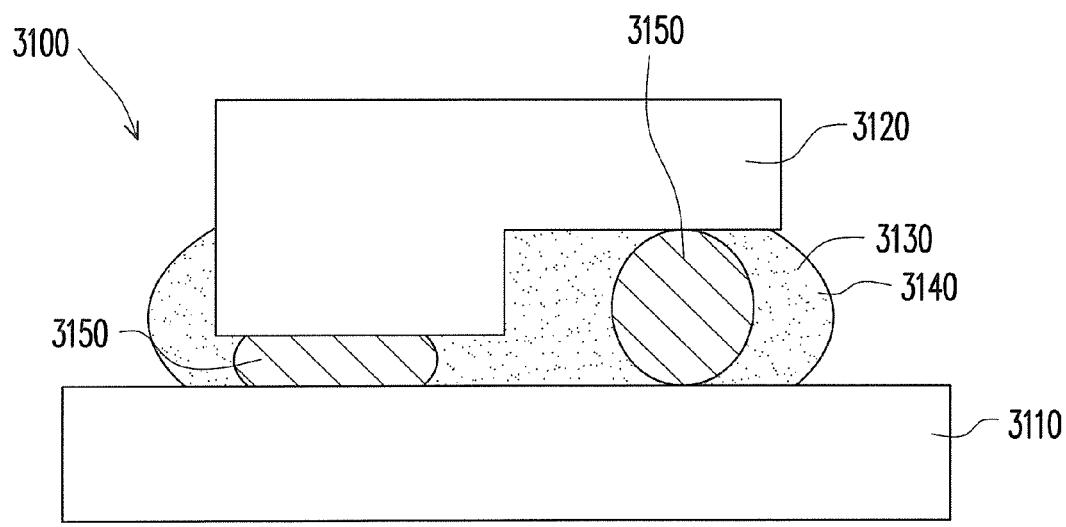
FIG. 31A is a cross-sectional view illustrating a light emitting device according to an embodiment of the disclosure.
Figure 31B:
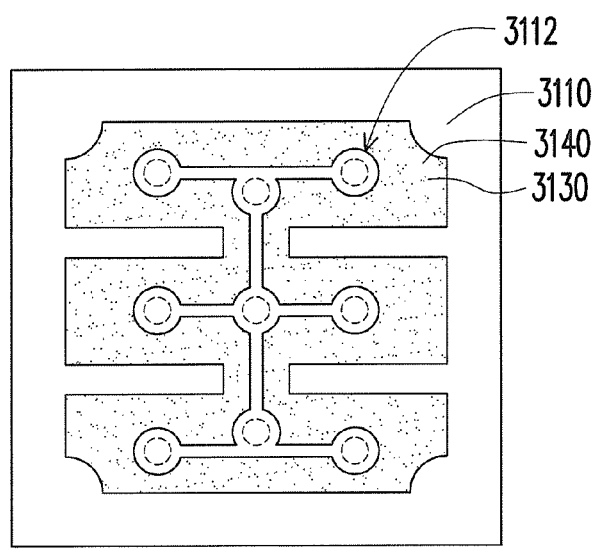
FIG. 31B is a top view illustrating a carrier of the light emitting device depicted in FIG. 31A.

FIG. 31A is a cross-sectional view illustrating a light emitting chip package structure according to an embodiment of the disclosure. FIG. 31B is a top view illustrating a carrier of the light emitting chip package structure depicted in FIG. 31A.

With reference to FIG. 31A, a light emitting device 3100 of this embodiment includes a carrier 3110, a light emitting chip 3120, a first magnetic material 3130, an underfill 3140, and a plurality of bumps 3150. The light emitting chip 3120 is disposed on the carrier 3110, and the bumps 3150 are disposed between the light emitting chip 3120 and the carrier 3110. The underfill 3140 is disposed between the light emitting chip 3120 and the carrier 3110 and encapsulates the bumps 3150. The first magnetic material 3130 is disposed between the light emitting chip 3120 and the carrier 3110. In detail, the first magnetic material 3130 is doped in the underfill 3140.

With reference to FIG. 31B, the underfill 3140 and the first magnetic material 3130 of this embodiment are disposed on a region of the carrier 3110 outside a bump deposition region 3112, and the bumps 3150 are suitable for being disposed in the bump deposition region 3112.

Figure 32:
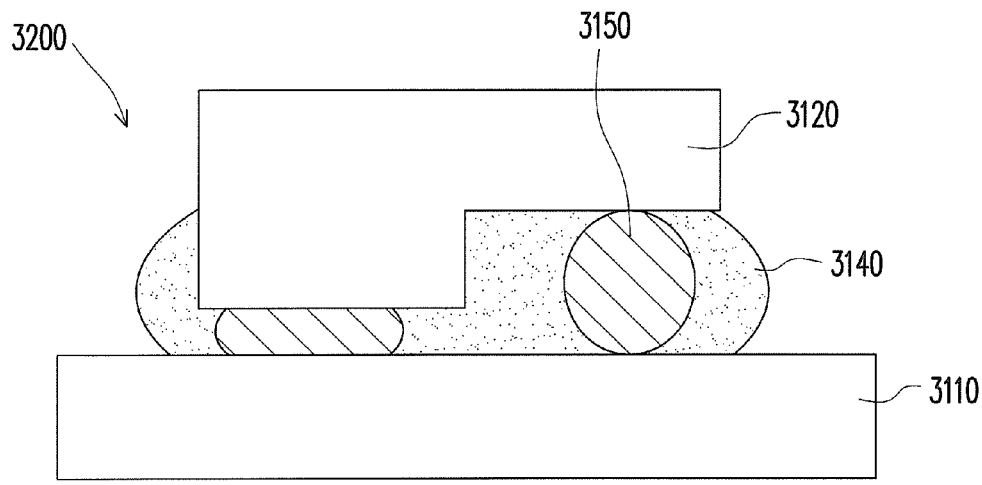
FIG. 32 is a cross-sectional view illustrating a light emitting device according to an embodiment of the disclosure.

FIG. 32 is a cross-sectional view illustrating a light emitting device according to an embodiment of the disclosure.

As indicated in FIG. 32, a light emitting device 3200 of this embodiment is similar to the light emitting device 3100 depicted in FIG. 31A, while the difference therebetween lies in that the bumps 3150 of the light emitting device 3200 are made of the first magnetic material. Therefore, it is not necessary to dope the first magnetic material in the underfill 3140 of the light emitting device 3200. The first magnetic material can be arranged in the same direction with the same polarity or arranged in opposite directions with different polarities.

Figure 33:
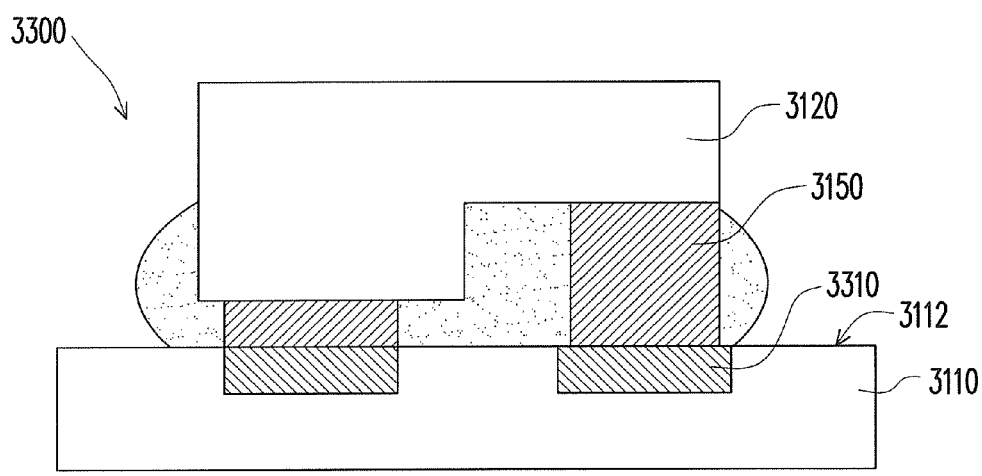
FIG. 33 is a cross-sectional view illustrating a light emitting device according to an embodiment of the disclosure.

FIG. 33 is a cross-sectional view illustrating a light emitting device according to an embodiment of the disclosure.

As indicated in FIG. 33, a light emitting device 3300 of this embodiment is similar to the light emitting device 3200 depicted in FIG. 32, while the difference therebetween lies in that the light emitting device 3300 further includes a second magnetic material 3310 inlaid into the carrier 3110, and a surface 3112 of the carrier 3110 can expose a portion of the second magnetic material 3310. The second magnetic material 3310 and the first magnetic material have different polarities, e.g. the N pole and the S pole, respectively. Therefore, when the light emitting chip 3120 is assembled onto the surface 3112 of the carrier 3110, the second magnetic material 3310 and the first magnetic material are magnetically attracted and connected for self alignment and package.

FIG. 34A to FIG. 34E are cross-sectional views illustrating a manufacturing process of a light emitting device according to an embodiment of the disclosure. FIG. 34F is a top view illustrating the structure depicted in FIG. 34D.

In FIG. 34A, an epitaxial substrate 3410 on which a plurality of chips 3420 are disposed is provided. A carrier 3430 is provided, and a magnetic material layer 3440 is formed on the carrier 3430.

In FIG. 34B, the epitaxial substrate 3410 is disposed on the magnetic material layer 3440, such that the chips 3420 are bonded to the magnetic material layer 3440.

In FIG. 34C, the epitaxial substrate 3410 is removed by laser lift off, for example.

In FIG. 34D and FIG. 34F, the magnetic material layer 3440 and the carrier 3430 are cut along a gap G between any two adjacent chips 3420, so as to form a plurality of light emitting devices 3400 (only one light emitting device 3400 is depicted in FIG. 34E).

By applying the manufacturing method of the light emitting device 3400 in this embodiment, the light emitting device 3400 equipped with a magnetic material can be mass produced.

Figure 35C:
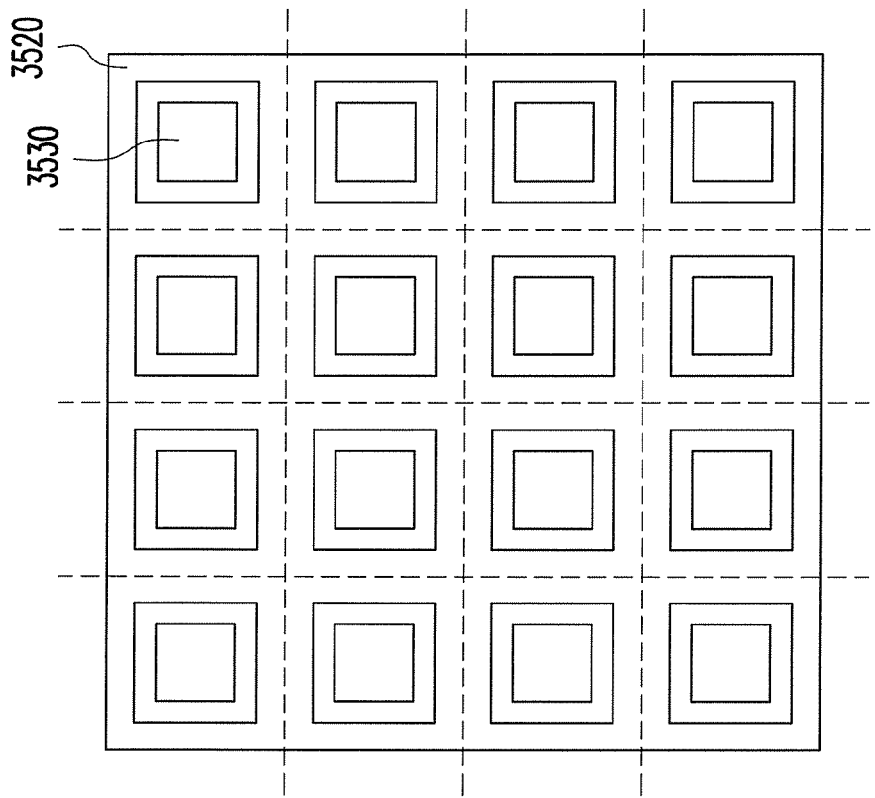
FIG. 35C is a top view illustrating the structure depicted in FIG. 35A.
Figure 35A:
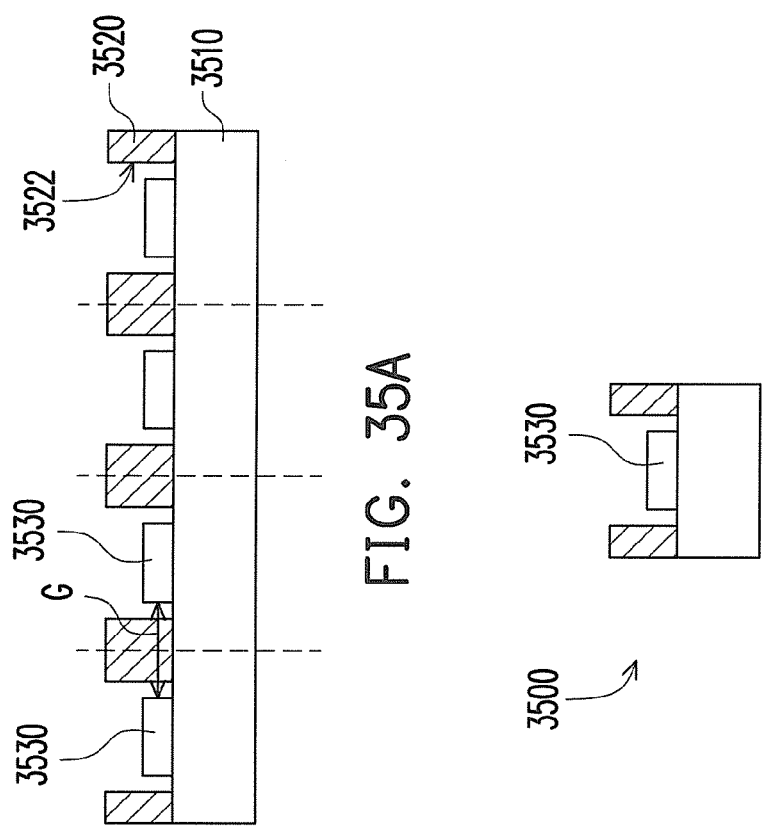
FIG. 35A to FIG. 35B are cross-sectional views illustrating a manufacturing process of a light emitting device according to an embodiment of the disclosure.
Figure 35B:
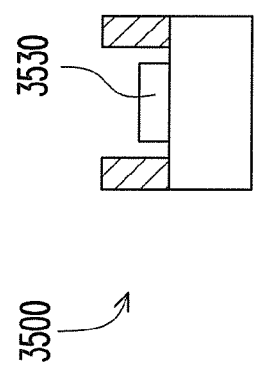

FIG. 35A to FIG. 35B are cross-sectional views illustrating a manufacturing process of a light emitting device according to an embodiment of the disclosure. FIG. 35C is a top view illustrating the structure depicted in FIG. 35A.

In FIG. 35A and FIG. 35C, a carrier 3510 is provided. A patterned magnetic layer 3520 is disposed on the carrier 3510. The patterned magnetic layer 3520 has a plurality of openings 3522. A plurality of light emitting chips 3530 are disposed in the openings 3522, respectively. The patterned magnetic layer 3520 and the carrier 3510 are cut along a gap G between any two adjacent chips 3530, so as to form a plurality of light emitting devices 3500 having the magnetic material. Note that only one light emitting device 3500 is depicted in FIG. 35B.

FIG. 36A to FIG. 36B are cross-sectional views illustrating a manufacturing process of a light emitting device according to an embodiment of the disclosure. FIG. 36C is a top view illustrating the structure depicted in FIG. 36A.

The manufacturing method of the light emitting device in this embodiment is similar to the manufacturing method of the light emitting device illustrated in FIG. 35A and FIG. 35B, while the difference therebetween lies in that the side wall 3522a of each of the openings 3522 in the patterned magnetic layer 3520 of this embodiment is an inclined plane, and an included angle θ between a normal vector N1 of the inclined plane and a normal vector N2 of the surface 3512 of the carrier 3510 is less than 90 degrees (shown in FIG. 36A). The surface 3512 of the carrier 3510 carries the light emitting chips 3530. An optical film layer 3540 can be formed on the side walls 3522a. Here, the optical film layer 3540 can be a reflective layer or a light absorbing layer.

In FIG. 36C and FIG. 36B, after the optical film layer 3540, the patterned magnetic layer 3520, and the carrier 3510 are cut along a gap G between any two adjacent chips 3530, a plurality of light emitting devices 3600 having the magnetic material can be formed. Note that only one light emitting device 3600 is depicted in FIG. 36B.

FIG. 37A to FIG. 37B are cross-sectional views illustrating a manufacturing process of a light emitting device according to an embodiment of the disclosure. FIG. 37C is a top view illustrating the structure depicted in FIG. 37A.

The manufacturing method of the light emitting device in this embodiment is similar to the manufacturing method of the light emitting device illustrated in FIG. 36A and FIG. 36B, while the difference therebetween lies in that a light emitting chip group 3710 is disposed in each of the openings 3522 of the patterned magnetic layer 3520. The light emitting chip group 3710 includes a plurality of light emitting chips 3530, as shown in FIG. 37A.

In FIG. 37C and FIG. 37B, after the patterned magnetic layer 3520 and the carrier 3510 are cut along a gap G between any two adjacent light emitting chip groups 3710, a plurality of light emitting devices 3700 can be formed. Note that only one light emitting device 3700 is depicted in FIG. 37B.

It should be mentioned that the patterned magnetic layer 3520 of the light emitting device 3700 can surround the light emitting chips 3530 according to this embodiment, so as to significantly decrease the magnetic package size and improve usage flexibility.

Figure 38C:
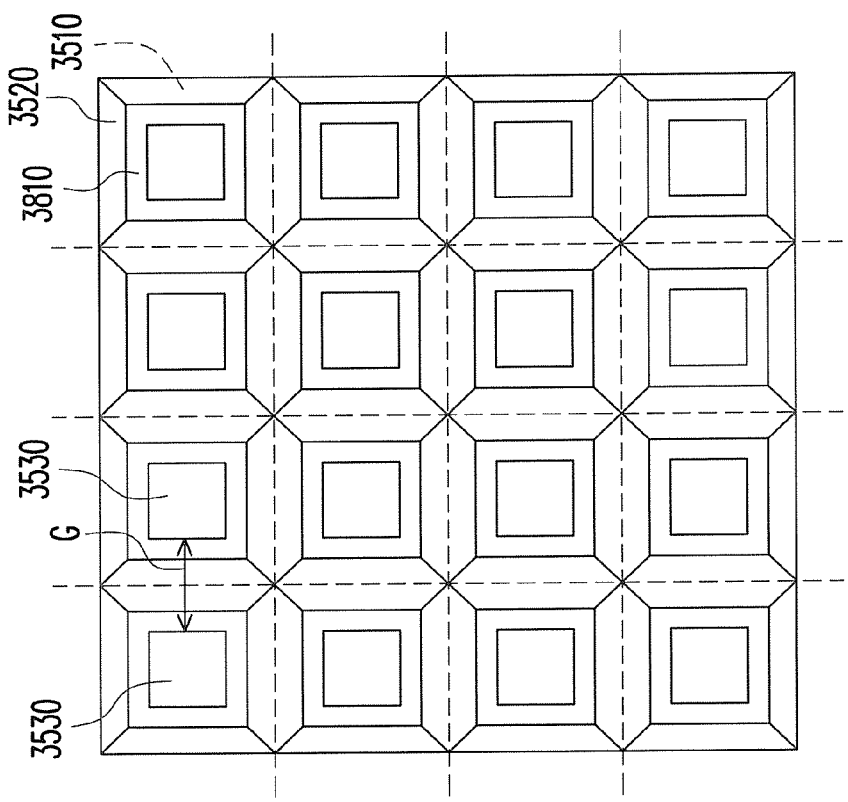
FIG. 38C is a top view illustrating the structure depicted in FIG. 38A.
Figure 38A:
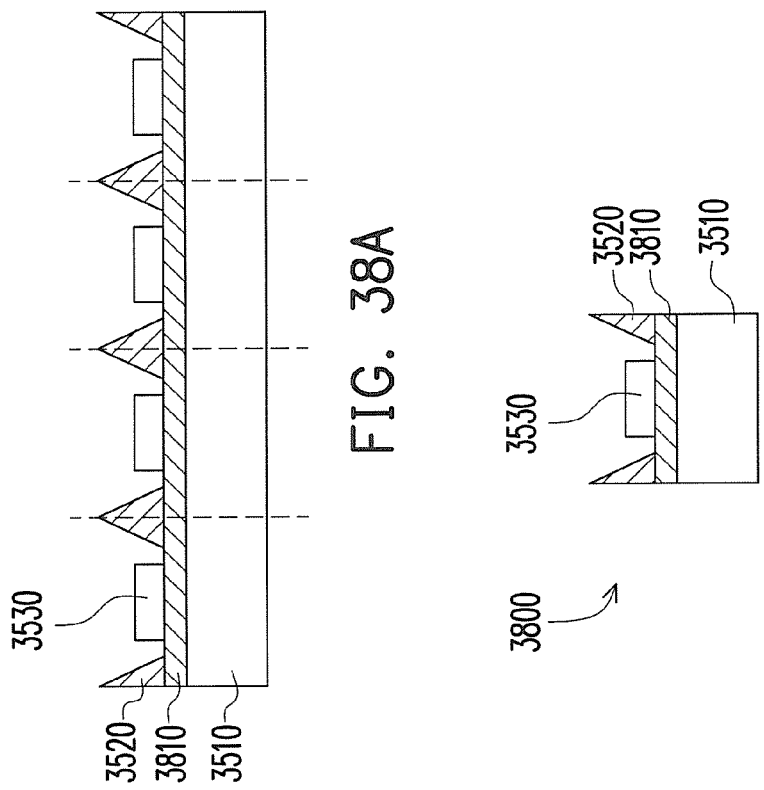
FIG. 38A to FIG. 38B are cross-sectional views illustrating a manufacturing process of a light emitting device according to an embodiment of the disclosure.
Figure 38B:
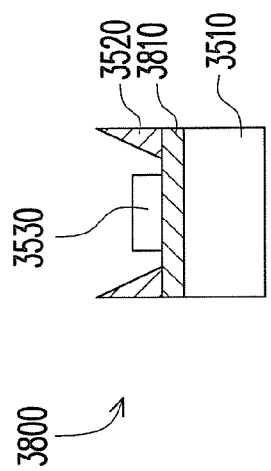

FIG. 38A to FIG. 38B are cross-sectional views illustrating a manufacturing process of a light emitting device according to an embodiment of the disclosure. FIG. 38C is a top view illustrating the structure depicted in FIG. 38A.

The manufacturing method of the light emitting device in this embodiment is similar to the manufacturing method of the light emitting device illustrated in FIG. 36A and FIG. 36B, while the difference therebetween lies in that a magnetic material layer 3810 is formed on the carrier 3510 before the patterned magnetic layer 3520 is disposed on the carrier 3510, and the subsequently formed patterned magnetic layer 3520 and the light emitting chips 3530 are formed on the magnetic material layer 3810, as shown in FIG. 38A.

In FIG. 38C and FIG. 38B, after the patterned magnetic layer 3520, the magnetic material layer 3810, and the carrier 3510 are cut along a gap G between any two adjacent light emitting chips 3530, a plurality of light emitting devices 3800 can be formed. Note that only one light emitting device 3800 is depicted in FIG. 38B. It should be mentioned that the light emitting device 3800 of this embodiment has two magnetic layers, i.e. the magnetic material layer 3810 and the patterned magnetic layer 3520. Thus, a relatively large magnetic field can be applied by the magnetic layers to the light emitting chips 3530, so as to improve the light emitting efficiency of the light emitting chips 3530.

In light of the foregoing, the magnetic device is disposed around the light emitting chip or the light emitting chip package structure according to the disclosure, such that the magnetic device can apply a magnetic field to the light emitting chip. Thereby, uniformity of electric current distribution in the light emitting chip can be improved during operation of the light emitting chip package structure. As such, the magnetic device is conducive to improvement of the total light emitting efficiency and light emitting uniformity of the light emitting chip package structure in this disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting chip package module comprising:
at least a substrate having a first surface;
at least a light emitting chip package structure disposed on the first surface of the at least a substrate and comprising:
a carrier;
at least a light emitting chip disposed on and electrically connected to the carrier;
a sealant primary optics disposed on the carrier and covering the at least a light emitting chip; and
at least a first magnetic device disposed next to the at least a light emitting chip package structure to apply a magnetic field to the at least a light emitting chip.

2. The light emitting chip package module as claimed in claim 1, wherein the at least a first magnetic device comprises a first portion and a second portion, the first portion is inlaid from the first surface into the at least a substrate, and the second portion protrudes from the first surface.

3. The light emitting chip package module as claimed in claim 1, wherein the shape of the at least a first magnetic device includes a ring-shaped structure, at least a block-shaped structure, or at least a strip-shaped structure.

4. The light emitting chip package module as claimed in claim 3, wherein when the at least a first magnetic device has the ring-shaped structure, the at least a light emitting chip package structure is located in an opening of the ring-shaped structure.

5. The light emitting chip package module as claimed in claim 3, the at least a light emitting chip package structure is further surrounded by the at least a block-shaped structure or the at least a strip-shaped structure.

6. The light emitting chip package module as claimed in claim 1, wherein the at least a first magnetic device comprises at least a magnet or at least a coil.

7. The light emitting chip package module as claimed in claim 6, wherein the at least a first magnetic device is at least a coil, the at least a coil further comprises at least a coil hole and a center axis extending along a winding wire of the at least a coil.

8. The light emitting chip package module as claimed in claim 7, wherein the at least a light emitting chip package structure is located in the at least a coil hole.

9. The light emitting chip package module as claimed in claim 7, the at least a coil surrounds the at least a light emitting chip package structure, and the center axis of the at least a coil is substantially parallel to the surface of the substrate.

10. An assembly comprising a first light emitting chip package module as claim 1, further comprising at least a second light emitting chip package module as claim 1 and at least a conductive wire, wherein the at least a conductive wire electrically connects the first light emitting chip package module and the at least a second light emitting chip package module.

11. The light emitting chip package module as claimed in claim 1, further comprising:
a lens device disposed on the at least a substrate and covering the at least a light emitting chip package structure, the at least a first magnetic device having a first portion and a second portion, wherein the first portion is inlaid into the lens device, and the second portion is inlaid into the at least a substrate.

12. The light emitting chip package module as claimed in claim 1, wherein the at least a first magnetic device is disposed on the first surface and has an inclined plane, an included angle between a normal vector of the inclined plane and a normal vector of the first surface is less than 90 degrees, and the inclined plane faces toward a top of the at least a first magnetic device.

13. The light emitting chip package module as claimed in claim 12, further comprising:
an optical film layer disposed on the inclined plane, the optical film layer being a reflective layer or a light absorbing layer.

14. The light emitting chip package module as claimed in claim 12, further comprising:
a reflective device disposed on the first surface and having a substantially cambered shape and an opening,
wherein a cavity being formed between the reflective device and the at least a substrate; wherein the at least a light emitting chip package structure being located in the cavity; wherein a cambered surface of the reflective device facing the at least a light emitting chip package structure.

15. The light emitting chip package module as claimed in claim 14, further comprising:
a lens device disposed on the opening.

16. The light emitting chip package module as claimed in claim 12, wherein the at least a first magnetic device has an opening exposing a portion of the first surface, and the at least a light emitting chip package structure is disposed in the opening, the light emitting chip package module further comprising:
a lens device disposed on the at least a first magnetic device and covering the opening.

17. The light emitting chip package module as claimed in claim 1, wherein the at least a first magnetic device is disposed on the first surface and has a substantially cambered shape, a cavity is formed between the at least a first magnetic device and the at least a substrate, the cavity has an opening, the at least a light emitting chip package structure is located in the cavity, the at least a first magnetic device has a cambered surface facing the at least a light emitting chip package structure to reflect light emitted by the at least a light emitting chip and irradiate the light toward the opening.

18. The light emitting chip package module as claimed in claim 17, further comprising:
an optical film layer disposed on the cambered surface, the optical film layer being a reflective layer or a light absorbing layer.

19. The light emitting chip package module as claimed in claim 18, further comprising:
a lens device disposed on the opening.

20. The light emitting chip package module as claimed in claim 1, further comprising:
a heat conductive and dissipating device, the at least a substrate being disposed on a second surface of the heat conductive and dissipating device.

21. The light emitting chip package module as claimed in claim 20, wherein the at least a first magnetic device is disposed on the second surface of the heat conductive and dissipating device.

22. The light emitting chip package module as claimed in claim 20, wherein the at least a first magnetic device is inlaid into the heat conductive and dissipating device, and the second surface exposes a portion of the at least a first magnetic device.

23. The light emitting chip package module as claimed in claim 20, wherein the heat conductive and dissipating device comprises a fan, and at least a portion of the at least a first magnetic device is a stator of a motor of the fan.

24. The light emitting chip package module as claimed in claim 23, wherein at least a portion of the at least a first magnetic device is in close proximity to a central region or a peripheral region of radially-arranged fan blades of the fan.

25. The light emitting chip package module as claimed in claim 23, wherein the at least a first magnetic device has a first portion and a second portion, the first portion is disposed on the second surface, and the second portion is the stator of the motor of the fan.

26. The light emitting chip package module as claimed in claim 20, further comprising:
an optical device disposed on a path of light emitted by the at least a light emitting chip package structure to change the path of light, the optical device having an extending portion extending toward a direction away from the at least a light emitting chip package structure, the at least a first magnetic device having a first portion, a second portion, and a third portion sequentially connected together, wherein the first portion is inlaid into the optical device, the second portion penetrates the at least a substrate, and the third portion is inlaid into the heat conductive and dissipating device; and
a fixing member penetrating the extending portion and the at least a substrate and inserted into the heat conductive and dissipating device.

27. The light emitting chip package module as claimed in claim 20, further comprising:
a second magnetic device inlaid into the heat conductive and dissipating device, the second surface exposing a portion of the second magnetic device, wherein the at least a first magnetic device and the second magnetic device are magnetically attracted, and the at least a first magnetic device is located above the second magnetic device.

28. The light emitting chip package module as claimed in claim 20, wherein the at least a first magnetic device has a ring-shaped structure, and the light emitting chip package module further comprises:
a transparent cover disposed on the heat conductive and dissipating device, an accommodation space being formed between the transparent cover and the heat conductive and dissipating device, the at least a first magnetic device being connected between the transparent cover and the heat conductive and dissipating device to seal the accommodation space, the at least a light emitting chip package structure being located in the accommodation space.

29. The light emitting chip package module as claimed in claim 20, further comprising:
at least a conductive wire connected between the at least a substrate and the at least a first magnetic device.

30. The light emitting chip package module as claimed in claim 20, wherein the at least a first magnetic device is connected to the at least a substrate, and the light emitting chip package module further comprises:
an external component having an opening and disposed on the second surface of the heat conductive and dissipating device, the opening exposing the at least a light emitting chip package structure, the at least a substrate, and the at least a first magnetic device, the at least a first magnetic device contacting an inner wall of the opening; and
a fixing member penetrating the external component and inserted into the heat conductive and dissipating device.

31. The light emitting chip package module as claimed in claim 20, wherein the at least a first magnetic device comprises a first portion and a second portion, the second portion is disposed on the second surface and connected to the at least a substrate, and the light emitting chip package module further comprises:
an external component having an opening and disposed on the second surface of the heat conductive and dissipating device, the first portion being disposed on an inner wall of the opening, the opening exposing the at least a light emitting chip package structure, the at least a substrate, and the second portion, the first portion and the second portion being contacted and magnetically attracted.

32. The light emitting chip package module as claimed in claim 20, wherein the second surface of the heat conductive and dissipating device has at least a first groove and at least a second groove, an inner wall of the at least a first groove has an inner thread, and the light emitting chip package module further comprises:
an external component having an opening, the at least a first magnetic device being disposed on an inner wall of the opening and connected to the external component, the external component being disposed on the second surface of the heat conductive and dissipating device, the opening exposing the at least a light emitting chip package structure and the at least a substrate; and
a location adjusting device penetrating the external component, a first end of the location adjusting device being inserted into the at least a first groove of the heat conductive and dissipating device, a surface of the first end having an outer thread, the inner thread and the outer thread being connected, a second end of the at least a first magnetic device being inserted into the at least a second groove, wherein the location adjusting device is suitable for adjusting a relative position of the at least a light emitting chip and the at least a first magnetic device on the external component by adjusting a depth of the first end inserted into the at least a first groove.

33. The light emitting chip package module as claimed in claim 20, wherein the second surface of the heat conductive and dissipating device has at least a groove, an inner wall of the at least a groove has an inner thread, a surface of an end of the at least a first magnetic device has an outer thread, the end is located in the at least a groove, and the inner thread and the outer thread are connected.

34. The light emitting chip package module as claimed in claim 1, wherein the at least a first magnetic device has a ring-shaped structure, and the light emitting chip package module further comprises:
a transparent cover disposed on the at least a substrate, an accommodation space being formed between the transparent cover and the at least a substrate, the at least a first magnetic device being connected between the transparent cover and the at least a substrate to seal the accommodation space, the at least a light emitting chip package structure being located in the accommodation space.

35. The light emitting chip package module as claimed in claim 1, wherein the at least a first magnetic device is connected to the at least a substrate, and the light emitting chip package module further comprises:
an external component having an opening and disposed on the first surface of the at least a substrate, the opening exposing the at least a light emitting chip package structure, a portion of the at least a substrate, and the at least a first magnetic device, the at least a first magnetic device contacting an inner wall of the opening; and
a fixing member penetrating the external component and inserted into the at least a substrate.

36. The light emitting chip package module as claimed in claim 1, wherein the at least a first magnetic device is disposed on the first surface of the at least a substrate and connected to the at least a substrate, and the light emitting chip package module further comprises:
an external component having an opening and disposed on the first surface of the at least a substrate, a second magnetic device being disposed on an inner wall of the opening and connected to the external component, the opening exposing the at least a light emitting chip package structure, the at least a substrate, and the at least a first magnetic device, the second magnetic device and the at least a first magnetic device being contacted and magnetically attracted.

37. The light emitting chip package module as claimed in claim 1, further comprising:
a circuit device disposed on the at least a substrate.

38. The light emitting chip package module as claimed in claim 37, wherein the at least a first magnetic device is an inductor coil.

39. The light emitting chip package module as claimed in claim 1, wherein the substrate is located between the first magnetic device and the light emitting chip package structure.

40. The light emitting chip package module as claimed in claim 39, wherein a portion of the first magnetic device is embedded in the substrate.

41. A light emitting chip package structure comprising:
a carrier;
at least a light emitting chip disposed on the carrier; and
a first magnetic device disposed next to the at least a light emitting chip, wherein the at least a light emitting chip is substantially located in a space surrounded by the first magnetic device and the at least a light emitting chip is not co-planar with the first magnetic device.

42. The light emitting chip package structure as claimed in claim 41, wherein the space has a height and the at least a light emitting chip is substantially located at one to three quarters of the height of the space.

43. The light emitting chip package structure as claimed in claim 42, the first magnetic device having a ring-shaped structure or a plurality of block-shaped structures, wherein when the first magnetic device has the ring-shaped structure, the at least a light emitting chip is located in an opening of the ring-shaped structure, and when the first magnetic device has the block-shaped structures, the at least a light emitting chip is surrounded by the block-shaped structures.

44. The light emitting chip package structure as claimed in claim 41, wherein the first magnetic device and the at least a light emitting chip are disposed on a surface of the carrier, and the light emitting chip package structure further comprises:
an optical film layer covering the first magnetic device.

45. The light emitting chip package structure as claimed in claim 44, wherein the optical film layer comprises a light absorbing layer or a reflective layer.

46. The light emitting chip package structure as claimed in claim 41, further comprising:
a sealant covering the at least a light emitting chip, wherein the first magnetic device is disposed at an edge of the sealant, and a portion of the first magnetic device is inlaid into the carrier.

47. The light emitting chip package structure as claimed in claim 46, further comprising:
a second magnetic device disposed on the carrier, wherein the sealant covers the second magnetic device, and a minimum distance between the at least a light emitting chip and the second magnetic device is shorter than a minimum distance between the at least a light emitting chip and the first magnetic device.

48. The light emitting chip package structure as claimed in claim 41, further comprising:
a protrusion disposed between the at least a light emitting chip and the carrier; and
a sealant covering the at least a light emitting chip and the protrusion, wherein the first magnetic device is disposed at an edge of the sealant.

49. The light emitting chip package structure as claimed in claim 41, wherein the first magnetic device is disposed on the carrier, and the light emitting chip package structure further comprises:
a sealant entirely covering the at least a light emitting chip and the first magnetic device, wherein a portion of the first magnetic device is inlaid into the carrier.

50. The light emitting chip package structure as claimed in claim 49, wherein when the first magnetic device has a ring-shaped structure, the light emitting chip package structure further comprises:
a fluorescent material disposed in an opening of the ring-shaped structure and covering the at least a light emitting chip.

51. The light emitting chip package structure as claimed in claim 41, wherein the carrier has a groove, and the at least a light emitting chip is disposed in the groove.

52. The light emitting chip package structure as claimed in claim 51, wherein the first magnetic device is disposed on the carrier, located in the groove, and disposed next to the at least a light emitting chip, a distance exists between the first magnetic device and an inner wall of the groove, the carrier has a protrusion protruding from a bottom surface of the groove, and the at least a light emitting chip is located on the protrusion.

53. The light emitting chip package structure as claimed in claim 52, further comprising:
a second magnetic device disposed on a side wall of the carrier.

54. The light emitting chip package structure as claimed in claim 53, further comprising:
a third magnetic device disposed on the carrier and located in the groove, the third magnetic device being adhered to the inner wall of the groove and partially inlaid into the carrier.

55. The light emitting chip package structure as claimed in claim 52, further comprising:
a second magnetic device disposed on the carrier and located in the groove, the second magnetic device being adhered to the inner wall of the groove and partially inlaid the carrier.

56. The light emitting chip package structure as claimed in claim 51, wherein the first magnetic device is disposed on the carrier and located in the groove, and the first magnetic device is adhered to an inner wall of the groove and partially inlaid into the carrier.

57. The light emitting chip package structure as claimed in claim 56, further comprising:
a protrusion disposed between the at least a light emitting chip and the carrier.

58. The light emitting chip package structure as claimed in claim 51, wherein the first magnetic device is disposed on a side wall of the carrier.

59. The light emitting chip package structure as claimed in claim 58, further comprising:
a second magnetic device disposed on the carrier and located in the groove, the second magnetic device being adhered to an inner wall of the groove and partially inlaid into the carrier.

60. The light emitting chip package structure as claimed in claim 41, wherein the carrier comprises a ceramic substrate, a silicon substrate, an aluminum substrate, a copper substrate, or a circuit board.

61. The light emitting chip package structure as claimed in claim 41, the carrier comprising a substrate, a casing, a first lead, and a second lead, wherein the casing covers a portion of the substrate, a portion of the first lead, and a portion of the second lead and separates the substrate, the first lead, and the second lead from one another, and the at least a light emitting chip is disposed on the other portion of the substrate which is not covered by the casing.

62. The light emitting chip package structure as claimed in claim 61, wherein a material of the substrate is metal.

63. The light emitting chip package structure as claimed in claim 61, wherein the other portion of the substrate which is not covered by the casing has a top surface, the at least a light emitting chip is disposed on the top surface, and the first magnetic device is disposed on the top surface and partially inlaid into the substrate.

64. The light emitting chip package structure as claimed in claim 61, wherein the other portion of the substrate which is not covered by the casing has a top surface and a side surface connected together, the at least a light emitting chip is disposed on the top surface, and the first magnetic device is disposed on the side surface.

65. The light emitting chip package structure as claimed in claim 61, wherein the other portion of the substrate which is not covered by the casing has a top surface, the at least a light emitting chip and the first magnetic device are disposed on the top surface, and the light emitting chip package structure further comprises:
   a protrusion disposed between the at least a light emitting chip and the carrier.

66. The light emitting chip package structure as claimed in claim 61, wherein the substrate has a groove, and the at least a light emitting chip is disposed in the groove.

67. The light emitting chip package structure as claimed in claim 66, wherein the first magnetic device is disposed on a side wall of the substrate.

68. The light emitting chip package structure as claimed in claim 66, wherein the first magnetic device is disposed in the groove, and the first magnetic device is adhered to an inner wall of the groove and partially inlaid into the substrate.

69. The light emitting chip package structure as claimed in claim 68, further comprising:
   a second magnetic device disposed on a side wall of the substrate.

70. The light emitting chip package structure as claimed in claim 66, wherein the first magnetic device is disposed in the groove and partially inlaid into the substrate, and a distance exists between the first magnetic device and an inner wall of the groove.

71. The light emitting chip package structure as claimed in claim 70, further comprising:
   a second magnetic device disposed in the groove, the second magnetic device being adhered to an inner wall of the groove and partially inlaid into the substrate.

72. The light emitting chip package structure as claimed in claim 71, further comprising:
   a third magnetic device disposed on a side wall of the substrate.

73. The light emitting chip package structure as claimed in claim 70, further comprising:
   a second magnetic device disposed on a side wall of the substrate.

* * * * *